US011653467B2

(12) United States Patent
Lucero et al.

(10) Patent No.: US 11,653,467 B2
(45) Date of Patent: May 16, 2023

(54) MODULAR SYSTEM FOR INTERNET OF THINGS AND METHOD OF ASSEMBLING THE SAME

(71) Applicant: Intel Corporation, Santa Clara, CA (US)

(72) Inventors: Chris D. Lucero, Chandler, AZ (US); Khine Han, Gilbert, AZ (US); Joshua D. Heppner, Chandler, AZ (US); Christopher Rossi, Phoenix, AZ (US); Hadi Sharifi, Tempe, AZ (US); Aniekeme Udofia, Chandler, AZ (US); Abdul Bailey, Tigard, OR (US); Katherine Perkins, Gilbert, AZ (US); Kevin Lowell Hudson, San Tan Valley, AZ (US); Roderick E. Kronschnabel, Chandler, AZ (US); Neha Purushothaman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/251,697

(22) PCT Filed: Dec. 21, 2018

(86) PCT No.: PCT/US2018/067318
§ 371 (c)(1),
(2) Date: Dec. 11, 2020

(87) PCT Pub. No.: WO2020/131121
PCT Pub. Date: Jun. 25, 2020

(65) Prior Publication Data
US 2021/0307189 A1 Sep. 30, 2021

(51) Int. Cl.
*H05K 7/14* (2006.01)
*G06F 15/78* (2006.01)
*H05K 1/14* (2006.01)

(52) U.S. Cl.
CPC ....... *H05K 7/1422* (2013.01); *G06F 15/7803* (2013.01); *H05K 1/141* (2013.01)

(58) Field of Classification Search
CPC ............. H05K 1/14; H05K 1/141–144; H05K 2201/10098; H05K 2201/10189;
(Continued)

(56) References Cited

U.S. PATENT DOCUMENTS 5,677,830 A * 10/1997 Nogas .................. H05K 7/1435
361/732
7,180,751 B1 * 2/2007 Geschke .............. H01R 31/065
361/792
(Continued)

FOREIGN PATENT DOCUMENTS

| CN | 113170581 | 7/2021 |
| DE | 112018007704 | 3/2021 |
| WO | 2020131121 | 6/2020 |

OTHER PUBLICATIONS

"International Application Serial No. PCT US2018 067318, International Preliminary Report on Patentability dated Jul. 1, 2021", 10 pgs.
(Continued)

*Primary Examiner* — Tuan T Dinh
(74) *Attorney, Agent, or Firm* — Schwegman Lundberg & Woessner, P.A.

(57) ABSTRACT

An Internet of Things (IoT) apparatus including a plurality of boards and one or more connectors to couple IoT modules to one or more of the plurality of boards and to couple the plurality of boards to each other. The connectors include
(Continued)

stacking connectors on both sides of at least some of the boards and at least some of the IoT modules to be coupled to the boards.

24 Claims, 27 Drawing Sheets

(58) Field of Classification Search
CPC ......... H05K 2201/10325; H05K 7/142; H05K 7/422; H05K 7/1402; H01M 10/482–488; H04L 41/22; H04L 41/082; H04L 41/0853
USPC ............................ 361/770–790; 257/660–690
See application file for complete search history.

(56) References Cited

U.S. PATENT DOCUMENTS

| | | | |
|---|---|---|---|
| 7,840,732 B2* | 11/2010 | Kn | G06F 13/4095 370/255 |
| 8,665,599 B2* | 3/2014 | Shen | H02J 7/0045 361/728 |
| 8,706,932 B1* | 4/2014 | Kanapathippillai | G06F 13/1694 710/72 |
| 10,136,296 B1 | 11/2018 | Dames et al. | |
| 2015/0262443 A1 | 9/2015 | Chong | |
| 2015/0347486 A1 | 12/2015 | Julia et al. | |
| 2015/0381776 A1* | 12/2015 | Seed | H04L 5/0055 709/203 |
| 2016/0209899 A1 | 7/2016 | Brantner et al. | |
| 2016/0242291 A1* | 8/2016 | Park | H05K 1/0259 |
| 2016/0328719 A1 | 11/2016 | Ananchaperumal et al. | |
| 2017/0187807 A1* | 6/2017 | Clernon | H04L 67/34 |
| 2018/0285062 A1* | 10/2018 | Ulaganathan | G10L 15/22 |
| 2019/0296470 A1* | 9/2019 | Wig | G06F 1/266 |

OTHER PUBLICATIONS

"International Application Serial No. PCT US2018 067318, International Search Report dated Sep. 20, 2019", 3 pgs.

"International Application Serial No. PCT US2018 067318, Written Opinion dated Sep. 20, 2019", 8 pgs.

"Korean Application Serial No. 10-2020-7036917, Voluntary Amendment filed Apr. 5, 2022", w/English claims, 13 pgs.

* cited by examiner

200

300

400

700

800

1000

1900

2000

MODULAR SYSTEM FOR INTERNET OF THINGS AND METHOD OF ASSEMBLING THE SAME

PRIORITY APPLICATION

This application is a U.S. National Stage Application under 35 U.S.C. 371 from International Application No. PCT/US2018/067318, filed Dec. 21, 2018, published as WO 2020/131121, which is incorporated herein by reference in its entirety.

TECHNICAL FIELD

The present techniques relate generally to Internet of Things (IoT) devices and/or IoT systems.

BACKGROUND

A current view of the Internet is the connection of clients, such as personal computers, tablets, smart phones, servers, digital photo-frames, and many other types of devices, to publicly-accessible data-centers hosted in server farms. However, this view represents a small portion of the overall usage of the globally-connected network. A very large number of connected resources currently exist, but are not publicly accessible. Examples include corporate networks, private organizational control networks, and monitoring networks spanning the globe, often using peer-to-peer relays for anonymity.

It has been estimated that the internet of things (IoT) may bring Internet connectivity to more than 15 billion devices by 2020. For organizations, IoT devices may provide opportunities for monitoring, tracking, or controlling other devices and items, including further IoT devices, other home and industrial devices, items in manufacturing and food production chains, and the like. The emergence of IoT networks has served as a catalyst for profound change in the evolution of the Internet. In the future, the Internet is likely to evolve from a primarily human-oriented utility to an infrastructure where humans may eventually be minority actors in an interconnected world of devices.

In this view, the Internet will become a communications system for devices, and networks of devices, to not only communicate with data centers, but with each other. The devices may form functional networks, or virtual devices, to perform functions, which may dissolve once the function is performed. Challenges exist in enabling reliable, secure, and identifiable devices that can form networks as needed to accomplish tasks.

IoT devices are physical objects that may communicate on a network, and may include sensors, actuators, and other input/output components, such as to collect data or perform actions from a real world environment. For example, IoT devices may include low-powered devices that are embedded or attached to everyday things, such as buildings, vehicles, packages, etc., to provide an additional level of artificial sensory perception of those things. IoT devices have become more popular and applications using these devices have proliferated.

Various specifications have been proposed to more effectively interconnect and operate IoT devices and IoT network use cases. These include the specialization of communication specifications distributed by groups such as the Institute of Electrical and Electronics Engineers (IEEE), and the specialization of application interaction architecture and configuration standards distributed by groups such as the Open Connectivity Foundation (OCF).

BRIEF DESCRIPTION OF THE DRAWINGS

FIG. 5, which includes

FIG. 6, which includes

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
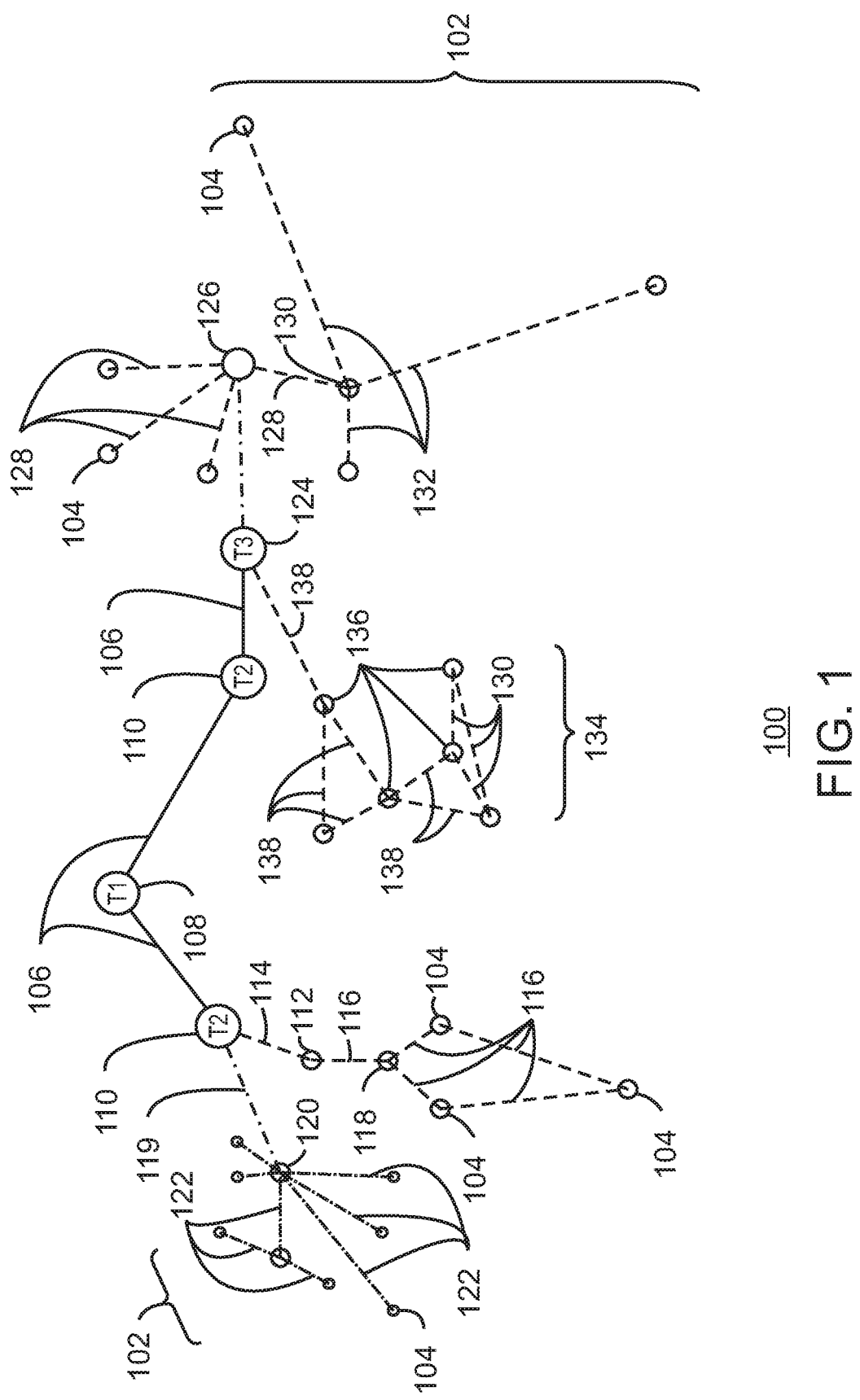
FIG. 1 illustrates interconnections that may be present in the Internet in accordance with some embodiments.

Some embodiments relate to Internet of Things (IoT) devices and/or IoT systems. For example, in some embodiments, a platform is provided for IoT sensors. The platform can be an IoT sensor hub, for example.

In some embodiments, form factors can be used to provide plug and play connectivity of a variety of system components or modules (for example, such as compute modules, connectivity modules, and/or sensor modules). This type of plug and play connectivity can be provided to support IoT edge usage models.

In some embodiments, infinite building blocks can be used to configure modules in such a way that signals can be passed through without being shorted. In some embodiments, modules may be used in a manner that is interchangeable and/or expandable. Signals can be maintained regardless of where they are placed in the platform. Modules may be arranged so that they are not able to be misplaced in an incorrect manner, and correct signals are maintained. Additionally, in some embodiments, the number of sensors can be expanded to any necessary number of sensors. Similarly, the number of connectivity modules (and/or radios) and/or the number of compute modules can also be expanded to any necessary number. Developers can develop a module on the platform in a manner that can be easily included in the ecosystem. In some embodiments, power can be provided by battery, solar, or wall power, for example. In some embodiments, modules such as radios or sensors can be added to the platform in a modular fashion.

In some embodiments, the mechanical and signal structure of the platform can be arranged in a manner that is foolproof. In some embodiments, software is included in a manner so that modules can be upgraded (for example, via wireless and/or wired transmission). Upgrades can be sent in a manner so that the upgrade goes to the correct module in the platform (for example, in some embodiments, an upgrade can go directly to the correct module rather than going through another module).

In some embodiments, scalable, stackable, and/or configurable modules (for example, external sensor modules, radio modules, processor modules, etc.) can be built. In some embodiments, any of the modules may include a microprocessor control unit (MCU). A flexible framework allows unlimited use cases of interoperability. In some embodiments, a color-coded system of stackable, intelligent modules can be used with multiple MCUs (microprocessor control units), radios, and sensors. In some embodiments, modular schematic and layout techniques can facilitate rapid conversion from multi-board designs to integrated monolithic board designs and/or system-in-package (SiP) designs. In some embodiments, a flexible loosely coupled firmware module framework can provide an ability to bring together firmware components developed by distributed development teams. This can help reduce code development and integration time.

In some embodiments, an architecture is implemented that is very easy to scale, and is therefore able to support low-end systems such as bare-metal MCU designs, and is also able to support high-end MCU-based embedded systems that utilize a real time operating system (RTOS). In some embodiments, plug and play firmware building blocks can be used to support visual firmware programming using basic firmware development plug-ins. Easy dragging and dropping of firmware components can be implemented to create firmware images using a graphical user interface (GUI) without having to write glue code, for example.

In some embodiments, a multi-board, modular system allows mixing and matching of different task-specific boards such as IoT boards to create a particular solution for a given use case. For example, these systems can be used for IoT edge or gateway solutions. In some embodiments, the modular system can be a plug-in sensor module for a gateway, for example, with sensor data gathering and compute resources, feeding onto an access point. Wired communication can be supported by the system. Wireless communication with remote sensor nodes and multiple radios can also be supported by the system.

In some embodiments, a modular solution can allow evaluation of modules and provide data collection without a major investment. Once an optimal configuration is determined based on prototyping and testing of modular arrangements, a final highly-integrated solution can be implemented that is cost optimized for high volume manufacturing. Additionally, the modular structure can lead to a standardization by the IoT industry around a modular framework.

FIGS. 1-4 include example operating environments such as Internet of Things (IoT) environments which may utilize principles described herein. The example operating environments of FIGS. 1-4 may utilize principles described herein relating to an IoT network or system (for example, IoT networks, IoT systems, IoT devices, fog devices, fog networks, edge devices, edge networks, foglets, etc.) as illustrated in the drawings and described in reference thereto.

The Internet of Things (IoT) is a system in which a large number of computing devices are interconnected to each other and to a communications network (e.g., the Internet) to provide a functionality, such as data acquisition and actuation, at very low levels in networks. Low levels indicate devices that may be located at or near the edges of networks, such as the last devices before the networks end. As used herein, an IoT device may include a device performing a function, such as sensing or control, among others, in communication with other IoT devices and a communications network. The IoT device may include an autonomous device or a semiautonomous device configured to perform one or more functions. Often, IoT devices can be limited in memory, size, or functionality, allowing larger numbers to be deployed for a similar cost to a smaller number of larger devices. However, an IoT device may be a smart phone, laptop, tablet, PC, and/or other larger device. Further, an IoT device may be a virtual device, such as an application on a smart phone or other computing device. IoT devices may include IoT gateways, used to couple IoT devices to other IoT devices and to cloud applications, for data storage, process control, and the like.

Networks of IoT devices may include commercial and home devices, such as water distribution systems, electric power distribution systems, pipeline control systems, plant control systems, light switches, thermostats, locks, cameras, alarms, motion sensors, and the like. The IoT devices may be accessible through a controller, such as computers, servers, and other systems, for example, to control systems or access data. The controller and the IoT devices can be remotely located from one another.

The Internet can be configured to provide communications to a large number of IoT devices. Accordingly, as described herein, a number of innovations for the future Internet are designed to address the need for network layers, from central servers, through gateways, down to edge devices, to grow unhindered, to discover and make accessible connected resources, and to support the ability to hide and compartmentalize connected resources. Any number of network protocols and communications standards may be used, wherein each protocol and standard is designed to address specific objectives. Further, the protocols are part of the fabric supporting human accessible services that operate regardless of location, time or space. The innovations include service delivery and associated infrastructure, such as hardware and software. The services may be provided in accordance with the Quality of Service (QoS) terms specified in service level and service delivery agreements. The use of IoT devices and networks present a number of new challenges in a heterogeneous network of connectivity including a combination of wired and wireless technologies as depicted in FIGS. 1 and 2.

Figure 2:
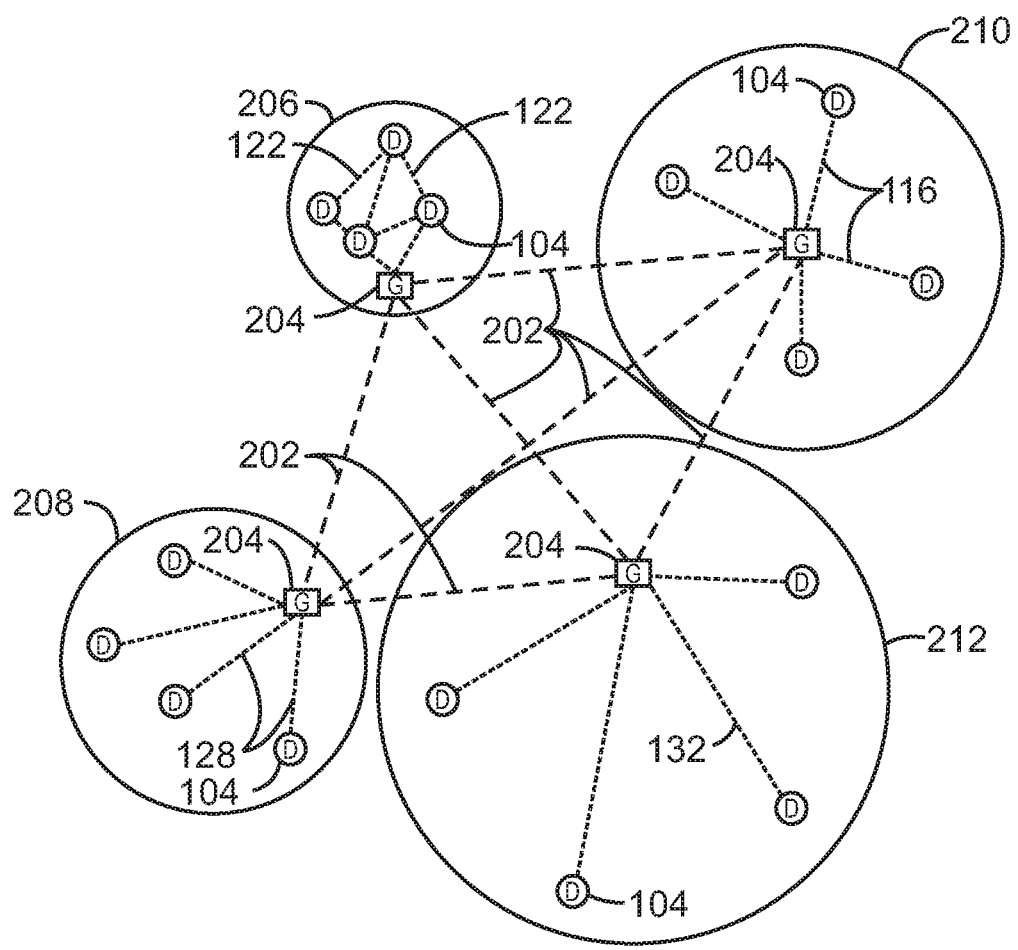
FIG. 2 illustrates a network topology for a number of internet-of-things (IoT) networks coupled through backbone links to gateways in accordance with some embodiments.

FIG. 1 is a drawing of interconnections that may be present between the Internet 100 and IoT networks in accordance with some embodiments. The interconnections may couple smaller networks 102, down to the individual IoT device 104, to the backbone 106 of the Internet 100. To simplify the drawing, not every device 104, or other object, is labeled.

In FIG. 1, top-level providers, which may be termed tier 1 ("T1") providers 108, are coupled by the backbone 106 of the Internet to other providers, such as secondary or tier 2 ("T2") providers 110. In some aspects, the backbone 106 can include optical fiber links. In one example, a T2 provider 110 may couple to a tower 112 of an LTE cellular network, for example, by further links, by microwave communications 114, or by other communications technologies. The tower 112 may couple to a mesh network including IoT devices 104 through an LTE communication link 116, for example, through a central node 118. The communications between the individual IoT devices 104 may also be based on LTE communication links 116.

In another example, a high-speed uplink 119 may couple a T2 provider 110 to a gateway 120. A number of IoT devices 104 may communicate with the gateway 120, and with each other through the gateway 120, for example, over Bluetooth® low energy (BLE) links 122.

The backbone 106 may couple lower levels of service providers to the Internet, such as tier 3 ("T3") providers 124. A T3 provider 124 may be considered a general Internet service provider (ISP), for example, purchasing access to the backbone 106 from a T2 provider 110 and providing access to a corporate gateway 126 and other customers.

From the corporate gateway 126, a wireless local area network (WLAN) can be used to communicate with IoT devices 104 through Wi-Fi® links 128. A Wi-Fi link 128 may also be used to couple to a low power wide area (LPWA) gateway 130, which can communicate with IoT devices 104 over LPWA links 132, for example, compatible with the LoRaWAN specification promulgated by the LoRa Alliance.

The T3 provider 124 may also provide access to a mesh network 134 through a coordinator device 136 that communicates with the T3 provider 124 using any number of communications links, such as an LTE cellular link, an LPWA link, or a link 138 based on the IEEE 802.15.4 standard, such as Zigbee®. Other coordinator devices 136 may provide a chain of links that forms one or more cluster tree of linked devices.

In some aspects, one or more IoT devices 104 include the appropriate transceiver for the communications with other devices. Further, one or more IoT devices 104 may include other radio, optical, or acoustic transceivers, as well as wired network interfaces, for communications using additional protocols and frequencies. In some aspects, one or more IoT devices 104 includes components described in regard to FIG. 12.

The technologies and networks may enable the growth of devices and networks. As the technologies grow, the network may be developed for self-management, functional evolution, and/or collaboration, without needing direct human intervention. Thus, the technologies may enable networks to function without centralized controlled systems. The technologies described herein may automate the network management and operation functions beyond current capabilities. Further, the approaches may provide the flexibility to have a centralized control operating without human intervention, a centralized control that is automated, or any combinations thereof.

FIG. 2 is a drawing of a network topology 200 that may be used for a number of internet-of-things (IoT) networks coupled through backbone links 202 to gateways 204 in accordance with some embodiments. Like numbered items are as described with respect to FIG. 1. Further, to simplify the drawing, not every device 104, or communications link 116, 122, 128, or 132 is labeled. The backbone links 202 may include any number of wired or wireless technologies, and may be part of a local area network (LAN), a wide area network (WAN), or the Internet.

Although the topologies in FIG. 2 are hub-and-spoke and the topologies in FIG. 1 are peer-to-peer, it may be observed that these are not in conflict, but that peer-to-peer nodes may behave as hub-and-spoke through gateways. It may also be observed in FIG. 2 that a sub-net topology may have multiple gateways, rendering it a hybrid topology rather than a purely hub-and-spoke topology (or rather than a strictly hub-and-spoke topology).

The network topology 200 may include any number of types of IoT networks, such as a mesh network 206 using Bluetooth® Low Energy (BLE) links 122. Other IoT networks that may be present include a WLAN network 208, a cellular network 210, and an LPWA network 212. Each of these IoT networks may provide opportunities for new developments, as described herein.

For example, communications between IoT devices 104, such as over the backbone links 202, may be protected by a decentralized system for authentication, authorization, and accounting (AAA). In a decentralized AAA system, distributed payment, credit, audit, authorization, brokering, arbitration, and authentication systems may be implemented across interconnected heterogeneous infrastructure. This allows systems and networks to move towards autonomous operations.

In these types of autonomous operations, machines may contract for human resources and negotiate partnerships with other machine networks. This may allow the achievement of mutual objectives and balanced service delivery against outlined, planned service level agreements as well as achieve solutions that provide metering, measurements and traceability and trackability. The creation of new supply chain structures and methods may enable a multitude of services to be created, mined for value, and collapsed without any human involvement.

The IoT networks may be further enhanced by the integration of sensing technologies, such as sound, light, electronic traffic, facial and pattern recognition, smell, and vibration, into the autonomous organizations. The integration of sensory systems may allow systematic and autonomous communication and coordination of service delivery against contractual service objectives, orchestration and quality of service (QoS) based swarming and fusion of resources.

The mesh network 206 may be enhanced by systems that perform inline data-to-information transforms. For example, self-forming chains of processing resources comprising a multi-link network may distribute the transformation of raw data to information in an efficient manner. This may allow such functionality as a first stage performing a first numerical operation, before passing the result to another stage, the next stage then performing another numerical operation, and passing that result on to another stage. The system may provide the ability to differentiate between assets and resources and the associated management of each. Furthermore, the proper components of infrastructure and resource based trust and service indices may be inserted to improve the data integrity, quality assurance, and deliver a metric of data confidence.

As described herein, the WLAN network 208 may use systems that perform standards conversion to provide multi-standard connectivity, enabling IoT devices 104 using different protocols to communicate. Further systems may provide seamless interconnectivity across a multi-standard infrastructure comprising visible Internet resources and hidden Internet resources.

Communications in the cellular network 210 may be enhanced by systems that offload data, extend communications to more remote devices, or both. The LPWA network 212 may include systems that perform non-Internet protocol (IP) to IP interconnections, addressing, and routing.

Figure 3:
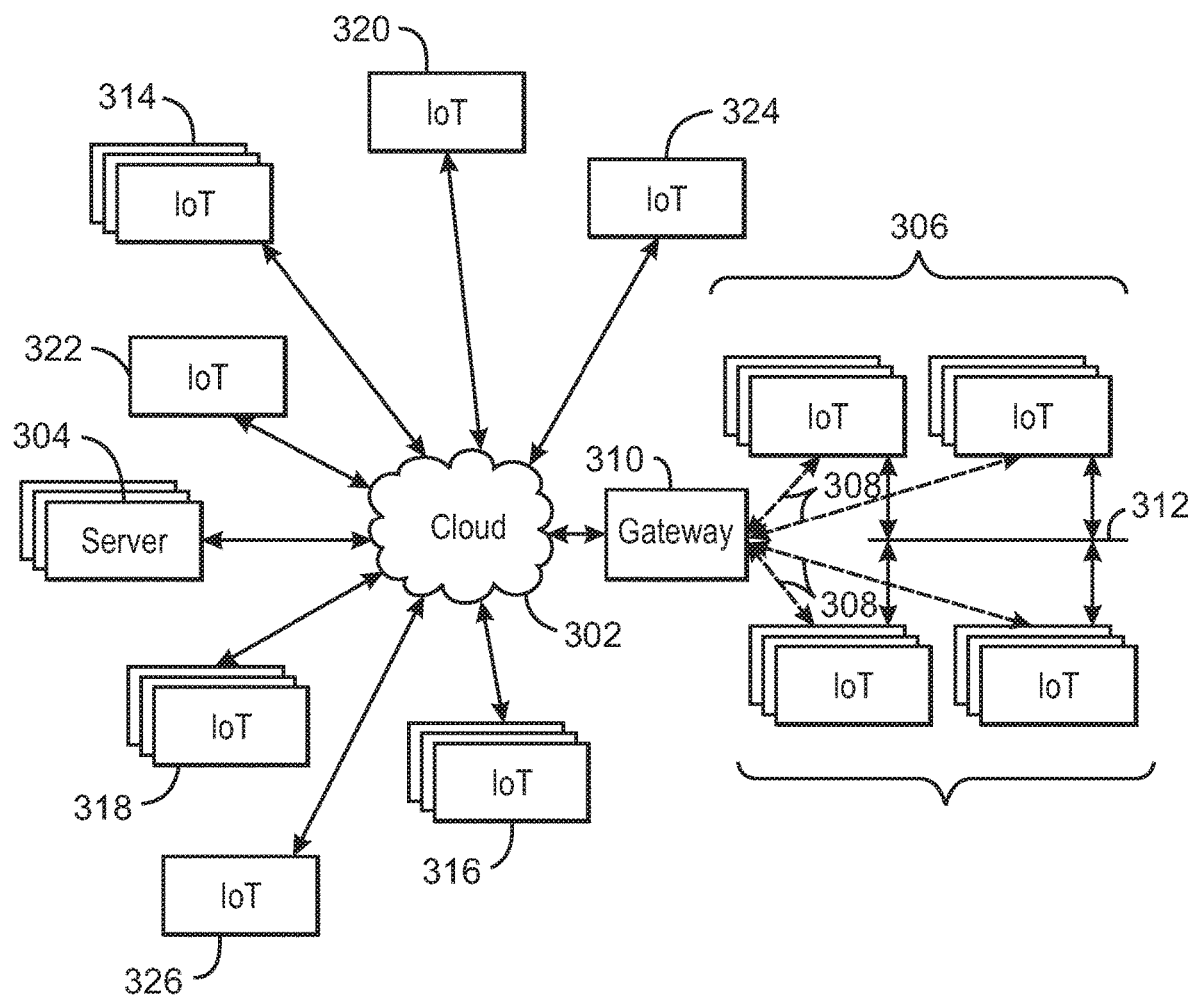
FIG. 3 illustrates a cloud computing network, or cloud, in communication with a number of IoT devices in accordance with some embodiments.

FIG. 3 is a drawing 300 of a cloud computing network, or cloud 302, in communication with a number of Internet of Things (IoT) devices in accordance with some embodiments. The cloud 302 may represent the Internet, or may be a local area network (LAN), or a wide area network (WAN), such as a proprietary network for a company, or intranet. The IoT devices may include any number of different types of devices, grouped in various combinations. Further, as used herein, the IoT devices may include any number of other types of devices such as a personal computer, a tablet, a smart phone, a smart television, and the like. For example, a traffic control group 306 may include IoT devices along streets in a city. These IoT devices may include stoplights, traffic flow monitors, cameras, weather sensors, and the like. The traffic control group 306, or other subgroups, may be in communication with the cloud 302 through wireless links 308, such as LPWA links, and the like. Further, a wired or wireless sub-network 312 may allow the IoT devices to communicate with each other, such as through a local area network (LAN), a wireless local area network (WLAN), and the like. The IoT devices may use another device, such as a gateway 310 to communicate with the cloud 302. In some examples, the sub-network 312 may couple one or more of the IoT devices to the gateway 310 using a wired network.

Any of the IoT devices may also use one or more servers (not shown) operationally disposed along the gateway 310, or between the group 306 and the gateway 310, to facilitate communication of the group 306 with the cloud 302 or with the gateway 310. For example, the one or more servers may operate as an intermediate network node to support a local edge cloud or fog implementation among a local area network.

The network topology may include various types of IoT networks, such as a mesh network via Bluetooth® low energy (BLE) links. Other types of IoT networks may include a wireless local area network (WLAN) network to communicate with IoT devices through IEEE 802.11 (Wi-Fi®) links, a cellular network to communicate with IoT devices through an LTE/LTE-A (4G) or 5G cellular network, and a LPWA network. A LPWA network may be compatible with the long range wide area network (LoRaWAN™) specification promulgated by the LoRa alliance. The network topology or IoT network(s) may include IPv6 over Low Power Wide-Area Networks (LPWAN) network compatible with a specification promulgated by the Internet Engineering Task Force (IETF). Further, the respective IoT networks may communicate with an outside network provider (e.g., a tier 2 or tier 3 provider) via a variety of communications links, such as an LTE cellular link, an LPWA link, or a link based on the IEEE 802.15.4 standard, such as Zigbee®, and so on. The respective IoT networks may also operate by network and internet application protocols such as Constrained Application Protocol (CoAP). The respective IoT networks may also be integrated with coordinator devices that provide a chain of links that forms cluster tree of linked devices and networks.

Although wireless networks and wired networks are described, such as LPWA links, optical links, and the like, it may be noted that any type of network may be used to couple the devices to each other or to a gateway 310. A network or assembled group of devices may have both wired and wireless connections, and may use both simultaneously between nodes, peers, and gateway devices. Further the network or assembled group of devices may use wired networks, wireless networks, or both, to communicate with the cloud, and any higher performance computing devices that may be participating to deliver services or support to what is disclosed herein. Thus, any link 308 or network 312 may utilize a wired connection or a wireless connection. Further, IoT devices may be in direct communications with other devices in the cloud 302 without the use of a gateway 310. Additionally, the links 308 may use optical signal paths among both IoT devices with the cloud 302 and the gateway(s) 310, including the use of MUXing/deMUXing components that facilitate interconnection of the various devices.

IoT devices may include remote weather stations 314, local information terminals 316, alarm systems 318, automated teller machines 320, alarm panels 322, or moving vehicles, such as emergency vehicles 324 or other vehicles 326, among many others. Each of these IoT devices may be in communication with other IoT devices, with servers 304, or both.

As can be seen from FIG. 3, a large number of IoT devices may be communicating through the cloud 302. This may allow different IoT devices to request or provide information to other devices autonomously. For example, the traffic control group 306 may request a current weather forecast from a group of remote weather stations 314, which may provide the forecast without human intervention. Further, an emergency vehicle 324 may be alerted by an automated teller machine 320 that a burglary is in progress. As the emergency vehicle 324 proceeds towards the automated teller machine 320, it may access the traffic control group 306 to request clearance to the location, for example, by lights turning red to block cross traffic at an intersection in sufficient time for the emergency vehicle 324 to have unimpeded access to the intersection.

As described herein, as conditions change, some of the IoT devices may experience higher loadings, leading to higher latency, reduced performance, or lost data. For example, as the emergency vehicle 324 approaches the intersection, the increased communications between lights may overload controllers in the lights. accordingly, the traffic control group 306 may shift operations, such as light control, from the lights to other devices in the traffic control group 306, such as data aggregators, servers, or other devices. These devices may be located locally to the traffic control group 306, or may be accessed over a network. The devices used to implement the application may include the systems on the emergency vehicle 324 itself.

Clusters of IoT devices, such as the remote weather stations 314 or the traffic control group 306, may be equipped to communicate with other IoT devices as well as with the cloud 302. This may allow the IoT devices to form an ad-hoc network between the devices, allowing them to function as a single device, which may be termed a fog device. The fog device is discussed further with respect to FIG. 4.

Figure 4:
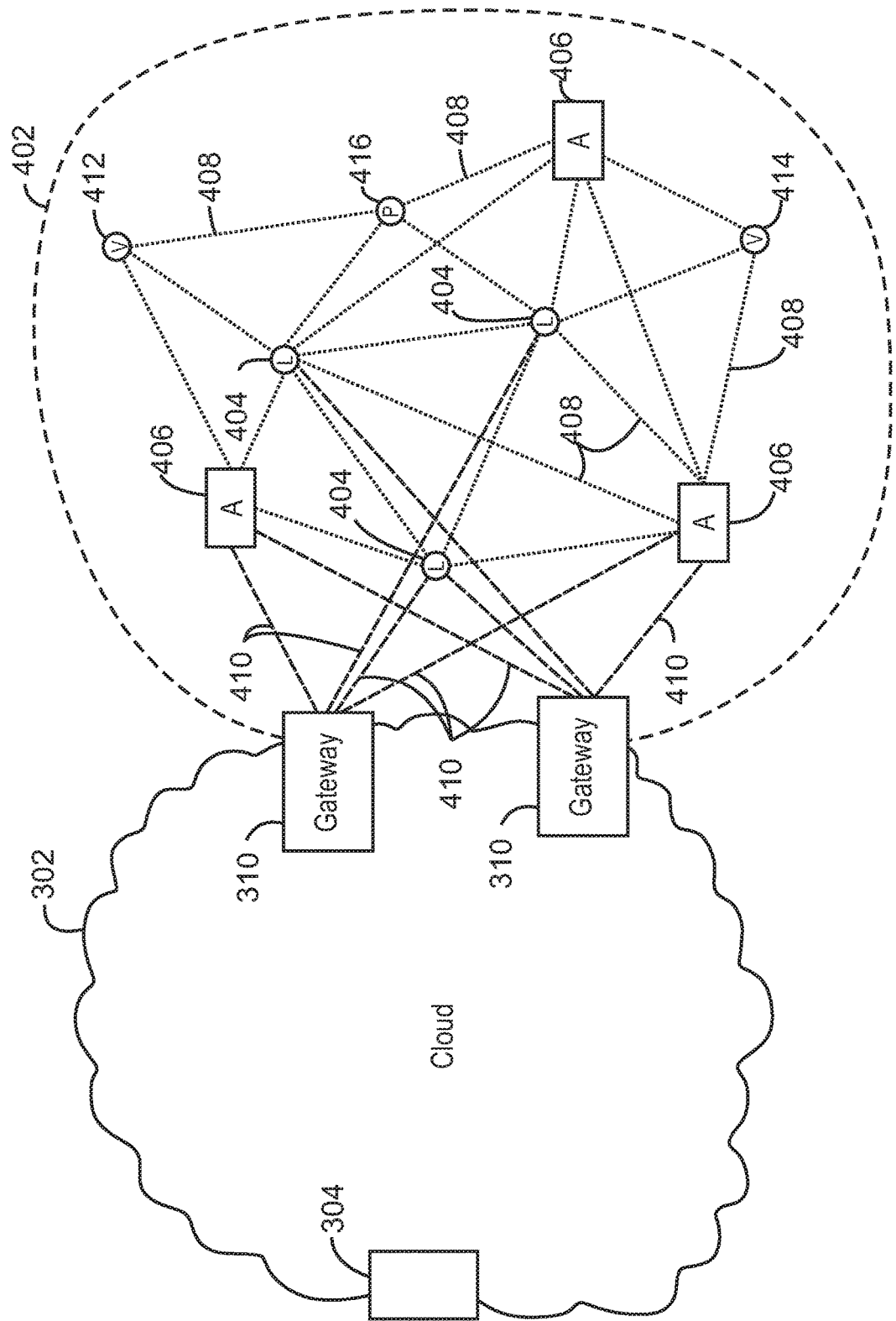
FIG. 4 illustrates a cloud computing network, or cloud, in communication with a mesh network of IoT devices, which may be termed a fog device, operating at the edge of the cloud in accordance with some embodiments.

FIG. 4 is a drawing 400 of a cloud computing network, or cloud 302, in communication with a network (for example, a mesh network) of IoT devices, which may be termed a fog device 402, operating at the edge of the cloud 302 in accordance with some embodiments. Like numbered items are as described with respect to FIG. 3. As used herein, a fog device 402 is a cluster of devices that may be grouped to perform a specific function, such as traffic control, weather control, plant control, home monitoring, and the like, among others.

Objects, such as the IoT devices, may interact to accomplish a larger function, goal or workflow, for example, to form a fog device. Objects may be identified in terms of their type, e.g., the function performed, and instance, e.g., presence. Multiple object instances may have the same type identity, but may have unique instance identities. Further, multiple object instances may be organized into groups where an instance of the grouping may have an identity. A group of objects that interact in a particular way, given their type, for example, function, state and interface semantics, may represent a composite object. The composition itself may have a type and instance abstraction. Hence, composite objects follow the same identity rules as atomic objects. Composition with type and instance properties allows object extensibility through composition.

The object may last as long as a single device, such as a refrigerator, or only until a current function is completed. For example, a refrigerator may be regarded as a composite object, or fog device 402, consisting of multiple other objects, such as a light, a compressor, a temperature sensor, a thermostat, a water dispenser, an ice maker, and the like. The other objects may each be atomic, or may themselves be composite objects. For example, and ice maker may be composite object formed from atomic objects, such as a temperature sensor, a thermostat, a solenoid-operated water valve, a timer, an ice tray, and the like. An example of a virtual composite object, or fog device 402, made up of a number of physical devices is the intersection and the emergency cluster, described herein.

Accordingly, object identity may be understood in context of three abstractions, object instance, object type, and meta-identity. An object instance is a computational element that occupies finite resources, such as memory, CPU, bandwidth, status, and the like. Object instantiation has a lifecycle that involves creation, mutation, and deletion. An object type is a logical construct that declares expected or possible behavior, states, and composition. The object type can place constraints on how objects behave and interact when instantiated. The object type can also indicate the types of requests the object can respond to, for example, the interface.

Meta-identity is a way of defining a meta-data context in which the object may exist. An object may not be aware of encapsulating meta-identity. Object instances may dynamically apply stereotyping information by defining a group having desired meta-data context then enrolling the object into the group.

Authentication and identity are collated issues. An object identity cannot be believed if not authenticated. However, authentication without identity has limited utility. Asymmetric key signing, such as ECDSA (Elliptic Curve Digital Signature Algorithm), RSA, or the like, is useful for authentication under the expectation that the ability to replicate and distribute the private key is restricted. The use of the key establishes proof a principal or agent has access to the key though restricted. Hence, the principal or agent must be authentic.

The semantics of authentication, when applied to object identities, also follows the three abstractions of object instance, object type, and meta-identity. For an object instance, the authentication challenge-response establishes that the current interaction can only be with a particular instantiation of the object. For an object type, the authentication challenge-response attests that the current interaction is constrained by the semantics of type identification. For the meta-identity, the authentication challenge-response categorizes the current interaction according to the defined context.

Blockchains may be used to provide the information both for authentication and for formation of the devices. Blockchains may be used to decentralize identification as they may provide agreement between devices regarding names and identities that are in current use. As used herein, a blockchain is a distributed database of identity records that is made up of data structure blocks. Further, as used herein, the term blockchain may include any one or more of other distributed ledger systems. Other distributed ledger approaches include Ripple, Hyperledger, Multichain, Keyless Signature Infrastructure, and the like. Each data structure block is based on a transaction, where the issuance of a new name to a device, composite device, or virtual device is one example of a transaction.

Using blockchains for identification, impersonation may be detected by observing re-issuance of names and identities without a corresponding termination. Public blockchains may be most useful, as they can enable a diverse community of observers to detect misnaming, malicious naming, or failure of a naming infrastructure. Thus, trustworthy identity infrastructure may be central to trusting IoT networks.

Although the fog device 402 is shown as a mesh network in this example, using gateways 310 to communicate with devices in the cloud 302, the devices do not have to be part of a mesh network, or even proximate to each other to form a fog device. Thus, the devices do not have to be in direct radio or network communications with each other, or proximate to each other, but may form an ad hoc group based on function. The formation of the fog device 402 may be as simple as sharing naming, type, and identification information, for example, group identity credentials, between the different devices forming the fog device. This may allow any device to act as a representative of the fog device 402, with providing identity specific to the device. As an example, although the fog device 402 is this example is shown as being made up of devices in a single location, fog devices can include devices in multiple locations, formed to provide specific services. For example, the fog device 402 may include remote weather stations located in the cloud 302. Further, a server 304 located in a data center may be included in the fog device 402 for data analysis, and other services.

The orchestration techniques described herein may be used with fog devices or in IoT networks that do not include fog devices, such as described with respect to FIG. 3. In one example, orchestration may take place within a fog device to transfer workloads from overloaded devices to less loaded devices. Further, the orchestration techniques may be used between fog devices to transfer workloads from overloaded fog devices to less loaded fog devices. In any of these cases, the transfer of the workloads may be transparent to a user.

In some examples, the fog device 402 includes a group of IoT devices at a traffic intersection. The fog device 402 may be established in accordance with specifications released by the OpenFog Consortium (OFC), among others. These specifications allow the formation of a hierarchy of computing elements between the gateways 310 coupling the fog device 402 to the cloud 302 and to endpoint devices, such as traffic lights 404 and data aggregators 406 in this example. The fog device 402 can leverage the combined processing and network resources that the collective of IoT devices provides. Accordingly, a fog device 402 may be used for any number of applications including, for example, financial modeling, weather forecasting, seismic measurement, traffic analyses, security monitoring, and the like.

For example, traffic flow through the intersection may be controlled by a plurality of traffic lights 404 (e.g., three traffic lights 404). Analysis of the traffic flow and control schemes may be implemented by aggregators 406 that are in communication with the traffic lights 404 and each other through a mesh network. The implementation of the traffic flow applications may take place in the traffic lights 204 themselves. Data may be uploaded to the cloud 302, and commands received from the cloud 302, through gateways 310 that are in communication with the traffic lights 404 and the aggregators 406 through the mesh network.

Any number of communications links may be used in the fog device 402. Shorter-range links 408 (for example, shorter-range radio links), for example, compatible with IEEE 802.15.4 may provide local communications between IoT devices that are proximate to the intersection. Longer-range links 410 (for example, longer-range radio links), for example, compatible with LPWA standards, may provide communications between the IoT devices and the gateways 310. To simplify the diagram, not every communication link 408 or 410 is labeled with a reference number. Further, not every device that participates in the fog device 402 needs to be located proximate to the other devices or in direct radio communications. For example, the fog device 402 may incorporate a weather station located on a different network. The naming and typing may identify if a particular IoT device is participating in a fog device 402.

Any one or more, or all, of the communications links 408 and 410 may be replaced with a wired connection between any two devices. Further, the network forming the fog device 402 does not have to be a mesh network, but may be a standard network in which each device is coupled to other devices through a wired or wireless connection to the gateways 310.

The fog device 402 may be considered to be an interconnected network (for example, a massively interconnected network) wherein a number of IoT devices are in communications with each other, for example, directly by the communication links 408 and 410, through the cloud 302 via a network communications link, or through a gateway 310. For devices proximate to each other, the network may be established using the open interconnect consortium (OIC) standard specification 1.0 released by the Open Connectivity Foundation™ (OCF) on Dec. 23, 2015. This standard allows devices to discover each other and establish communications for interconnects. Other interconnection and interoperability protocols may also be used, including, for example, the Open Platform Communications (OPC) Unified Architecture released in 2008 by the OPC Foundation, the AllJoyn protocol from the AllSeen alliance, the optimized link state routing (OLSR) Protocol, or the better approach to mobile ad-hoc networking (B.A.T.M.A.N.), among many others.

In some aspects, communications from one IoT device may be passed along the most convenient path to reach the gateways 310, for example, the path having the fewest number of intermediate hops, or the highest bandwidth, among others. In these networks, the number of interconnections provides substantial redundancy, allowing communications to be maintained, even with the loss of a number of IoT devices.

In some aspects, the fog device 402 can include temporary IoT devices. In other words, not all of the IoT devices may be permanent members of the fog device 402. For example, in the exemplary system 400, three transient IoT devices have joined the fog device 402, a first vehicle 412, a second vehicle 414, and a pedestrian 416. In these cases, the IoT device may be built into the vehicles 412 and 414, or may be an app on a smart phone carried by the pedestrian 416. Other IoT devices may also be present, such as IoT devices in bicycle computers, motorcycle computers, drones, and the like.

As described herein, the applications controlling the fog device may operate at any number of levels depending on a number of factors, such as the purpose of each device and the loading on the systems. For example, the traffic lights 404 may monitor sensors to identify approaching traffic, such as vehicles, pedestrians, bicycles, and the like, to implement a traffic control application. The sensors may be cameras that capture streaming video of the roadways and pass the streaming video to the traffic lights 404 for analysis. Under normal operations, the traffic lights 404 may cooperate with each other to determine which roadways have green lights and which roadways have red lights.

However, during periods when traffic is particularly heavy the traffic lights 404 may be overloaded. Accordingly, a traffic analysis task may be shifted to the data aggregators 406 or to the gateways 310. Further, the traffic analysis task may be shifted to other devices in contact with the traffic lights 404 as part of the fog device 402, such as the vehicles 412 and 414, or the server 304, depending on contact time, vehicle 412 or 414 capability, network latency, and the like. Once the loading returns to normal, the traffic analysis task may be shifted back to the traffic lights 404.

The fog device 402 formed from the IoT devices may be presented to clients in the cloud 302, such as the server 304, as a single device located at the edge of the cloud 302. In this example, the control communications to specific resources in the fog device 402 may occur without identifying any specific IoT device within the fog device 402. Accordingly, if one IoT device within the fog device 402 fails, other IoT devices in the fog device 402 may be able to discover and control a resource, such as an actuator, or other device attached to an IoT device. For example, the traffic lights 404 may be wired so as to allow any one of the traffic lights 404 to control lights for the other traffic lights 404. The aggregators 406 may also provide redundancy in the control of the traffic lights 404 and other functions of the fog device 402.

In some examples, the IoT devices may be configured using an imperative programming style, e.g., with each IoT device having a specific function and communication partners. However, the IoT devices forming the fog device 402 may be configured in a declarative programming style, allowing the IoT devices to reconfigure their operations and communications, such as to determine needed resources in response to conditions, queries, and device failures. This may be performed as transient IoT devices, such as the pedestrian 416, join the fog device 402.

A combination of IoT devices using an imperative programming style and devices using a declarative programming style may be used in applications. For example, more general purpose IoT devices may have the power to operate a declarative programming style to adapt to conditions that are changing. More constrained IoT devices, such as sensor devices, may not have the programming power to include more adaptive software.

As the pedestrian 416 is likely to travel more slowly than the vehicles 412 and 414, the fog device 402 may reconfigure itself to ensure that the pedestrian 416 has sufficient time to make it through the intersection. This may be performed by forming a temporary group of the vehicles 412 and 414 and the pedestrian 416 to control the traffic lights 404. If one or both of the vehicles 412 or 414 are autonomous, the temporary group may instruct the vehicles to slow down prior to the traffic lights 404. Further, if all of the vehicles at the intersection are autonomous, the need for traffic signals may be diminished since autonomous vehicles' collision avoidance systems may allow for highly inter-leaved traffic patterns that may be too complex for traffic lights to manage. However, traffic lights 404 may still be important for the pedestrian 416, cyclists, or non-autonomous vehicles.

As the transient devices 412, 414, and 416, leave the vicinity of the intersection of the fog device 402, the fog device 402 may reconfigure itself to eliminate those IoT devices from the network. As other transient IoT devices approach the intersection, the fog device 402 may reconfigure itself to include those devices.

The fog device 402 may include the traffic lights 404 for a number of intersections, such as along a street, along with all of the transient IoT devices along the street. The fog device 402 may then divide itself into functional units, such as the traffic lights 404 and other IoT devices proximate to a single intersection. This type of combination may enable the formation of larger IoT constructs, e.g., groups of IoT devices that perform a particular function, in the fog device 402.

For example, if an emergency vehicle joins the fog device 402, an emergency construct, or virtual device, may be created that includes all of the traffic lights 404 for the street. This may allow the control of the traffic flow patterns for the entire street. The emergency construct may instruct the traffic lights 404 along the street to stay red for opposing traffic and green for the emergency vehicle, expediting the passage of the emergency vehicle. The emergency construct may include a number of applications and functional blocks activated from a task image repository in the fog device 402, or downloaded to the fog device 402 from the server 304 or other devices in the cloud 302. Further, the task images may be downloaded from an emergency vehicle that joins the fog device 402.

The emergency construct may use the deployed applications to determine the location and roadway for the emergency vehicle. Applications may then instruct the traffic lights 404 along the street to stay red for opposing traffic and green for the emergency vehicle, expediting the passage of the emergency vehicle.

As illustrated by the fog device 402, the organic evolution of IoT networks is central to improving or maximizing the utility, availability and resiliency of IoT implementations. The use of applications that are shifted to different computing devices may increase the adaptability of the fog device 402, for example, providing easier incorporations of new functions.

The example indicates the usefulness of strategies for improving trust and therefore security. The local identification of devices may be important in implementations, as the decentralization of identity ensures a central authority cannot be exploited to allow impersonation of objects that may exist within the IoT networks. Further, local identification lowers communication overhead and latency.

Networks of devices may be provided in a multi-access edge computing (MEC) environment. Multi-access edge computing (MEC), also referred to as mobile edge computing, may offer application developers and content providers cloud-computing capabilities and an information technology service environment at the edge of a network. An MEC system may include an MEC orchestrator, and an MEC platform manager, which manage the provision of a service to a user equipment (UE) device, by a service provider, through one or more access points, or one or more MEC hosts.

The MEC environment may be part of a radio access network (RAN) that has been opened to third party providers, such as clearing houses for blockchain transactions. The RAN may provide a high bandwidth, low latency system that allows fog devices 402 to function more efficiently with applications and services in the cloud 302. Accordingly, cloud 302 may be seen as a cloud or fog server running at the edge of a mobile network and performing tasks that may not be achieved with traditional network infrastructure. Machine-to-Machine gateway and control functions, such as the IoT device examples described with respect to FIGS. 3 and 4, are one example. In an MEC network, processing power, such as servers, are moved closer to the edge of networks. For example, the aggregators 406 located within the fog device 402.

Figure 5A:
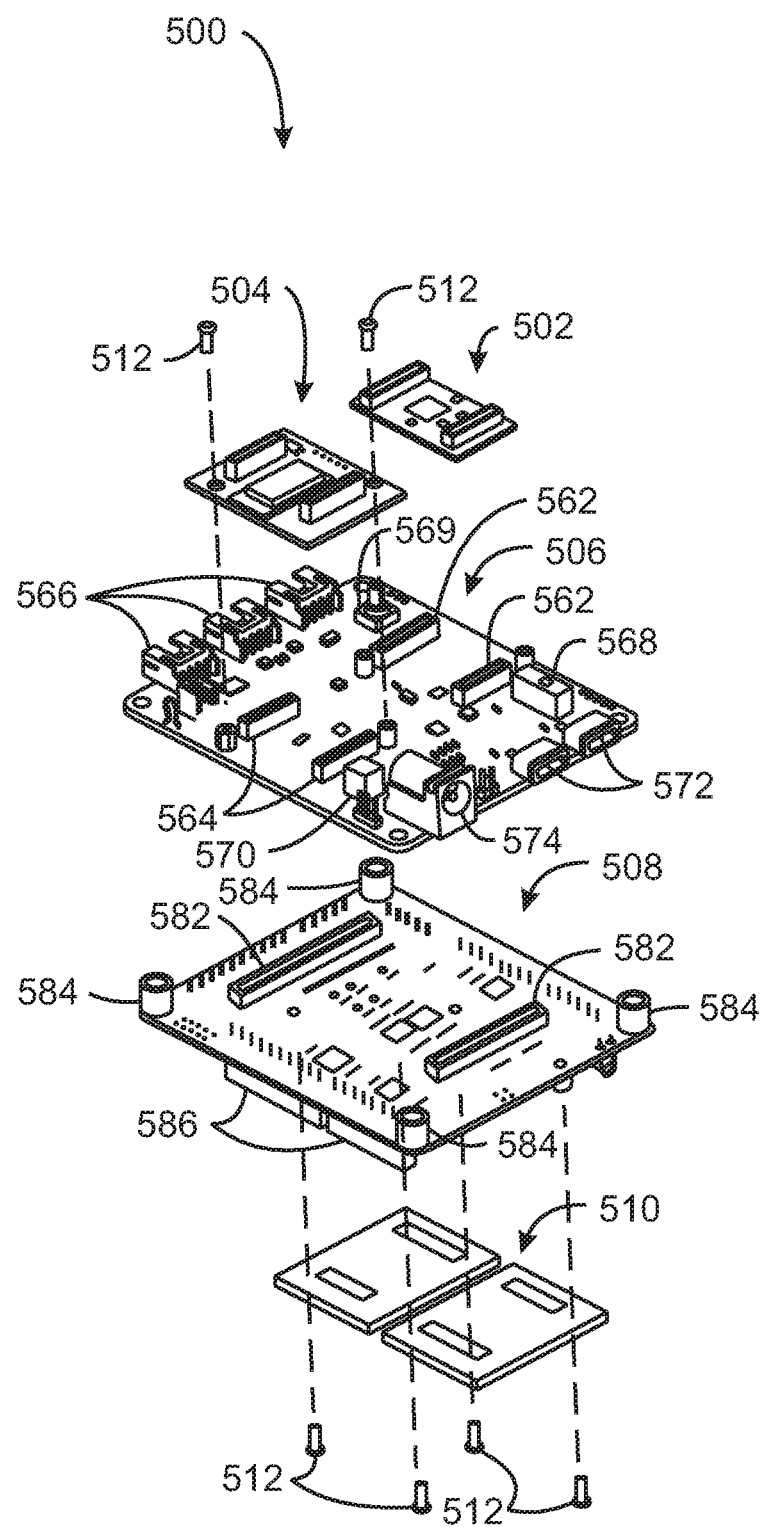
FIG. 5A and FIG. 5B, illustrates a platform or system in accordance with some embodiments.
Figure 5B:
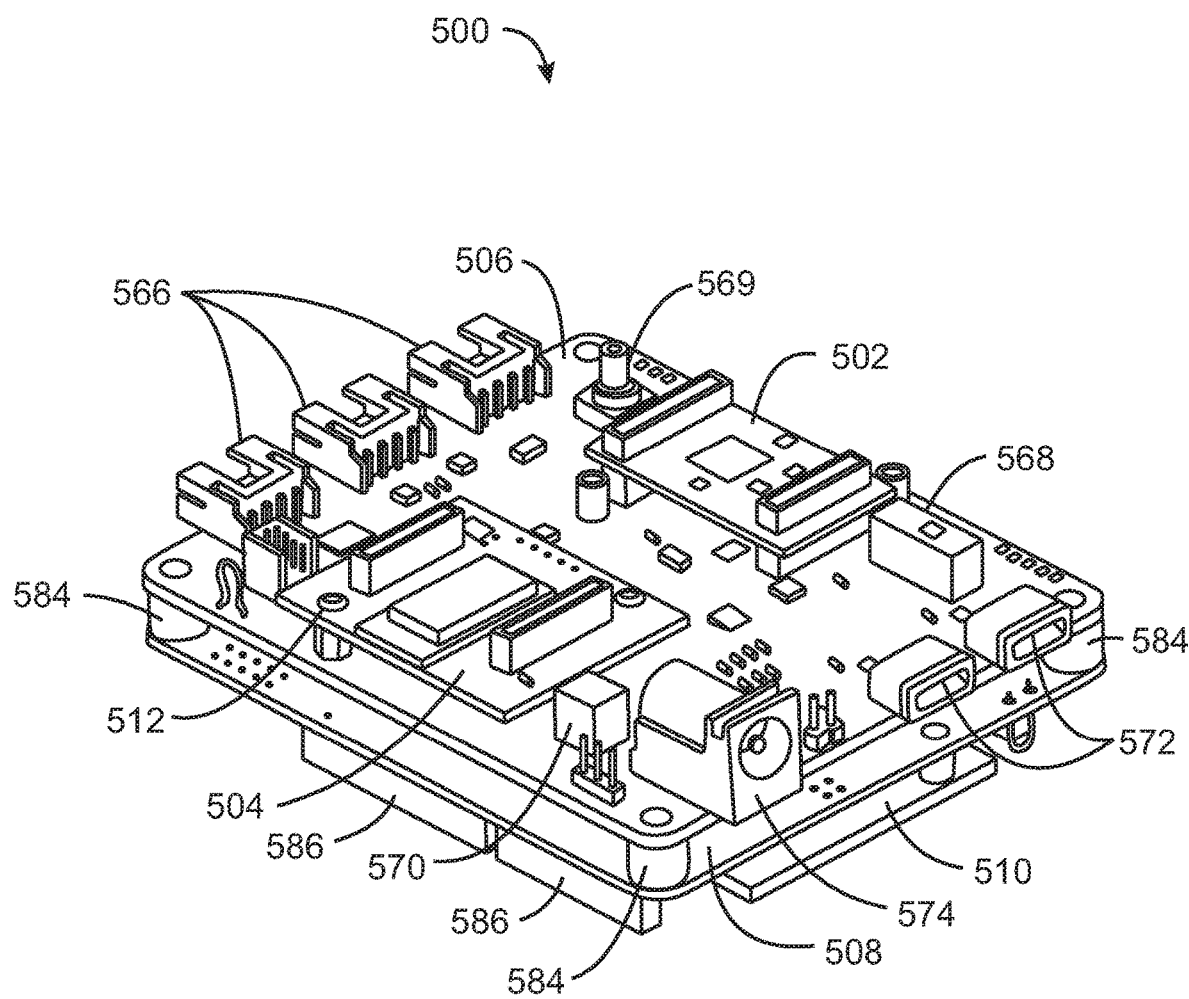

FIG. 5A illustrates a platform 500 (and/or a system 500) in accordance with some embodiments. In some embodiments, platform 500 is a modular platform and/or a modular system. In some embodiments, platform 500 is a wired sensor platform. In some embodiments, platform 500 is a wireless sensor platform. In some embodiments, platform 500 is an IoT platform. In some embodiments, platform 500 is an IoT system. In some embodiments, platform 500 is an IoT device. In some embodiments, platform 500 can be all or a portion of any of the devices in an IoT system. For example, in some embodiments, platform 500 can be all or a portion of any of the devices in any of the IoT environments of FIGS. 1-4. In some embodiments, platform 500 is an IoT sensor platform. In some embodiments, platform 500 is an IoT sensor hub. In some embodiments, platform 500 can be included in a wireless sensor network (WSN). Platform 500 can include some or all of a compute module 502, a connectivity module 504, a base board 506, a sensor base board 508, and one or more sensor modules 510 (two discrete sensor modules 510 are illustrated in FIG. 5A, for example). In some embodiments, FIG. 5B illustrates the platform 500 of FIG. 5A with the components such as the modules and boards coupled together. It is noted that while platform 500 is referred to herein as a platform, it may also be referred to in some embodiments as a system 500.

In some embodiments, connectors are used so that connections can be made in only a certain manner. In some embodiments, the connectors are stacking connectors (for example, using two sided modules). In some embodiments, the connectors are Hirose connectors. In some embodiments, connectors are used (for example, connectors are included in platforms 500) so that connections can be made in only a certain manner by using two sided modules and stacking connectors. For example, in some embodiments, connector mating is used in which two-sided modules with stacking connectors on both sides of a board (for example, both sides of a printed circuit board) allow additional modules to be stacked (for example, to be stacked above and below) within the platform (or system). For example, connector mating may be used so that other boards, modules, etc. cannot be inserted incorrectly.

In some embodiments, compute module 502 can be a microcontroller unit module (or MCU module), a processor unit module, a microprocessor unit module (or MPU module), etc., among others. In some embodiments, form factors can be used so that various diverse manufacturers of components can plug those components into the platform 500. For example, various sensor manufacturers can design their sensor modules to be plugged into platform 500, various compute manufacturers can design their compute modules to be plugged into platform 500, and/or various connectivity manufacturers (for example, radio manufacturers) can design their connectivity modules to be plugged into platform 500. In some embodiments, platform 500 can be a flexible, modular hardware edge system for the Internet of Things (IoT). In some embodiments, platform 500 can be an edge and/or fog sensor platform for gathering data in the Internet of Things (IoT). In some embodiments, platform 500 can be an IoT platform and/or an IoT device that can be included in an IoT system. In some embodiments, platform 500 is a system in which various sensors, communication or connectivity devices (for example, radios), microprocessor units (or microcontroller units) can be included. Although various modules are shown in FIG. 5, in some embodiments those modules can be arranged differently. For example, modules can be arranged vertically relative to each other in some embodiments, and can be arranged side by side in other embodiments. For example, rather than a processor module 502 next to communications module 504, two communications modules 504 could be side by side in FIG. 5, and a processor module 502 could be on top of one or both of those modules 504 in some embodiments.

In some embodiments, board 506 can include compute slots 562, connectivity slots 564, connectors 566 (for example, I2C, UART, and/or GPIO connectors), a power switch 568, a reset button 569, a battery connector 570, connectors 572 (for example, USB connectors), a power input jack 574, and other elements. For example, in some embodiments, board 506 has one or more board-to-board stacking connectors on a bottom side (not illustrated in FIG. 5A or FIG. 5B) for connecting with board 508. In some embodiments, connecting devices 512 (for example, screws) extend through boards 502 and 504 and mate with connection points on board 506.

In some embodiments, board 508 can include board to board connectors 582 which may be coupled to board to board connectors on the bottom of board 506. Board 506 can also include spacers 584 and shield connectors 586. It is noted that some embodiments allow for both shields and dongles. In some embodiments, connecting devices 512 (for example, screws) extend through boards 510 and mate with connection points on board 508.

Figure 6A:
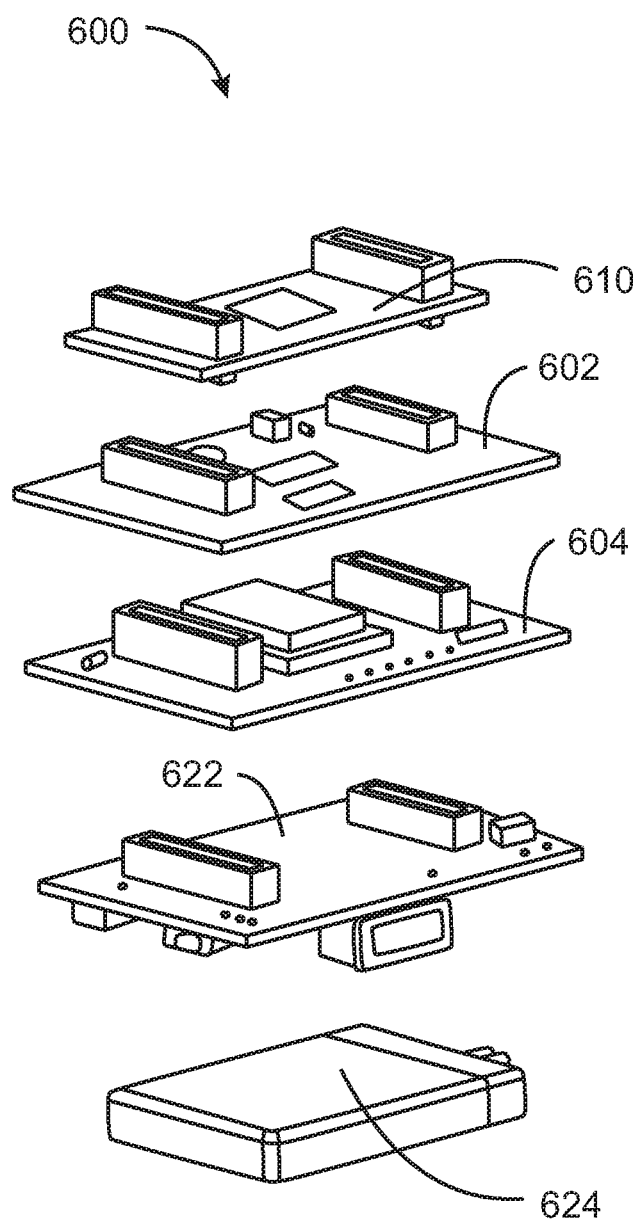
FIG. 6A and FIG. 6B, illustrates a platform or system in accordance with some embodiments.
Figure 6B:
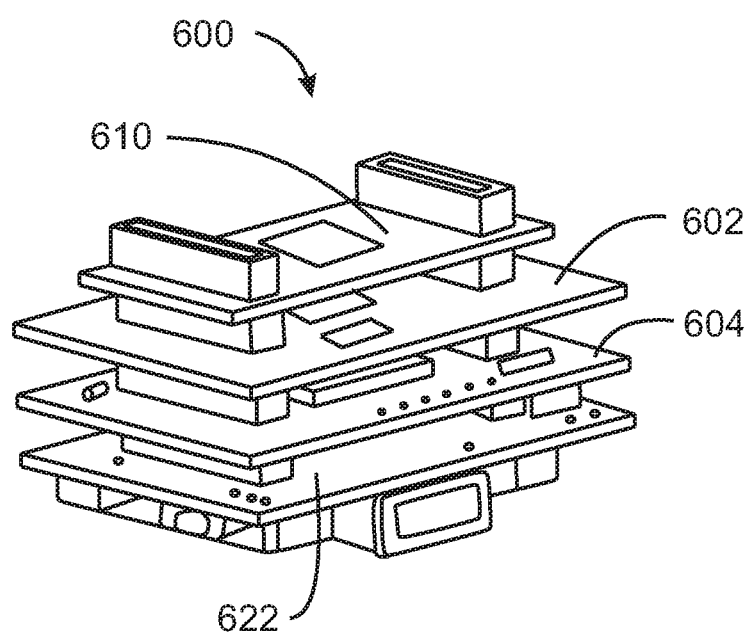

FIG. 6A illustrates a platform 600 (and/or a system 600) in accordance with some embodiments. In some embodiments, any of the elements of platform 600 can be the same as or similar to elements of platform 500. In some embodiments, platform 600 is a modular platform and/or a modular system. In some embodiments, platform 600 is a wired sensor platform. In some embodiments, platform 600 is a wireless sensor platform. In some embodiments, platform 600 is an IoT platform. In some embodiments, platform 600 is an IoT system. In some embodiments, platform 600 is an IoT device. In some embodiments, platform 600 can be all or a portion of any of the devices in an IoT system. For example, in some embodiments, platform 600 can be all or a portion of any of the devices in any of the IoT environments of FIGS. 1-4. In some embodiments, platform 600 is an IoT sensor platform. In some embodiments, platform 600 is an IoT sensor hub. In some embodiments, platform 600 can be included in a wireless sensor network (WSN). Platform 600 can include some or all of one or more compute module 602, one or more connectivity module 604, one or more sensor modules 610, one or more mini-stack base board 622, and one or more battery 624. In some embodiments, FIG. 6B illustrates the platform 600 of FIG. 6A with the components such as the modules and boards coupled together. In some embodiments, connectors are used in platform 600 in a manner similar to the connections made in platform 500. It is noted that while platform 600 is referred to herein as a platform, it may also be referred to in some embodiments as a system 600.

In some embodiments, platform 500 and/or platform 600 can provide a flexible framework in which various use cases may be implemented. In some embodiments, platform 500 and/or platform 600 can include stackable intelligent modules including multiple MCUs, radios, and/or sensors. In some embodiments, platform 500 and/or platform 600 provide a modular layout that can facilitate conversion from multi-board designs to integrated board designs (for example, integrated monolithic board designs) and system-in-package (SiP) designs, for example.

Various system level manufacturers or customers that want to use sensors to evaluate data in an IoT environment can use platform 500 and/or platform 600 to stack modules to solve sensing needs such as agricultural, retail, industrial, automotive, etc., among others. In some embodiments, platform 500 and/or platform 600 can be used as a kit for such a system level manufacturer or customer to put together a solution for a particular sensing need. Once finalized as platform 500 and/or platform 600, for example, the system level manufacturer or customer can then use such a kit to implement the solution and then later provide a high volume integration version, for example, on a single board.

In some embodiments, the modules and boards in platform 500 and/or platform 600 can be color coded for ease of use. For example, in some embodiments, compute module 502, compute module 602, and/or a board and/or other components of module 502 or module 602 can be a first color such as blue, connectivity module 504, connectivity module 604, and/or a board and/or other components of module 504 or module 604 can be a second color such as green, and sensor modules 510, sensor module 610, and/or boards and/or other components of modules 510 or module 610 can be a third color such as red. It is noted that while the stacking of boards and/or modules of platform 500 and/or platform 600 can be implemented in a vertical manner, other stacking may be implemented. For example, in some embodiments, boards and/or modules can be stacked in a horizontal manner.

In some embodiments, additional connectivity modules, compute modules, and/or sensor modules may be included. For example, in some embodiments, modules 502 and 504 could both be compute modules, and one or more connectivity module could be included elsewhere. In some embodiments, modules 502 and 504 could both be connectivity modules, and one or more compute modules could be included elsewhere.

In some embodiments, compute module 502 and/or compute module 602 may include a microprocessor, a multi-core processor, a multithreaded processor, an ultra-low voltage processor, an embedded processor, or other known processing element. The processor included in compute module 502 or 602 may be a part of a system on a chip (SoC) in which the processor and other components are formed into a single integrated circuit, or a single package, such as the Edison™ or Galileo™ SoC boards from Intel. As an example, the processor may include an Intel® Architecture Core™ based processor, such as a Quark™, an Atom™, an i3, an i5, an i7, a Xeon®, a Xeon Phi™ co-processor, or an MCU-class processor, or another such processor available from Intel® Corporation, Santa Clara, Calif. However, any number of other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as a processor from Apple® Inc. (for example, an A5-A10 processor from Apple® Inc.), a Snapdragon™ processor from Qualcomm® Technologies, Inc., or an OMAP™ processor from Texas Instruments, Inc.

In some embodiments, communication module 504 and/or communication module 604 may communicate using multiple standards or radios for communications at different range. For example, they may communicate with geographically proximate devices, e.g., within about 10 meters, using a local transceiver based on BLE, or another low power radio, to save power. More distant devices, e.g., within about 50 meters, may be reached over ZigBee or other intermediate power radios. Both communications techniques may take place over a single radio at different power levels, or may take place over separate transceivers, for example, a local transceiver using BLE and a separate mesh transceiver using ZigBee. A transceiver may also be incorporated into an MCU as an address directly accessible by the chip, such as in the Curie® units available from Intel. Any number of other radio communications and protocols may be used. For example, the radio communication modules may include an LTE or other cellular transceiver that uses spread spectrum (SPA/SAS) communications for implementing high-speed communications, such as for video transfers. Further, any number of other protocols may be used, such as Wi-Fi® networks for medium speed communications, such as still pictures, sensor readings, and provision of network communications.

In some embodiments, small cubes (for example, in some embodiments, one inch by one inch by one half inch cubes) can be created to be implemented in a manner that was previously implemented using larger cards (for example, using 3 inch by 5 inch cards). Multiple versions of platform 500 and/or platform 600 may be implemented throughout an area, for example, such as a home, plant, office, or city, using wired or wireless connectivity. This can be implemented using smart stacking and pass-through of pin signals, for example.

In some embodiments, platform 500 and/or platform 600 can be the sensor, edge, and/or aggregator of itself. For example, in some embodiments, a large number of platforms 600 (for example, 10 platforms 600) can be included in an IoT network that all feed one or more of platform 500 (for example, 10 platforms 600 feeding one platform 500), where platforms 600 are sensors and platform 500 is a sensor hub. In some embodiments, an IoT network can include a number of ultimate edge devices (for example, sensors) such as platforms 600 that look like a mini-stack, one or more aggregation points can collect information from those edge devices (for example, the aggregation points could be one or more platforms 500), and aggregators then feed to an IoT gateway, which can feed to a cloud (for example, in an IoT network such as any of those illustrated in FIGS. 1-4).

In some embodiments (for example, as illustrated in FIGS. 5A, 5B, 6A, and/or 6B), a multi-board modular system allows mixing of different task-specific boards to create a solution for a given use case. In some embodiments, IoT edge or gateway solutions can be created. In some embodiments, the system can be used as a plug-in sensor module for a gateway, with sensor data gathering and compute resources feeding into an access point. Wireless communication, wired communication, remote sensor nodes, and multiple radios can also be supported by the system. In some embodiments, a modular system solution allows rapid evaluation of ingredient devices as well as data collection for various implementations without a major investment. Once an optimal configuration is determined based on prototyping and testing, a final highly-integrated solution can be implemented that is cost optimized for high volume manufacturing. Additionally, various module providers of sensor, radio, and compute solutions can invest, co-develop, and standardize around the modular framework for rapid adoption. Further, the modular system can feed data up and into the IoT fog, for example.

In some embodiments (for example, as illustrated in FIGS. 5A, 5B, 6A, and/or 6B), by creating a "mix and match" framework for various sensor kit ingredients that can be stacked vertically or horizontally through the use of a common system pinout, a quick system solution is provided for evaluation of data collection, which can be sent up to the fog and/or cloud for further data analytics and use cases. In some embodiments, the connector system layout can allow for unlimited stacks and combinations of sensors, radios, MCUs, and batteries (or wall power).

In some embodiments, various standard form factors can be used. For example, a form factor for platform 500 illustrated in FIG. 5A and FIG. 5B can be intended for development and several sensors/connections (for example, a sensor hub). In some embodiments, a form factor for platform 500 can be around 2.4 inches by 3 inches. Similarly, a form factor for platform 600 illustrated in FIG. 6A and FIG. 6B can be intended for small applications nearest the data collection (for example, a mini-stack). In some embodiments, a form factor for platform 600 can be around 1 inch by 1.3 inches. In some embodiments, a physically larger development configuration with full debug features and numerous test and expansion hooks can be used for faster system and software development. This configuration can be easily converted to a much smaller, stacked configuration to build realistic-sized interim solutions for prototyping and testing.

In some embodiments, multiple connector pitches with variable stack heights and mounting hardware can be used for board stacking at different scales within the same platform. For example, small stacking connectors (for example, around 0.4 mm pitch) can be used to support stack heights (for example, from around 1.5 mm to 4 mm between boards) for mini-stacking at the modular level. Medium stacking connectors (for example, around 0.8 mm pitch) can be used to support stack heights (for example, from around 5 mm to 17 mm between boards) for macro-stacking at the base board level. Large stacking connectors (for example, around 25.4 mm pitch) can be used to support stack heights (for example, from around 12.7 mm to 50.8 mm between boards) for shield stacking (for example, such as Arduino shield stacking). In some embodiments, all stacking connector pairs (for example, all small, medium, and large pitch) are intentionally designed with connectors from within the same manufacturer's series, for example, but with differing pin counts to prevent improper stacking (for example, a polarized stacking interconnect) and to provide visual clues as to proper board orientation during attachments.

In some embodiments (for example, in some embodiments of platforms 500 and/or 600), individual boards and modules can use mating male and female connectors with full pass-through design and a variable connector height appropriate to local circuitry on each board. This can allow boards to be stacked in any order without worrying about physical collision of components. In some embodiments, stacking connector pin-outs are agnostic to each board's function, allowing stacking of varying compute, connectivity, and sense modules as well as base systems and shields, without regard to function or order. In some embodiments, side-by-side module stacking board designs allow modules to be stacked sideways (that is, not only in the Z-direction, but also in the X-direction and Y-direction, or a combination thereof). In some embodiments, connectors are used (for example, connectors are included in platforms 500 and 600) so that connections can be made in only a certain manner (for example, using two sided modules and stacking connectors). For example, in some embodiments, connector mating is used in which two-sided modules with stacking connectors on both sides of a board (for example, both sides of a printed circuit board) allow additional modules to be stacked (for example, to be stacked above and below) within the platform (or system). For example, connector mating may be used so that other boards, modules, etc. cannot be inserted incorrectly. In this manner, platforms 500 and 600 can include a modular hardware design allowing developers to plug and play components (such as modules) from different manufacturers to support IoT edge usage models. Plug and play modules may be implemented in accordance with some embodiments to allow different developers and manufacturers to easily switch between different module devices. This can allow, for example, interchanging compute solutions, power solutions, radio solutions, and/or sensor solutions, among others. As described herein, various modules (such as compute modules, connectivity modules, sensor modules, power modules, etc.) can be designed to be attached to a corresponding base board (and/or more than one module and/or more than one type of module can be attached to a base board).

In some embodiments, optimal signal distance and coverage can be achieved by orienting individual module locations along base board edges. When radio modules with radio frequency (RF) antennas are populated onto these module locations, their RF antennas are naturally rotated toward edges of the base board and away from each other. Multiple radio modules can therefore be populated simultaneously on the base board with less RF interference since the module orientation makes the RF antennas physically as far away from each other as possible. Keepouts (placement and routing) along the base board edges not only provide the best RF performance for the RF antenna, but are also easier to achieve on the based board design than a keepout in the center of the base board. In some embodiments, in some smaller stacked configurations, RF antenna keepouts may be maintained on all modules, including modules that are not themselves radio modules. This can provide a vertical keepout zone above and below a radio module's RF antennas, allowing these radio modules to sit anywhere in the stack with the least impact to their RF antenna.

In some embodiments, software can be implemented in conjunction with modular systems and/or platforms (such as, for example, platform 500 or platform 600). For example, in some embodiments, when a module is plugged into the platform, the software instantly wants to know the type of module being plugged in. For example, the software can determine that a sensor module plugged into the platform is a temperature sensor. In response, a library of temperature sensors is accessed to determine which temperature sensor is being plugged in, and the software can also calibrate the newly plugged in temperature sensor on the fly. The firmware can be fed back and flashed, for example.

Due to low-power and rapid real-time execution requirements placed on microcontroller (for example, MCU) based deep-embedded firmware, some development teams may build highly tuned and customized firmware stacks that end up as point-solutions that cannot easily and quickly be reused on other MCUs with differing CPU architectures, for example. In order to address a lack of portability and reusability across MCU architectures, for example, in some embodiments, hardware, firmware, and/or software architecture can employ a data manager (and/or intelligent data router) that can run on a target MCU's application space.

In some embodiments, a platform such as, for example, platform 500 illustrated in FIG. 5A and/or FIG. 5B, and/or platform 600 illustrated in FIG. 6A and/or FIG. 6B, a large number of possible building blocks may be used to stack on an architecture which may be used, for example, for IoT edge device implementations. In some embodiments, the platform may be arranged in such a way that signals may be passed through and not shorted (for example, passed through between various boards and/or between various modules in the platform). For example, the signals may be passed through in a way such that they mean something and the signals will always be communication signals regardless of where the modules are placed. That is, in some embodiments, the platform is arranged so that the modules of the stack are not able to be stacked incorrectly, and correct signaling may be maintained. In some embodiments, any number of sensors (for example, sensor modules or sensor nodes) may be used in a platform stack. In addition, the platform stack is implemented in a manner that a manufacturer can add it's module to the stack and add it as part of the ecosystem. In some embodiments, the platforms may be battery powered, solar powered, and/or wall powered. In some embodiments, shields and/or hanging cables (or dongles) may be included.

In some embodiments, the platform is interchangeable and/or expandable. In some embodiments, the platforms may be used so that various manufacturers can plug their module into the platform stack in a manner that is similar to plugging in a Lego block module into the platform (for example, plugging in one or more modules including one or more sensor module, one or more compute module, one or more connectivity module, and/or one or more power module, etc.) The platform can provide this functionality based on mechanical and signal structures as illustrated and/or described herein. In addition, in some embodiments, over the air upgrades may be provided to any of the modules in the platform in a manner such that the correct upgrade is received by the correct module in the platform. This may be accomplished for example, without a need to update a compute module via a compute path, a radio module (or connectivity module) via the radio path (or connectivity path), etc. Upgrades may be made via radio, via wireless, via wired, via USB, and/or via other options, for example.

In some embodiments, platforms 500 and/or 600 can be included in a wireless sensor network (WSN). In some embodiments, platforms 500 and/or 600 can be included in a wired network. Platforms 500 and/or 600 can be used to connect previously unconnected solutions such as, for example, compute solutions, sensor solutions, connectivity solutions, power solutions, etc. They provide a platform that is simple for sensor companies, for example, to make products that are easy to connect to the platform. Customers can then try various solutions to put together configurations in platform stacks that meet their needs (for example, whether their needs are agricultural, retail, industrial, automotive, etc., among others). Once they feel comfortable with the stack-up, they can then go to a high volume manufacturing version of the platform (for example, using platform 500 and/or 600, and then finalizing the arrangement and putting everything on one board for higher volume production).

Figure 7:
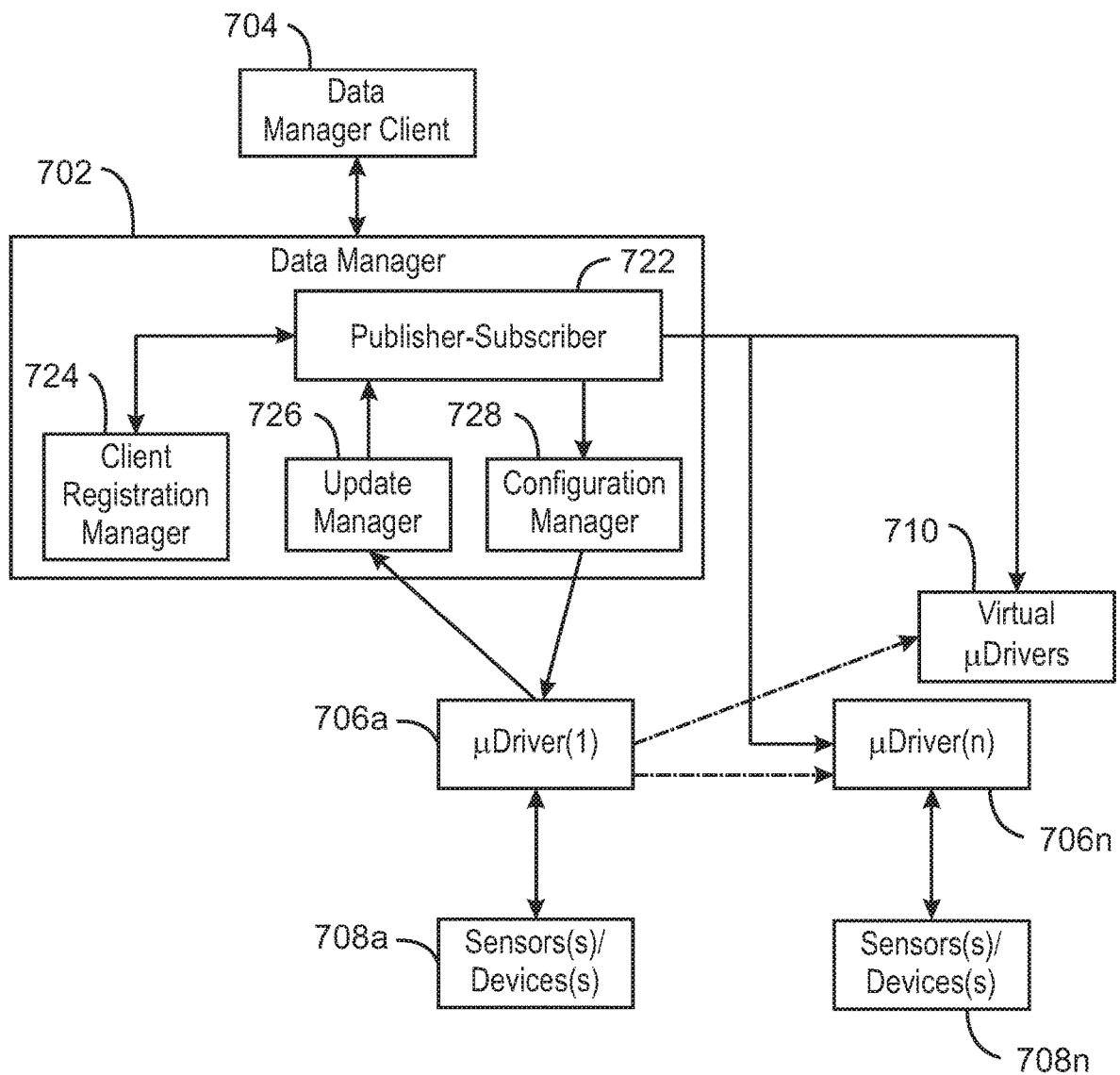
FIG. 7 illustrates a system in accordance with some embodiments.

FIG. 7 illustrates a system 700 in accordance with some embodiments. System 700 can include a configurable architecture that can be hardware, software, and/or firmware based. The configurable architecture can be implemented in a flexible and modular system (for example, within an IoT system, platform 500, and/or 600). In some embodiments, system 700 can be included in any of the devices in any of the IoT environments of FIGS. 1-4. In some embodiments, system 700 can include deep-embedded firmware (for example, for an IoT system). System 700 includes a data manager 702, a data manager client 704, a plurality of µdrivers (micro drivers or micro-drivers) 706a, ..., 706n, a plurality of sensor(s) and/or device(s) 708a, ..., 708n, and one or more virtual µdrivers 710. In some embodiments, data manager client 704 can include one or more applications (one or more apps) such as software applications. In some embodiments, data manager 702 includes a publisher-subscriber (pub-sub) 722, a client registration manager (CRM) 724, an update manager 726, and a configuration manager (config. manager) 728. In some embodiments, data manager 702 can be a data router. In some embodiments, data manager 702 can be an intelligent data router (IDR).

In some embodiments, FIG. 7 illustrates dataflow, providing an example of how components interface with the data manager 702 (and/or intelligent data router or IDR 702) to exchange data throughout a stack (for example, throughout a software stack, and/or throughout a firmware stack). Data manager 702 can provide a mechanism for various clients (such as, for example, accelerometer micro-drivers, control switch drivers, environmental sensing algorithms, etc.) to register with the data manager as a valid plug-in, request host system resources, publish data/events to one or more clients, receive event notifications about previously subscribed events/data, and/or execute tasks (for example, execute routine tasks), among other functions. Clients of data manager 702 can be component plug-in modules or component pluggable modules (CPMs). The component pluggable modules can all have unique identifiers (unique ID) which can be a type of credential allowing it to interact with the data manager 702.

The publisher-subscriber 722 can also be referred to as providing publisher-subscriber services, and/or as a publisher-subscriber router. Publisher-subscriber 722 can provide an interface for µdrivers, virtual µdrivers, and applications, for example, to publish data and/or events, and receive notification about availability of previously subscribed data and/or events. The publisher-subscriber 722 can route data between clients that publish data and data manager clients that have previously subscribed to the data being published. Publisher-subscriber 722 can update one or more µdrivers (for example, one or more of µdrivers 706a, ..., 706n, and/or virtual µdrivers 710) due to, for example, data/event availability. Component pluggable modules (CPMs) can register with the client registration manager (CRM) 724 to receive other CPM data output updates and/or events, etc.

One or more of µdrivers 706a, ..., 706n can be coupled to one or more of sensor(s)/device(s) 708a, ..., 708n using an interconnect such as, for example, I2C, SPI, UART, SPI, USB, GPIO, among others. The µdrivers (for example, one or more of µdrivers 706a, ..., 706n, and/or virtual µdrivers 710) can share data with other µdrivers or virtual µdrivers using a publication-subscriber mechanism (for example, using publisher-subscriber 722). The shared info can be a simple event signal or a message buffer, for example. The µdrivers (for example, µdrivers 706a, ..., 706n) can be drivers that are tied to physical devices (for example, tied to sensor(s)/device(s) 708a, ..., 708n). The virtual µdrivers (for example, one or more µdrivers 710) can be drivers that are not tied to physical devices (for example, a block that generates metadata).

Although the client registration manager (CRM) 724 is illustrated as being separate from the publisher-subscriber 722, it is noted that in some embodiments, the client registration manager (CRM) 724 may be included in the publisher-subscriber 722. Client registration module (CRM) 724 can be responsible for validating that each component plug-in module (CPM) is a legitimate and interface compliant module.

Configuration manager 728 can provide for one or more data manager clients 704 (or in some embodiments, one or more data/event subscribers) to configure a behavior of the data manager 702, or another data manager client (for example, one or more data manager client 704), or one or more data/event publisher. In some embodiments, configuration manager 728 configures µdrivers (for example, one or more of µdrivers 706a, ..., 706n, and/or virtual µdrivers 710) at runtime.

Update manager 726 can receive one or more event/data push from µdrivers (for example, from one or more of µdrivers 706a, ..., 706n, and/or virtual µdrivers 710). Update manager 726 can serialize data and notify the publisher-subscriber 722 about data/event availability. Update manager 726 can provide one or more data manager client 704 (or data/event publisher) with an ability to broadcast its data to subscribers (or data manager clients) that want to be alerted when new data is available from a specific publisher. The update manager 726 may not be responsible for notifying the subscribing client, but may be responsible for conditioning the published data based on subscriber pre-selected data filter options. The update manager 726 can support a few canned filters, for example, but a system integrator can connect a user-defined data filter to one or more streams being routed through the data manager 702.

In some embodiments, data manager client 704 (and/or one or more applications within data manager client 704) can be things such as, for example, clients (or apps) that subscribe to data in the data manager 702. Data manager 702 does not need to know anything about the data contents, but can obtain data and route the data to devices that ask for it. This data can be routed by data manager 702 at a rate at which it is being asked. Device drivers (such as for example, microdrivers 706a, ..., 706n, virtual microdrivers 710, etc.)

can be viewed as points of data being generated by a data source (for example, by a physical device, by a virtual driver, etc.) Data manager 702 can send the data to the physical world, and/or build something (for example, build something on a module such as a compute module). For example, in some embodiments, a device such as a smart light (and/or smart light application) may be built. Data may be obtained by data manager 702 by multiple data providers at whatever rate is being subscribed to that data and then computes, massages the data, and/or uses the data to drive a light, for example, based on what is learned from the data. Although a smart light example has been mentioned, it is noted that the system is generic, and anything may be built upon the system. In an embodiment where a library has been built (for example, for a customer) data manager client 704 (and/or apps) may be users of the framework (for example, to build new functions on top of the system framework).

In some example embodiments, data manager client 704 (and/or an application within data manager client 704) can perform functionality such as adjusting light intensity in a room (and/or adjust a tint of one or more windows) based on ambient light conditions coming in from the outside. The data manager client 704 (or app) might subscribe, for example, to a time of day, and/or to a physical device such as an ambient light sensor and/or an infrared sensor, and obtain the data (for example, obtain the data over a wifi network or over some other network). Any time a change in any of the data occurs, the sensors (for example, one or more of sensor(s)/device(s) 708*a*, . . . , 708*n*) can generate an interrupt and a driver such as a a micro-driver (for example, one or more of micro-drivers 706*a*, . . . , 706*n*) can process the data. In this manner, when a sensor detects an event (for example, due to a threshold crossing) the micro-driver tied to the sensor can process the data and push an event (for example, push an event through the update manager 726) to the data manager 702. The data manager knows who is subscribing to that data, and can then feed the data to the correct data client manager 726 and/or application that is subscribing to the data. Multiple data sources (for example, time of day, infrared sensor, and ambient light sensor) can all signal the app, and the app can aggregate the information and make a decision based on, for example, the particular application. The application developer does not need to know how any of the sensors work, and does not need to spend time figuring out how to write a driver for the device. The data manager client (and/or app) only needs to know what piece of data it is looking for. Components may be plugged into the system (for example, components and/or modules of system 700, 500 and/or 600) in a manner that is consistent with the interface. The driver can exist in a microcontroller (for example, an MCU) as a library in a module, and everything can be plugged in and work together without additional requirements of the app (additional requirements such as building a driver, knowing how the sensors work, how the driver is being stitched in, what registers to write to, etc.) The data manager client and/or app can just request particular data, and the data is provided to the data manager client and/or app when it becomes available. The data manager 702 may notify the data manager client (and/or app) when the data is available, and the data manager client (and/or app) can generate new data or perform a task, etc. (for example, the data manager client and/or app can adjust lighting and/or adjust tint on one or more window in some example embodiments).

It is noted that the architecture of system 700 is flexible, and many embodiments are possible. Embodiments of system 700 are not limited to the particular arrangement of elements in FIG. 7. In system 700, data manager client 704 and/or an app can connect to drivers and/or sensors in various manners (for example, depending on how the data client manager 704 and/or app subscribes to the information). For example, the publisher-subscriber 722 can work with the configuration manager 728 to configure a micro-driver to behave a certain way. When data is available, the micro-driver can push an event and/or data (for example, to the update manager 726) via the pub-sub 722. The pub-sub 722 can determine whether to provide data to the data client manager 704 and/or app, how many copies to create, passes it down to one or more other micro-driver (for example, micro-driver 706*n*) and/or passes it down to one or more virtual driver (for example, one or more virtual micro-drivers 710), etc. In this manner, FIG. 7 can illustrate an implementation where data is obtained from sensor(s)/device(s) 708*a* via micro-driver 706*a* through update manager 726, and can be provided by pub-sub 722, for example, based on subscription status, to data client manager 704 (and/or one or more apps), micro-driver 706*n*, and/or virtual micro-driver(s) 710, for example. Other implementations are possible (for example, depending on particular embodiments based on who is publishing and who is subscribing).

System 700 allows, based on various interfaces, developers to run independently of each other. If one device or app developer publishes it's interface to another app or device, a developer can bring in an app and work together with the device or app developer, for example. In some embodiments, data manager 702 can use a hardware, software, and/or firmware architecture. Data manager 702 can be included in an MCU and/or in a compute module. Data manager 702 can be included in any of the modules of system 500 and/or system 600, for example. Data manager 702 can run in a target MCU's application space. This can provide portability and reusability across MCU architectures, for example.

Data manager 702 (for example, an intelligent data router or IDR) can be designed to utilize characteristics of data payload traffic in determining its relationship with other components in a system (for example, with other firmware components in an embedded system). In some embodiments, the system is made to be loosely-coupled and easy to dynamically bind other firmware components to the system without comprehending their internal structure, for example. A module (for example, such as a BLE module) can push data to a human presence detection algorithm, for example, without knowing what routines within the driver are required to properly obtain data from the module.

Data manager 702 (for example, an intelligent data router or IDR) can be built in a manner such that firmware components in an embedded system can address factors such as datatype agnostic information exchange, component session ID, and/or a component task execution trigger, for example, in order to efficiently run while maintaining portability and ease of reuse. Data manager 702 can be agnostic to the contents of the component's data inputs, where the data buffer contains routing information, for example. In this manner, information may be digested by a firmware component that has previously subscribed to the data. In some embodiments, a unique ID assigned to each data manager client component is all that is needed to send or receive any information via the data manager 702. In some embodiments, data manager 702 is MCU task scheduler agnostic, and it can support bare-metal MCU and real time operating system (RTOS) based task execution systems. Data manager 702 can be compatible with preemptive and non-pre-emptive firmware task schedulers.

In some embodiments, deep-embedded firmware component integration (for example, control coupling), where components are tightly bound, and require deep knowledge of the firmware component interfaces and careful decoupling to adapt to various other features/capabilities are not necessary. In some embodiments, an architecture such as a firmware architecture may be used that provides a firmware framework that can interconnect independently developed deep-embedded firmware components without having an intricate knowledge of the inner workings of those components.

In some embodiments, a data manager or intelligent data router (for example, such as data manger 702) can act as an intelligent data broker responsible for routing data payloads between firmware components. The data broker can allow firmware components to exchange information with each other without constructs (for example, without "C" function calls) of the data originating firmware component being embedded into the data destination firmware component. This can make the system loosely data coupled, for example. This flexibility can provide a developer or system integrator with an ability to rapidly create deep-embedded firmware solutions using new firmware components (for example, firmware developed for a current project), pre-existing firmware components, and/or third party developed firmware components.

In some embodiments, a flexible, loosely coupled firmware module framework may be implemented. Firmware components developed by distributed development teams may be integrated together (for example, may be glued together), which can significantly reduce code development and integration time, for example. In some embodiments, the architecture can be very easy to scale, thereby supporting low-end systems such as bare-metal MCU designs as well as other designs, including high-end MCU-based embedded systems that utilize a real time operating system (RTOS). In some embodiments, plug and play building blocks support easy visual firmware programming using basic firmware development IDE (integrated development environment) plug-ins (for example, such as Eclipse plug-ins). Easy dragging and dropping of firmware components may be implemented to create firmware images using a graphical user interface (GUI) without having to write glue code.

In some embodiments, a firmware stack (or software stack) such as, for example, a stack implementing features of system 700 and/or data manager 702, may be compatible with both RTOS and bare-metal MCU-based embedded systems, and can be interchangeable between RTOS and bare-metal MCU-based embedded systems. The firmware stack can be an application layer firmware stack that is designed to integrate seamlessly into systems running embedded real-time operating systems or systems running bare-metal control loops. The stack can include firmware components, interfaces, and development tools necessary for rapid development of deep-embedded firmware based systems. The firmware stack components can pull data from diverse sources in a timely manner, can refine the data, and can push the data to either intra-framework client consumers or external consumers via a data manager (for example, such as data manager 702). IDE development tools can provide an environment where disparate firmware components can be stitched together without deep knowledge of their internal constructs. The firmware stack can include, for example, a data manager (or intelligent data router) such as data manager 702, and additionally can include one or more application modules, one or more power management module, and/or one or more wired and/or wireless application network protocol adapter, for example.

Each block that plugs into a data manager, data router, or intelligent data router (for example, such as data manager 702) can be a component plug-in module (also referred to as component pluggable module or CPM). For the data manager 702 (or data router or IDR) to function, a predetermined contract between the modules can be put into place. A descriptor table can be used to define a framework for a CPM in accordance with some embodiments. Headers and other codes, tables, etc. can be used, for example, to determine the identity of a module, how data of that module can be routed, requirements on how to route the data of that module, location of the module resources, etc. For example, any of the sensors in FIG. 7, the data manager client 704, and/or any apps in data manager client 704 can use CPMs as a wrapper or an interface in accordance with some embodiments. For example, CPMs can be used as a wrapper or interface to allow a device, app, or driver, etc. to plug into a data manager, data router, or IDR, etc. such as data manager 702.

Figure 8:
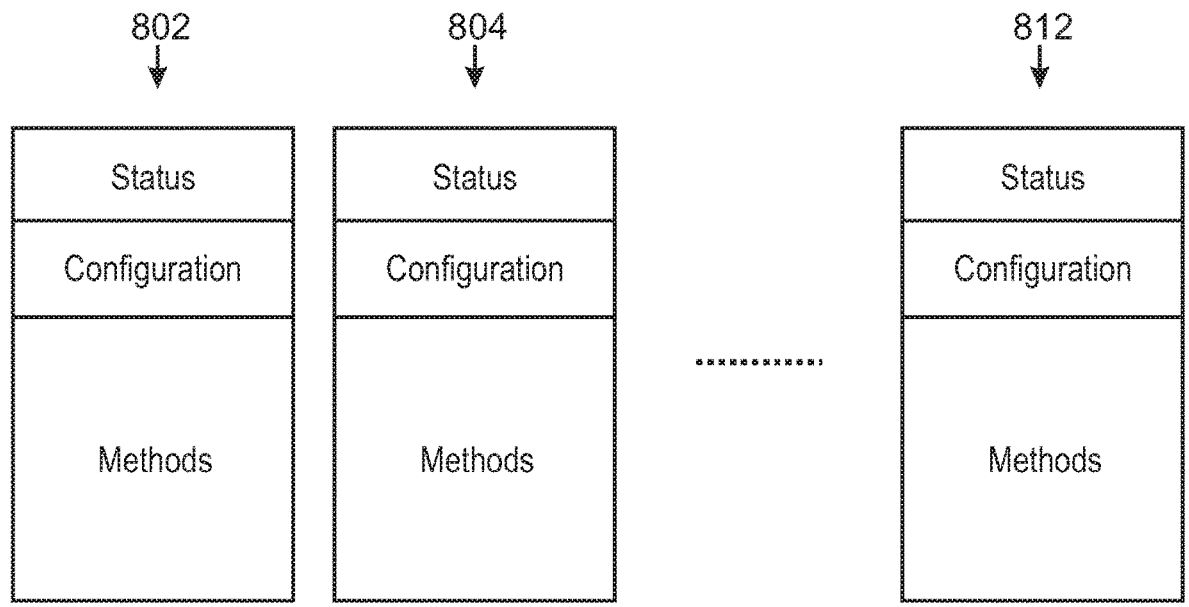
FIG. 8 illustrates component plug-in modules (CPMs) in accordance with some embodiments.

FIG. 8 illustrates component plug-in modules (CPMs) 800 (also referred to as component pluggable modules) in accordance with some embodiments. FIG. 8 illustrates three CPMs 802, 804 and 812, but any number of CPMs may be implemented in accordance with some embodiments. Each of the CPMs may be configurable via techniques such as FDK (function development kit) or via WSN (wireless sensor network) update, for example. Each of the CPMs 802, 804, . . . , 812 can be identified by a unique component identifier (for example, "APPID"). The unique component identifier can be identified by a unique 16-bit component identifier, for example. For example, in some embodiments, CPM 802 may be identified with a Function ID=1, CPM 804 may be identified with a Function ID=2, other intermediary CPMs between CPM 804 and 812 can be identified with other Function IDs, and CPM 812 may be identified with a Function ID=n, for example. In some embodiments, each of the CPMs may include parameters such as status (for example, status variables), configuration (for example, configuration variables), and methods. The status parameters in the CPMs may include a read only parameter list contain a module's state information. It can be mostly shared using the framework's intertask communication mechanisms (for example, with no fixed format). The status parameters can be status variables that indicate a current state of the CPM. The configuration parameters in the CPMs may include a read/write list containing a module's configuration information (for example, information such as GPIO#, communication port ID, calibration/configuration tables, default states, WSN protocol IDs, etc.) The configuration parameters in the CPMs can determine runtime behavior of the CPM, and can be configured by another CPM or directly by the data manager (or IDR). The methods parameters in the CPMs may include a set of operations (private and public) that can be invoked during a module's operation. The methods in the CPMs can either satisfy the data manager (or IDR) plug-in requirements or perform an internal function.

Figure 9:
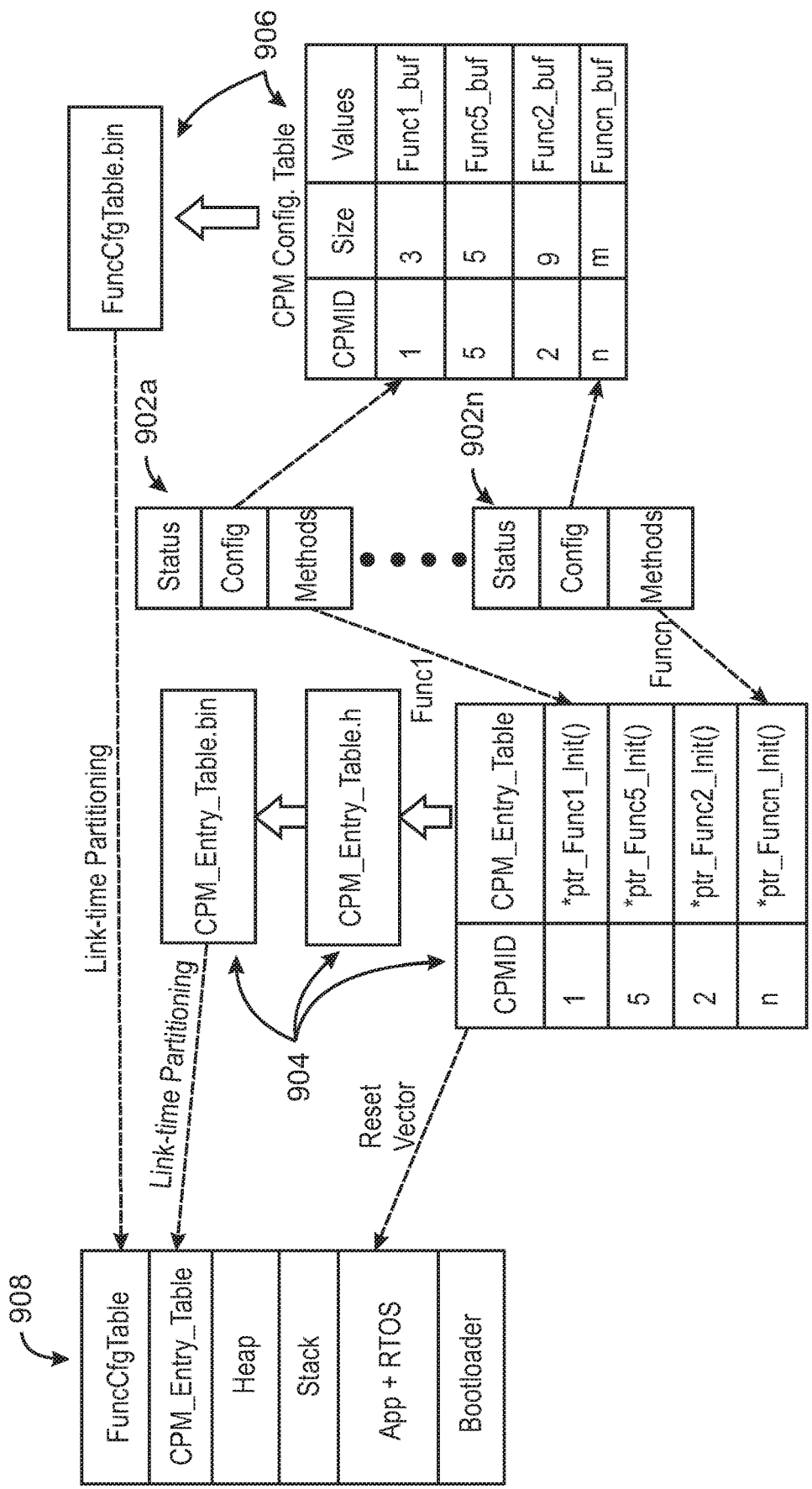
FIG. 9 illustrates a system in accordance with some embodiments.

FIG. 9 illustrates a system 900 in accordance with some embodiments. In some embodiments, system 900 is a component plug-in module (CPM) system. System 900 includes a plurality of component plug-in modules (CPMs) 902*a*, . . . , 902*n* (also referred to as component pluggable modules). Any number of CPMs 902 can be included in system 900 in accordance with some embodiments. In some embodiments, CPMs 902*a*, . . . , 902*n* can be similar to or the same as CPMs 802, 804, . . . , 812. System 900 also includes an entry function pointer table 904, a CPM configuration table 906, and an example device memory partitioning 908. It is noted that in some embodiments, entry order of the CPMID in the tables (for example, table 904 and table 906) is irrelevant and can be organized in any order.

In some embodiments, CPMs 902a, ..., 902n can each include status parameters (or status variables), configuration parameters (or configuration variables), and methods, which can be similar to the CPMs of FIG. 8, for example. Each CPM can link to a function pointer (for example, Func1, ..., Funcn) of entry function pointer table 904. In some embodiments, entry pointer function table 904 can include entry function pointers including a CPMID (for example, a 16 bit CPMID), and a CPM_Entry_Table storing entry function pointers, for example. The entry function pointers *ptr_Func1_Init( ), ..., *ptr_Funcn_Init( ), etc. point to a location in memory 908 where the CPMs code is located, for example. In some embodiments, memory 908 can include a function configuration table partition (FuncCfgTable), a CPM entry table partition (CPM_EntryTable), a heap partition, a stack partition, an application and real time operating system (App+RTOS) partition, and a bootloader partition. A configurator can generate a CPM_Entry_Table.h from table 904, and provide link-time partition to the CPM_Entry_Table partition in memory 908. In some embodiments, each CPM can link configuration parameters to the CPM configuration table 906. A configurator can generate FuncCfgTable.bin from table 906, and provide link-time partition to the FuncCfgTable partition of memory 908.

In some embodiments, a client registration manager (CRM) (such as, for example, CRM 724) uses a unique identification code (for example, 16-32 bits, depending on system configuration) such as a CPMID to uniquely identify each CPM (for example, each CPM 902a, ..., 902n), and allocates enough resources to properly execute the tasks of each CPM. The CRM can also rely on the CPM unique identifier (CPMID) to look up a CPM's entry pointer function (for example, *ptr_Func1_Init( ), ..., *ptr_Funcn_Init( ), etc.) stored in an entry function pointer table such as, for example, entry function pointer table 904. A CPM's entry pointer function can be responsible, for example, for completing a CPM plug-in process. The CRM can also use the CPM unique identifier (CPMID) to look up a CPM's runtime configuration data, and then can copy the configuration data to the target CPM during the CPM's initialization phase. System designers can use this configuration dataspace to store any information such as, for example, calibration, system runtime behavior configuration, etc. In addition to obtaining a unique CPMID, a CPM can also register a list of events with the CRM (for example, CRM 724) which can be used by a publisher-subscriber router (for example, by publisher-subscriber 722) to facilitate data exchange between CPMs. Combining the CPM entry function pointer of table 904, the CPM configuration table 906, and the CPM unique ID (CPMID) in this manner can provide a framework for a system designer to decouple a system's application code development phase from its runtime configuration phase. A CPM can thus be created and integrated into an embedded system at design time, or even after the system has been deployed.

Figure 10:
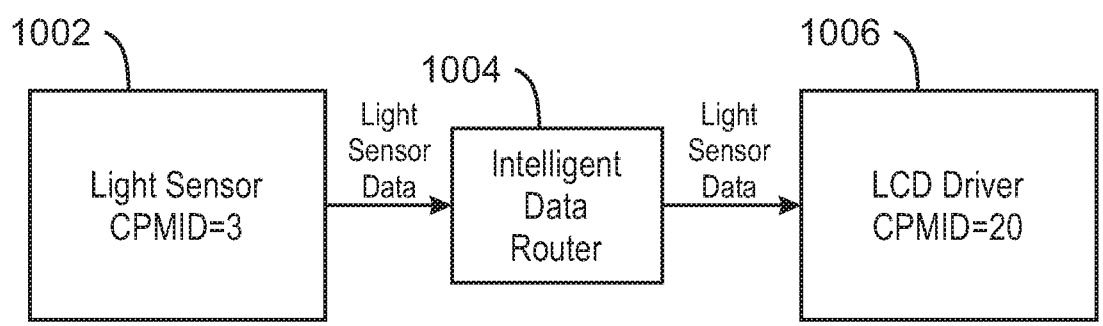
FIG. 10 illustrates a system in accordance with some embodiments.

FIG. 10 illustrates a system 1000 in which component plug-in module (CPM) to component plug-in module (CPM) data exchange (for example, such as event data exchange) can be implemented in accordance with some embodiments. System 1000 includes a light sensor CPM 1002, an intelligent data router (IDR) 1004, and a CPM 1006. In some embodiments, any of the CPMs in FIG. 10 can be the same or similar to other CPMs herein (for example, can be the same as or similar to any of CPMs 802, 804, ..., 812, 902a, ..., 902n, etc.) In some embodiments, CPM 1002 is a light sensor CPM (for example, with a CPMID=3). In some embodiments, intelligent data router 1004 is a data manager (such as, for example, data manager 702). In some embodiments, CPM 1006 is liquid crystal display (LCD) driver (for example, with a CPMID=20).

In some embodiments, system 1000 is an embedded system that wires up a light sensor (CPM 1002) that sends light sensor data to the IDR 1004. CPM 1006 can be a light sensor threshold event subscriber wired to the IDR 1004. Once the light sensor of CPM 1002 exceeds a threshold level, an event can be generated and sent to the IDR 1004. The IDR 1004 can then search its database of subscribers to see which CPMID has been mapped to the light threshold event. Valid subscriber CPM 1006 (an LCD driver with CPMID=20) can then be notified by the IDR 1004 of the light event from light sensor 1002.

Figure 11:
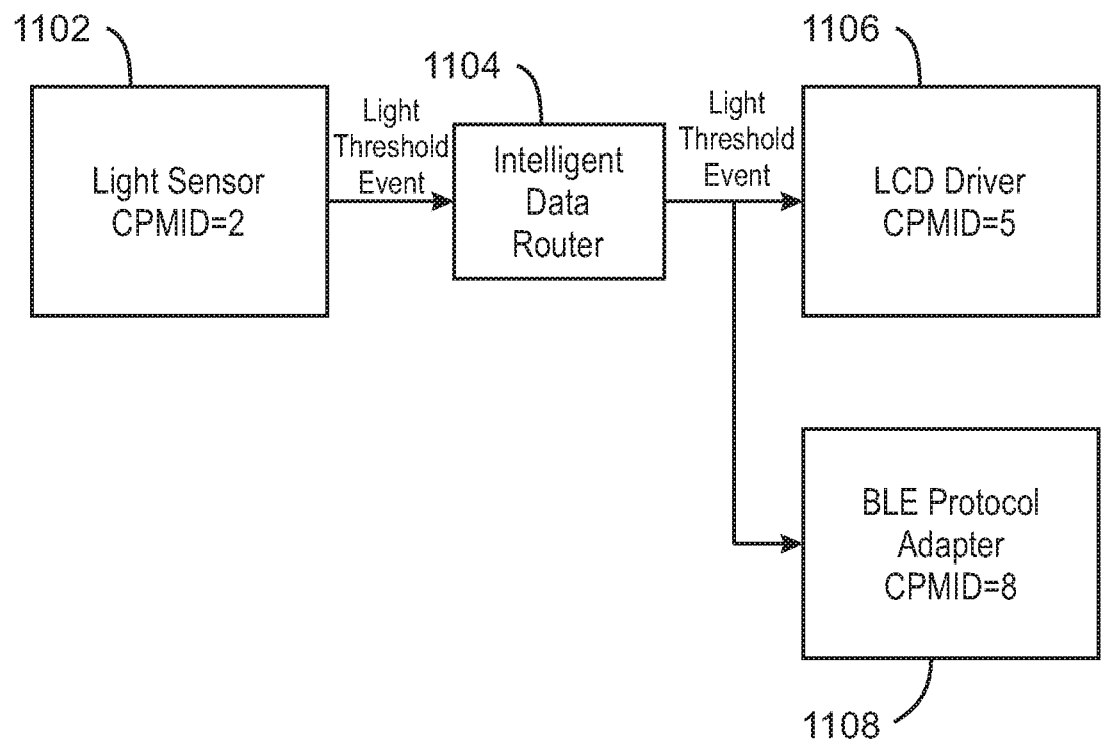
FIG. 11 illustrates a system in accordance with some embodiments.

FIG. 11 illustrates a system 1100 in which component plug-in module (CPM) to component plug-in module (CPM) data exchange (for example, such as event data exchange) can be implemented in accordance with some embodiments. In some embodiments, one CPM to two CPM data exchange (such as event data exchange) can be implemented in accordance with some embodiments. System 1100 includes a light sensor CPM 1102, an intelligent data router (IDR) 1104, a CPM 1106, and a CPM 1108. In some embodiments, any of the CPMs in FIG. 11 can be the same or similar to other CPMs herein (for example, can be the same as or similar to any of CPMs 802, 804, ..., 812, 902a, ..., 902n, 1002, 1006, etc.) In some embodiments, CPM 1102 is a light sensor CPM (for example, with a CPMID=2). In some embodiments, intelligent data router 1104 is a data manager (such as, for example, data manager 702). In some embodiments, CPM 1106 is liquid crystal display (LCD) driver (for example, with a CPMID=5). In some embodiments, CPM 1108 is a Bluetooth® low energy (BLE) protocol adapter (for example, with a CPMID=8).

In some embodiments, system 1100 is an embedded system that wires up a light sensor (CPM 1102) that sends a light threshold event to the IDR 1104. The system 1100 also wires up two light threshold event subscribers (CPM 1106 and CPM 1108) to the IDR 1104. Once the light sensor of CPM 1102 exceeds a threshold level, an event can be generated and sent to the IDR 1104. The IDR 1104 can then search its database of subscribers to see which CPMID has been mapped to the light threshold event. Valid subscribers CPM 1106 (an LCD driver with CPMID=5, and a BLE protocol adapter with a CPMID=8) can then be notified by the IDR 1104 of the light event from light sensor 1102.

Figure 12:
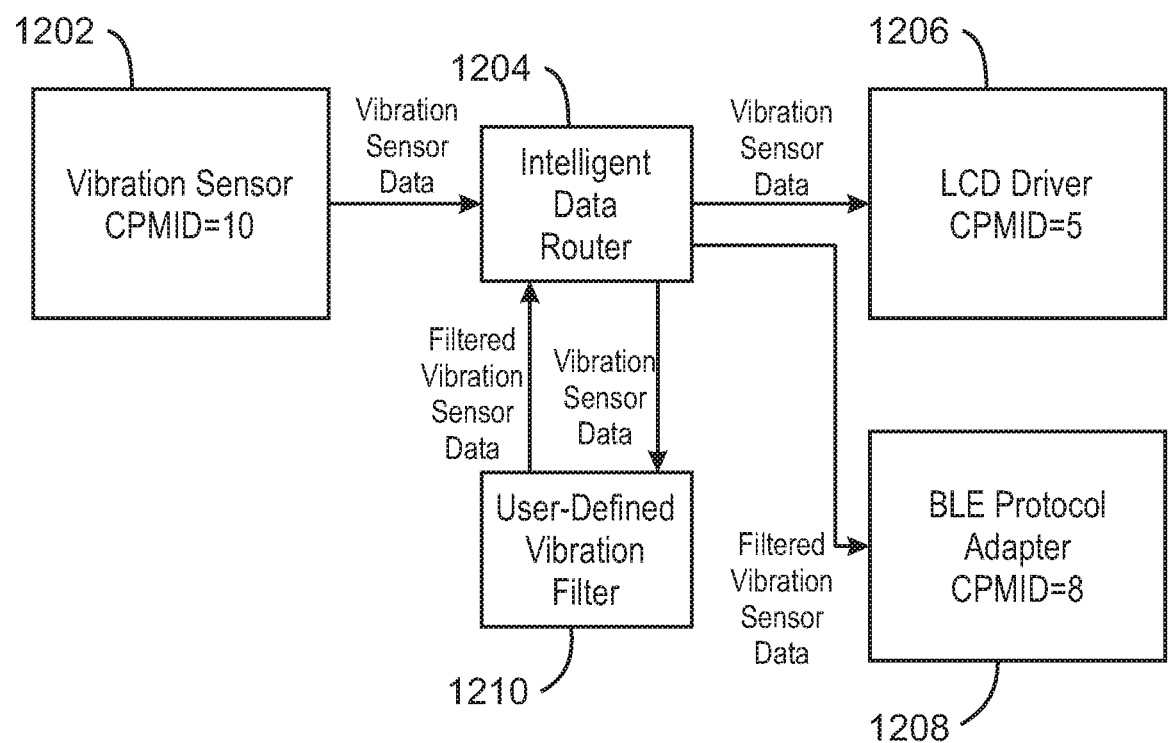
FIG. 12 illustrates a system in accordance with some embodiments.

FIG. 12 illustrates a system 1200 in which component plug-in module (CPM) to component plug-in module (CPM) data exchange (for example, such as event data exchange and/or filtered data exchange) can be implemented in accordance with some embodiments. In some embodiments, one CPM to two CPM data exchange (such as event data exchange), and/or filtered data exchange, can be implemented in accordance with some embodiments. System 1200 includes a light sensor CPM 1202, an intelligent data router (IDR) 1204, a CPM 1206, a CPM 1208, and a vibration filter 1210 (for example, a user-defined vibration filter 1210). In some embodiments, any of the CPMs in FIG. 12 can be the same or similar to other CPMs herein (for example, can be the same or similar to any of CPMs 802, 804, ..., 812, 902a, ..., 902n, 1002, 1006, 1102, 1106, 1108, etc.) In some embodiments, CPM 1202 is a vibration sensor CPM (for example, with a CPMID=10). In some embodiments, intelligent data router 1204 is a data manager (such as, for example, data manager 702). In some embodiments, CPM 1206 is liquid crystal display (LCD) driver (for example, with a CPMID=5). In some embodiments, CPM 1208 is Bluetooth® low energy (BLE) protocol adapter (for example, with a CPMID=8).

In some embodiments, system 1200 is an embedded system that wires up a vibration sensor (CPM 1202) that sends routes output vibration data readings to the IDR 1204. The IDR 1204 routes a copy of the vibration to an LCD driver CPM (for example, CPM 1206). The IDR also routes the output vibration data readings through a filter such as a user-defined vibration filter (for example, filter 1210), then routes the filtered sensor driver to a BLE protocol adapter (for example, CPM 1208) for transmission to an external host (such as, for example, to an IoT edge gateway).

Although various example systems with CPM event data exchange have been illustrated and described herein (for example, illustrated in FIGS. 10-12 and described herein) it is noted that many other systems may be implemented in accordance with some embodiments. Systems with CPM event data exchange in accordance with some embodiments is not limited to those illustrated in FIGS. 10-12 and described in reference to those drawings.

Some systems use base systems and shields, with a fixed, low pin-count set of connectors. Shield boards with varying functionality may be used that are powered from one or two connector pins (for example, a 3.3V connector pin or a 5V connector pin). Low pin-count connectors may provide a limited set of power interfaces, and the overall form factor may be too large for the sensor system. Separate power supplies that are on a different power domain from the main MCU may not be provided by the base systems, and an MCU swap may not be possible without completely swapping out the base system. In some embodiments, however, a modular system (for example, a modular IoT system such as a modular IoT edge system) can support swap-ability of a compute module (for example, of a main compute module, an MCU compute module, and/or a main MCU compute module), as well as connectivity modules and sensor modules.

Figure 13:
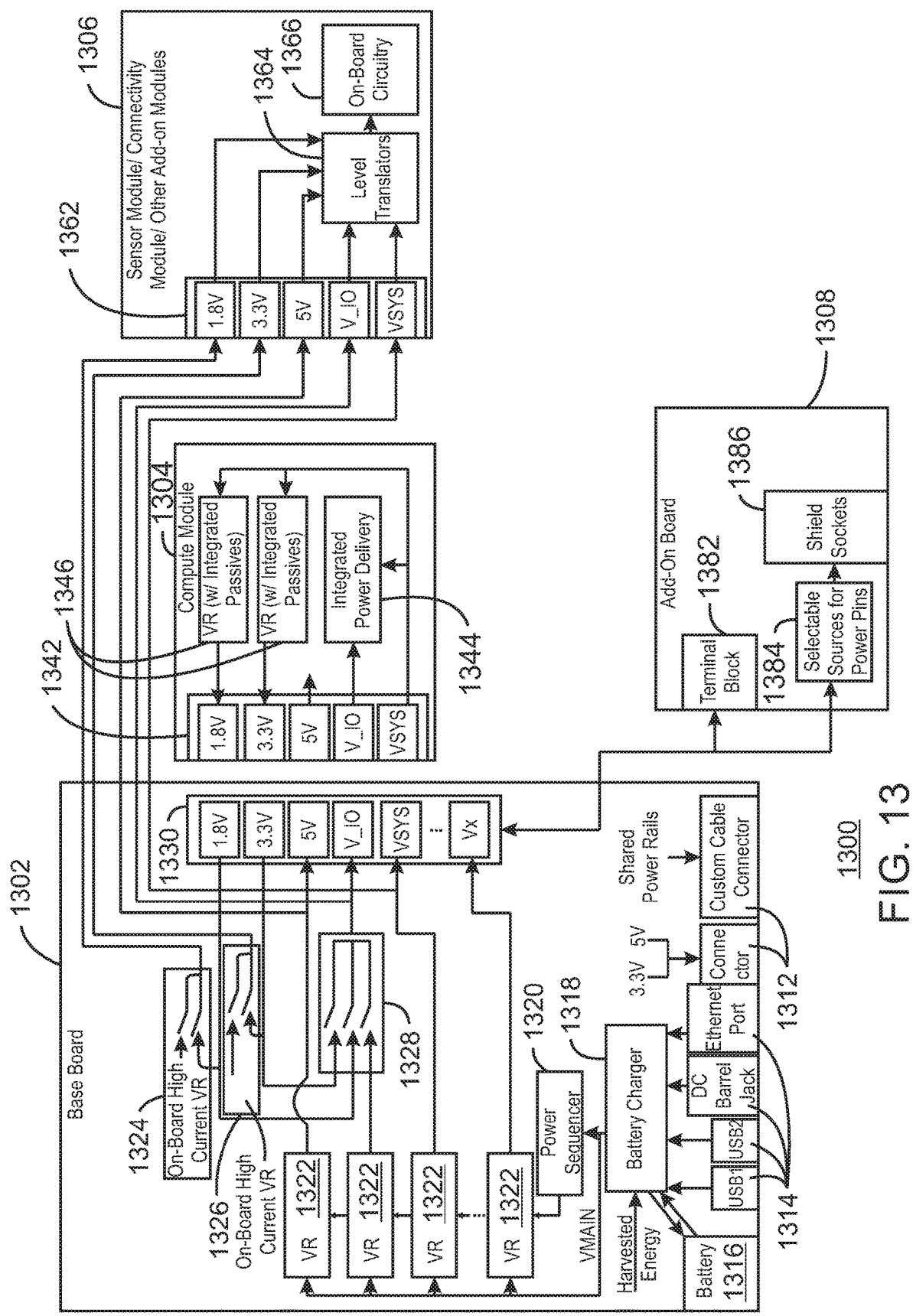
FIG. 13 illustrates a system in accordance with some embodiments.

FIG. 13 illustrates a system 1300 in accordance with some embodiments. In some embodiments, system 1300 can be provided in any other system illustrated and/or described herein. For example, in some embodiments, system 1300 can be included in the same system as system 500, system 600, and/or system 700, for example. In some embodiments, system 1300 can be included in any of the devices in any of the IoT environments of FIGS. 1-4. System 1300 may be a system that can provide power delivery for a modular system such as a modular IoT edge system. In some embodiments, system 1300 can be included in a modular system (for example, a modular IoT system such as a modular IoT edge system) that can support swap-ability of a compute module (for example, of a main compute module, an MCU compute module, a main MCU compute module, module 502, and/or module 602), as well as connectivity modules (for example, module 504 and/or module 604) and sensor modules (for example, module 510 and/or module 610). In some embodiments, power delivery can be agnostic of the attached modules. In some embodiments, flexibility can be provided using, for example, a multiple source power delivery path and control system with an appropriate power sequencing design to power the complete system (for example, the complete edge system). This can include, for example, a DC jack, USB ports, Power over Ethernet (PoE), energy harvesting, and/or multiple battery chemistries (for example, lithium ion, lithium polymer, alkaline, and others).

System 1300 can include a base board 1302, a compute module 1304, a module 1306 (for example, a sensor module 1306, a connectivity module 1306, and/or other add-on modules 1306), and one or more add-on board 1308 (for example, one or more stackable base add-on board 1308). System 1300 can provide MCU-agnostic power delivery that can be achieved through a self-contained integrated solution, leaving simplified and easy-to-use fixed rails at the connection with the base board and other modules.

Base board 1302 can include input ports 1312, which can include, for example, accessory connectors (for example, accessory cable connectors) such as a connector that can connect to 3.3V or 5V power rails, and/or a custom cable connector to which all shared power rails may be replicated (for example, for long distance cabling). Base board 1302 can also include output ports 1314 such as, for example, one or more USB ports, a DC barrel jack, and Ethernet port, etc. Base board 1302 can also include a battery 1316 (for example, a lithium polymer or LiPo battery, an alkaline battery etc.). Base board 1302 can additionally include a battery charger 1318 (for example, a power management device) that can be used to charge battery 1316. In some embodiments, battery charger 1318 can receive harvested energy (for example, using light, vibration, and/or other harvested energy methods). The harvested energy can be used to additionally charge battery 1316. Base board 1302 can also include a power sequencer (for example, a custom power sequencer) that can provide power sequencing to a plurality of voltage regulators 1322 (for example, any number of voltage regulators 1322 and/or high current voltage regulators 1322). Base board 1302 can also include a switch 1324, a switch 1326, a switch 1328, and one or more connectors 1330 (for example, one or more stacking connectors 1330). In some embodiments, one or more of the connectors 1330 can include connectors for voltage rails including a 1.8V rail, a 3.3V rail, a 5V rail, a V_IO (voltage input output) rail, a VSYS (system voltage) rail, additional voltage rails not illustrated in FIG. 13, and/or a Vx voltage rail, for example. In some embodiments, the 1.8V rail and the 3.3V rail of connector 1330 can serve as both an input port and an output port. In some embodiments, the 5V rail, the V_IO rail, the VSYS rail, . . . , and/or the Vx rail of connector 1330 can serve as an output port. It is noted that the base board 1302 can include more voltage regulators 1322 and connectors 1330 in a manner that is scalable and able to support more voltages and/or different voltages than the example voltages illustrated in FIG. 13.

In some embodiments, compute module can be one or more of module 502, module 602, one or more MCU compute modules, and/or one or more system on a module (SoM). Compute module 1304 can include one or more connectors 1342 (for example, one or more stacking connectors 1342 or one or more module side stacking connectors 1342). In some embodiments, some or all of the connectors 1342 can be coupled to a respective connector 1330. In some embodiments, one or more of the connectors 1342 can include connectors for voltage rails including a 1.8V rail, a 3.3V rail, a 5V rail, a V_IO (voltage input output) rail, and a VSYS (system voltage) rail, for example. Additional voltage rails not illustrated in FIG. 13 can be included in connectors 1342, for example. In some embodiments, the 1.8V rail and the 3.3V rail of connectors 1342 can serve as an output port. In some embodiments, the 5V rail, the V_IO rail, and/or the VSYS rail of connectors 1342, for example, can serve as an input port. Compute module 1304 can also include integrated power delivery circuitry 1344 and voltage regulators 1346 (for example, voltage regulators 1346 with integrated passives).

Module 1308 can include one or more connectors 1362 (for example, one or more stacking connectors 1362 or one or more module side stacking connectors 1362). In some embodiments, some or all of the connectors 1362 can be coupled to a respective connector 1330. In some embodiments, one or more of the connectors 1362 can include connectors for voltage rails including a 1.8V rail, a 3.3V rail, a 5V rail, a V_IO (voltage input output) rail, and a VSYS (system voltage) rail, for example. Additional voltage rails not illustrated in FIG. 13 can be included in connectors 1362, for example. In some embodiments, the 1.8V rail, the 5V rail, the V_IO rail, and/or the VSYS rail of connectors 1362, for example, can serve as an input port. Module 1308 can also include level translators 1364 and on-board circuitry 1366. Level translators 1364 can be level translators for voltage compatibility regardless of the sensor type being used, for example. Depending on need, each module 1306 (for example, each sensor module) can tap onto one or more of the available power rails.

One or more add-on boards 1308 can include a terminal block 1382, selectable sources 1384 for power pins, and shield sockets 1386. The one or more add-on boards 1308 can include additional add-on boards that can provide or tap into the power rails of connectors 1330.

Switch 1324 of base board 1302 can select an output from either an MCU-generated voltage regulator 1346 (for example, through the 1.8V power rails) or a higher current voltage regulator included on the base board 1302 (for example, one or the voltage regulators 1322 or another voltage regulator on base board 1302). Switch 1326 of base board 1302 can select an output from either an MCU-generated voltage regulator 1346 (for example, through the 3.3V power rails) or a higher current voltage regulator included on the base board 1302 (for example, one or the voltage regulators 1322 or another voltage regulator on base board 1302). Switch 1328 of base board 1302 can select an output from a first MCU-generated voltage regulator 1346 (for example, through the 1.8V power rails), from a second MCU-generated voltage regulator 1346 (for example, through the 3.3V power rails) or a higher current voltage regulator included on the base board 1302 (for example, one or the voltage regulators 1322 or another voltage regulator on base board 1302).

In some embodiments, one or more compute modules (for example, one or more of module 502, module 602, and/or module 1304) can be one or more MCU compute modules and/or can be one or more compute system on module (one or more compute SoM). The compute module(s) can have fully-integrated power-sequencing, can have voltage regulator solutions that can be standardized across all module designs, and/or can be transparent to the compute module being used in terms of power delivery solution from the base board (for example, from base board 1302, or from any of the boards or base boards illustrated in FIGS. 5A, 5B, 6A, and/or 6B, for example).

In some embodiments, flexible power delivery can be achieved by creating and using one or more compute modules (for example, module 1304) with integrated power supplies that may include passive components such as switching inductors and capacitors for on-chip voltage regulators, for example (for example, voltage regulators 1346 with integrated passives). In some embodiments, power sequencing circuitry may be included, which can be used to ensure that the power delivery subsystem is truly self-contained. Each compute module (for example, module 1304) may be treated as a black box with several common input and output voltage rails, which can enable a swappable MCU solution. As illustrated in FIG. 13, additional pins on various connectors (for example, various stacking connector systems) may be provided for other voltage rails that are not generated by the compute module. Having all voltage rails available to all modules on the stacking connectors allows each separate module to select and use a power supply simply by connecting to it. Having all voltages available to the various modules can also allow each separate module to use appropriate voltage level translators (for example, if required by the on-board circuitry).

In some embodiments, platform re-use can be implemented in a way to speed up design and keep development costs low, addressing continuously varying requirements, achieving economies of scale (for example, lower parts cost through higher volumes), and time to market. By providing power delivery across multiple stacking connector systems as illustrated in and described in reference to FIG. 13, for example, common platform power rails may be made available for a large number of modules. Such a modular platform can provide common, re-usable system ingredients, while addressing numerous different system needs (for example, numerous different IoT edge system needs). Common modules can also be key to re-use of software and firmware, which can further accelerate designs and reduce development costs.

In some embodiments, voltage rails illustrated in various connectors of FIG. 13 (for example, connectors 1330, 1342, and/or 1362) can include an I/O rail, a system rail, a 1.8V rail, a 3.3V rail, a 5V rail, etc., and can be scalable to include rails with additional and various voltage values. These voltage rails can include designated pins on modular stacking connectors, which can create a bridge between the module (for example, compute module 1304) and its base board or carrier board (for example, board 1302). The compute module (for example, module 1304) can be designed to be self-sufficient for its power needs, only tapping to the common rail pins assigned on the module stacking connectors and providing available voltage rails depending, for example, on its on-chip voltage integrators. The base board (for example, base board 1302) can be configured to supplement any rails that are not provided by the compute module, or provide high current rails needs and allow other stacking modules or base boards to feed from these rails. This can be implemented in a manner that is agnostic of the power capability of the compute module, for example.

For compute modules with multiple cores (for example, such as a compute module with higher power and lower power cores), the power delivery hardware can allow selection between the two cores (for example, for attached peripheral I/Os, and/or for granular power control on power sensitive systems).

In some embodiments, custom power sequencing may be implemented. For example, custom power sequencing may be implemented using a state machine programmed into small one-time programmable (OTP) devices to control startup times of multiple power supplies (for example, to avoid high in-rush load currents that can cause the main switching power supply to fold back, or get stuck in soft-start mode). Base boards of the system may be designed to support all the input-output (I/O) rails and provide for different voltage needs defined by the stacking connector pinouts, for example.

In some embodiments, all other stacked modules (for example, connectivity and sensor modules such as module 1306) also connect to the same modular stacking connector voltage rails as the compute module (for example, module 1304), and are designed to be self-sufficient within their own modules. In this manner, these modules (for example, module 1306) can rely on these shared common voltage rail pins on the stacking connectors, as needed. Selection of I/O voltage rails (for example, 1.8V or 3.3V) for the whole platform (or system) can also be mapped by simple user selection of I/O rail to the appropriate and available voltage rail.

In some embodiments, modularity, interoperability, and expandability of a platform or system may be achieved using simultaneous stacking connector systems that are all within the same platform or system. Stacking connector pinouts for power delivery can be agnostic to the function of each board or module, allowing stacking of varying compute, connectivity, and sensing modules, for example, as well as whole base systems and accessory boards (or shield boards), without regard to function or stacking order. This may be accomplished, for example, using a full pass-through pin-out design for each individual mating connector so that boards may be stacked in any order. A variable height receptacle, where the height is appropriate to the local circuitry on each board, can allow boards to be stacked in any order without concern for physical collision of components.

In some embodiments, with a common base board stacking pinout, a base board (for example, base board 1302) can be used as a standalone system, or can be expanded using additional base boards plugged together using base board macro-stacking connectors. Voltage rails may be provided in all stacking connectors throughout the system using a full pass-through pinout design.

In some embodiments, pinouts for stackable designs can accommodate use of temporary testing and/or programming boards. This can allow, for example, connection of a bus analyzer in the modular stack that can be used to observe and debug in-system bus activities. The analyzer can then be removed without any consequence or remnant circuitry. For example, a USB-to-I2C protocol analyzer/adapter (for example, such as an Aardvark/Beagle 3.3V I/O tool) could be populated on an interposer with an appropriate modular pinout, allowing analysis (or sniffing) of 1.8V or 3.3V sensor modules. In some embodiments, for example, the power delivery system (for example, in system 1300) can support attachment of various engineering debugging tools.

Figure 14:
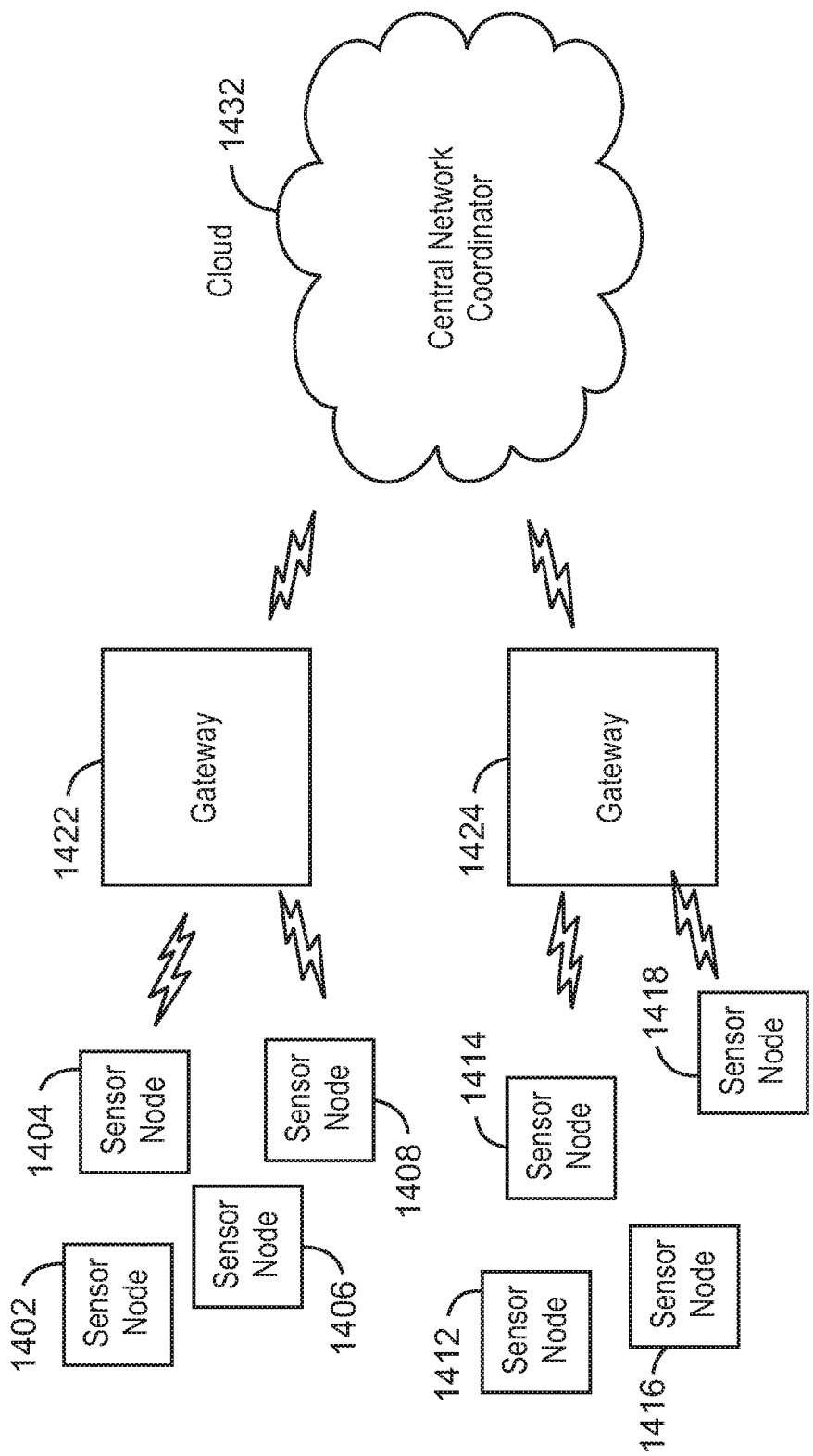
FIG. 14 illustrates a system in accordance with some embodiments.

FIG. 14 illustrates a system 1400 in accordance with some embodiments. In some embodiments, portions of system 1400 can include any other system illustrated and/or described herein. In some embodiments, system 1400 is an IoT system. In some embodiments, system 1400 can be included in any of the IoT environments of FIGS. 1-4. In some embodiments, system 1400 is a secure, extensible network for a flexible hardware edge system for the Internet of Things. In some embodiments, system 1400 is a secure, extensible network for the Internet of Things. For example, in some embodiments, system 1400 can include one or more of each of system 500, system 600, system 700, and/or system 1300, for example. System 1400 includes a plurality of sensor nodes such as, for example, sensor nodes 1402, 1404, 1406, 1408, 1412, 1414, 1416, and 1418. In some embodiments, any one or more of the sensor nodes in FIG. 14 can be the same as or similar to any of systems 500, 600, 700, or 1300, for example. In some embodiments, any one or more of the sensor nodes in system 1400 can be sensor edge devices or aggregation points in an IoT system, for example. In some embodiments, any of the systems illustrated and/or described herein (for example, any of the modular systems illustrated and/or described herein) can be sensor edge devices or aggregation points in system 1400. System 1400 can also include a gateway 1422 and a gateway 1404. System 1400 can also include a central network coordinator 1432 (for example, in some embodiments, in the cloud). In some embodiments, system 1400 can transfer data from an edge device (such as one or more of the sensor nodes 1402, 1404, 1406, 1408, 1412, 1414, 1416, and 1418) all the way up to a gateway (such as one or more of gateways 1422 and 1424) and to the cloud (for example, to central network coordinator 1432).

Although a specific number of sensor nodes, gateways, and central network coordinators are included in FIG. 14, it is noted that any number of sensor nodes, gateways, and even central network coordinators can be included in some embodiments. In some embodiments, sensor nodes 1402, 1404, 1406, and/or 1408 can communicate with gateway 1422 via wired or wireless communication. In some embodiments, sensor nodes 1412, 1414, 1416, and/or 1418 can communicate with gateway 1424 via wired or wireless communication. In some embodiments, gateway 1422 and/or gateway 1424 can communicate with central network coordinator 1432 via wired or wireless communication. In some embodiments, any of the wireless communication in system 1400 can include for example, Bluetooth® low energy (BLE), IEEE 802 communication such as IEEE 802.15.4, WiFi, etc. In some embodiments, any of the wireless communication in system 1400 can be secure wireless communication.

In some embodiments, system 1400 is a secure and extensible network. In some embodiments, system 1400 is a secure and extensible network for a reference edge/fog sensor kit for gathering data in the Internet of Things, for example. In some embodiments, system 1400 can provide a secure mechanism for remote sensor node attestation. In some embodiments, system 1400 can provide asset location tracking (for example, indoors and/or in a factory). In some embodiments, system 1400 is a loosely coupled heterogeneous wireless personal area network (WPAN) where distributed spatially located nodes (for example, sensor nodes 1402, 1404, 1406, 1408, 1412, 1414, 1416, and 1418) can be virtually managed as a seamless monolithic WPAN network.

In some embodiments, system 1400 is a secure network that implements digital signature technology, for example, that can deliver direct anonymous attestation and root of trust for sensor nodes, and can allow for secure provisioning and attestation of sensor nodes. In some embodiments, system 1400 is a network of gateways and sensor nodes that is coordinated by a cloud-based central network coordinator 1432. System 1400 can include location-aware network coordination which manages a network-provisioning-based wireless node's current and future location (for example, using location trajectory prediction). Automatic channel management can ensure that channels are managed effectively to maximize data throughput. Session management (for example, using node authentication, confidentiality, and/or authorization) can manage how sensors join, leave, and hop gateways. In some embodiments, orphan node recovery provides a mechanism to recover previously associated nodes that have recently become orphans.

In some embodiments, each sensor node (for example, each sensor node 1402, 1404, 1406, 1408, 1412, 1414, 1416, and 1418) can be provisioned with its own unique private key that can identify the sensor node as genuine and can provide secure identification and trust. In some embodiments, system 1400 includes a heterogeneous wireless network (for example, a heterogeneous WPAN) that can permit the sensor nodes (for example, sensor nodes 1402, 1404, 1406, 1408, 1412, 1414, 1416, and 1418) of various wireless protocols (for example, wireless protocols such as BLE, 802.15.4, etc.) to participate on the network. Upon power up, a sensor node (for example, one or more of sensor nodes 1402, 1404, 1406, 1408, 1412, 1414, 1416, and 1418) begins in a non-authenticated state and wirelessly beacons its presence. A gateway (for example, such as gateway 1422 and/or gateway 1424) can listen for sensor nodes waiting to join the network. Upon detection, the node is identified and a secure authentication process occurs. Authenticated sensor nodes can then join the network and receive configuration and operational parameters. Upon authentication and configuration, sensor nodes (for example, sensor nodes 1402, 1404, 1406, 1408, 1412, 1414, 1416, and/or 1418) can be permitted to transmit sensor data to the gateway (for example, to gateway 1422 and/or gateway 1424). Time-Division Multiplexing (TDM) may be used to efficiently manage wireless channels, maximize data throughput, and provide scalability for a large number of sensor nodes. In some embodiments, sensor data can be encrypted during transit between a sensor node (for example, one or more of sensor nodes 1402, 1404, 1406, 1408, 1412, 1414, 1416, and 1418) and the gateway (for example, gateway 1422 and/or gateway 1424). A central network coordinator (for example, central network coordinator 1432) can track location and telemetry data for each sensor node. The central network coordinator 1432 can manage each of the sensor nodes 1402, 1404, 1406, 1408, 1412, 1414, 1416, and 1418, and new nodes can be managed, provisioned, and decommissioned from the cloud. In some embodiments, session management can ensure a smooth transition as a sensor node moves from the location of one gateway to another (for example, between gateways 1422 and 1424). In some embodiments, one or more fault states can be detected and mitigated (for example, such as recovery of an orphaned sensor node, etc.)

Figure 15:
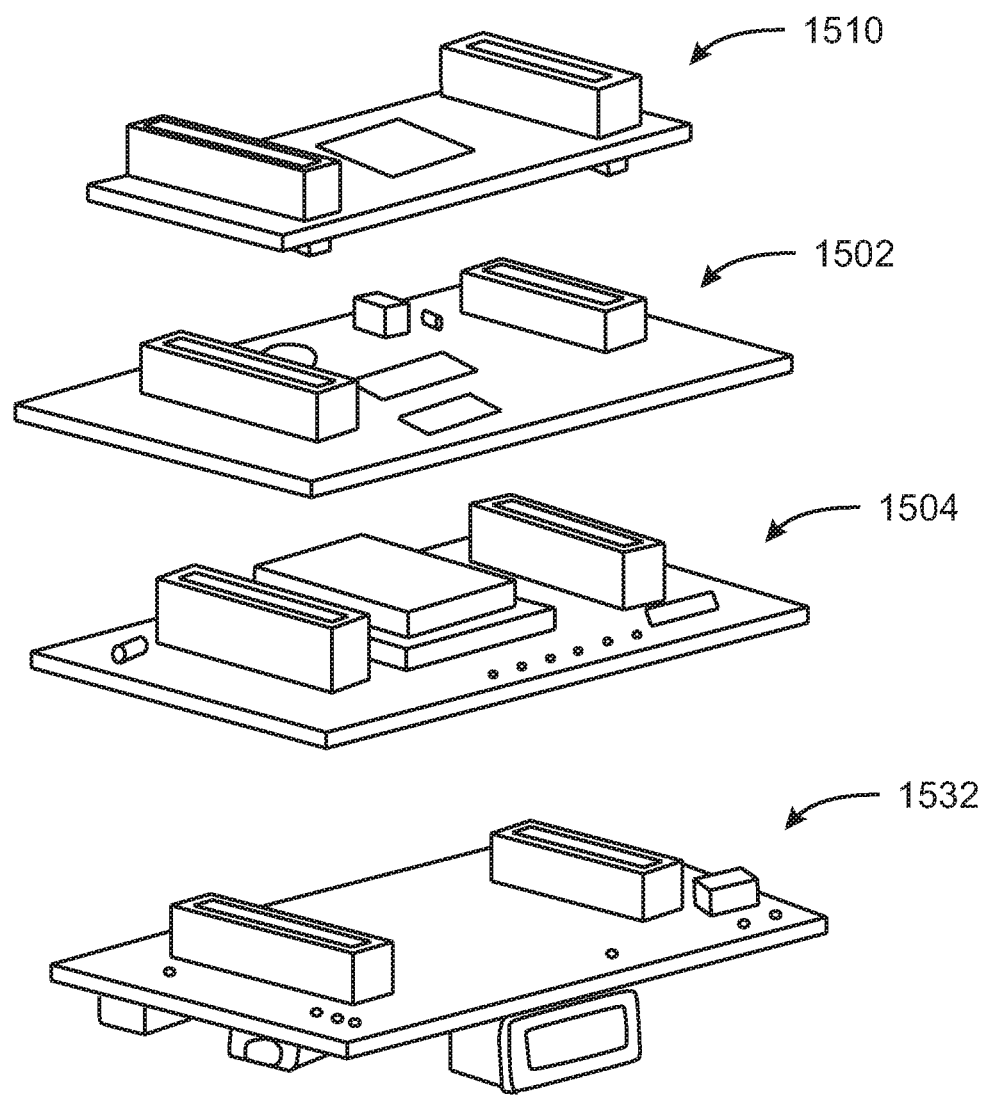
FIG. 15 illustrates a system in accordance with some embodiments.

FIG. 15 illustrates a platform 1500 (and/or a system 1500) in accordance with some embodiments. In some embodiments, any of the elements of platform 1500 can be the same as or similar to elements of system 500, system 600, system 700, system 1300, etc. In some embodiments, platform 1500 is a modular platform and/or a modular system. In some embodiments, platform 1500 is a wireless sensor platform. In some embodiments, platform 1500 is an IoT platform. In some embodiments, platform 1500 can be all or a portion of any of the devices in an IoT system. For example, in some embodiments, platform 1500 can be all or a portion of any of the devices in any of the IoT environments of FIGS. 1-4. In some embodiments, platform 1500 is an IoT sensor platform. In some embodiments, platform 1500 is an IoT sensor hub. Platform 1500 can include some or all of one or more compute module 1502, one or more connectivity module 1504, one or more sensor modules 1510, and one or more power module 1532. In some embodiments, connectors are used in platform 1500 in a manner similar to the connections made in platform 500, platform 600, platform 1300, etc. It is noted that while platform 1500 is referred to herein as a platform, it may also be referred to in some embodiments as a system 1500.

Similar to platforms 500 and 600 of FIGS. 5A, 5B, 6A, and/or 6B, platform 1500 of FIG. 15 is a flexible system of boards to enable interchangeability of modules such as, for example, one or more power modules, one or more connectivity modules, one or more compute modules, one or more sensor modules, etc. System 1500 is a modular, configurable sensor system that can include multiple MCU devices. In some embodiments, each of the modules and/or MCU devices, in FIG. 15 and other systems illustrated and described herein, can have its own on-chip flash memory, and all of the modules and/or MCU devices can be upgraded with new firmware. Due to the flexible nature of the system, multiple paths for flashing each of the modules and/or MCUs can be provided in accordance with some embodiments. In some embodiments, the system can be updated over-the-air (OTA). This can be more challenging when the edge modules/devices are in multiple wireless configurations, for example.

Some embodiments relate to a modular system that is both flexible in hardware and in a wireless network type (for example, star, tree, mesh, etc.) that requires multiple ways to provide firmware updates to the device. In some embodiments, the hardware can be intelligently designed to self-identify hardware in the stack, and match to the requisite firmware. Multiple OTA implementations may be necessary, and the necessary implementation may be self-identified before pushing out updates. In accordance with some embodiments, OTA updates and flashing to provide firmware updates may be implemented in flexible systems which may change hardware or implementation on the fly (for example, implemented in flexible systems as illustrated herein and/or described in reference thereto).

Flexible systems with changeable hardware or implementation as described herein may provide unique ways for updating the overall sensor system. The boards themselves may be designed with address-selectable electrically erasable programmable read only memories (EEPROMs) so that a current configuration can be determined by a records manager, for example, and an appropriate code may be automatically flashed locally. A wide variety of different configurations are possible in accordance with some embodiments, and since the presence of boards (or lack thereof) may require flexible updating arrangements both through hardware and over the air (OTA). Systems described herein can be aimed at rapid prototyping (for example, rapid prototyping of edge solutions) and can be designed to decrease time to market.

Some embodiments relate to flexible updating of a system, which can be complicated by the presence of multiple MCUs that are capable of swapping master/slave modes, for example. Intelligent flashing of appropriate code can be based on present boards to ensure that hardware and firmware matches. OTA update may be implemented in accordance with some embodiments handle multiple wireless network configurations (for example, multiple WPAN configurations). In some embodiments, a firmware update of an unreliable network may be implemented. For example, networks such as IoT networks, mesh networks, LoPAN, etc. are not highly reliable, providing challenges for updating over the air (OTA), for example.

Figure 16:
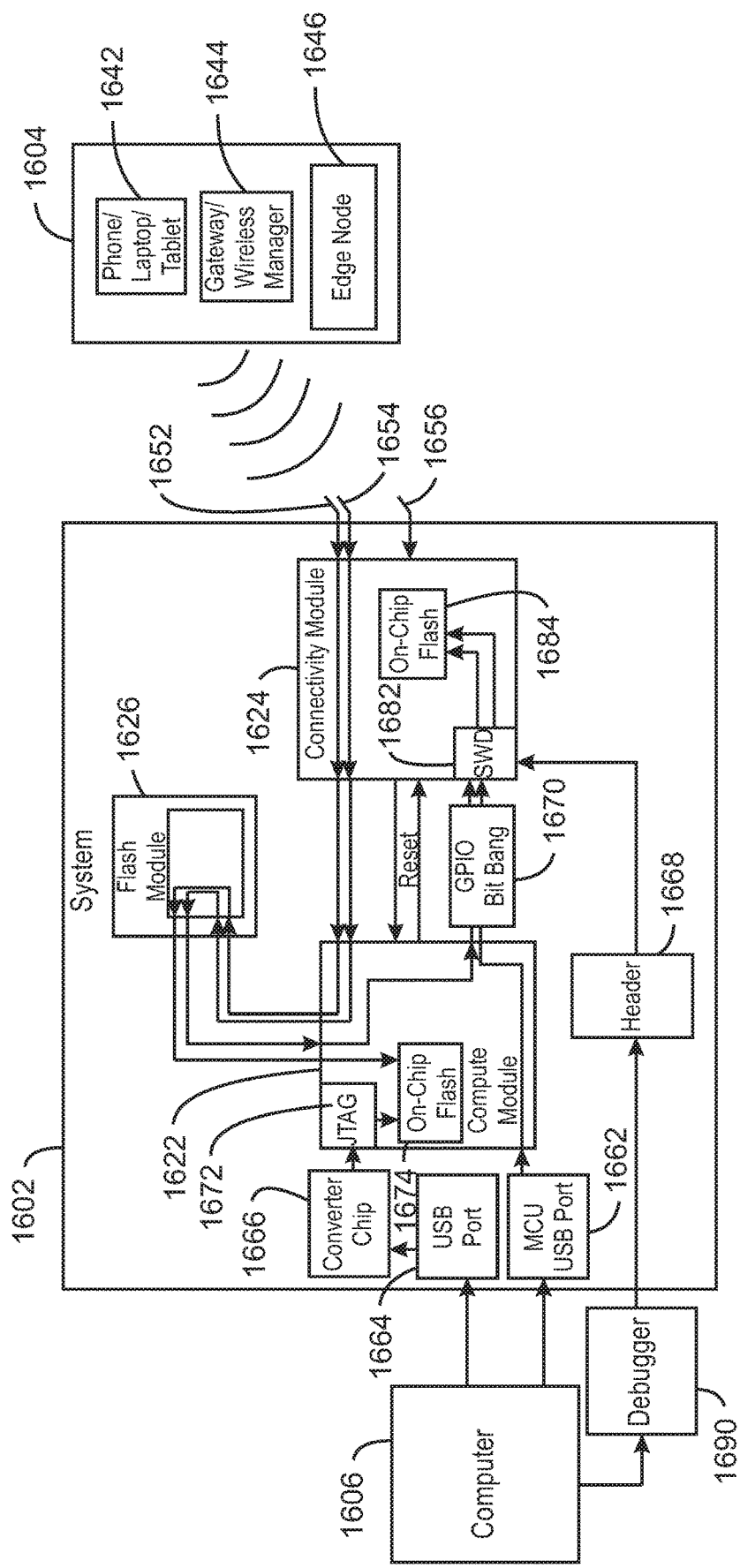
FIG. 16 illustrates a system in accordance with some embodiments.

FIG. 16 illustrates a system 1600 in accordance with some embodiments. In some embodiments, system 1600 can be provided in any other system illustrated and/or described herein. For example, in some embodiments, system 1600 can be included in the same system as system 500, system 600, system 700, system 1300, system 1400, and/or system 1500, for example. In some embodiments, system 1600 can be included in any of the IoT environments of FIGS. 1-4. System 1600 may include a modular system such as a modular IoT edge system. In some embodiments, system 1600 can include a modular system (for example, a modular IoT system such as a modular IoT edge system) that can support swap-ability of a compute module (for example, of a main compute module, an MCU compute module, a main MCU compute module, module 502, module 602, module 1304, and/or module 1502), as well as connectivity modules (for example, module 504, module 604, module 1306, and/or module 1504) and sensor modules (for example, module 510, module 610, module 1306, and/or module 1510). In some embodiments, system 1600 includes a flexible, modular hardware edge system for the Internet of Things (IoT). In some embodiments, firmware can be updated in system 1600.

System 1600 can include a system 1602 (for example, an edge system), one or more devices 1604, and a computer 1606. System 1602 can include a compute module 1622, a connectivity module 1624, and a flash module 1626. In some embodiments, compute module 1622 can be the same as or similar to any one or more of a main compute module, an MCU compute module, a main MCU compute module, module 502, module 602, module 1304, and/or module 1502. In some embodiments, connectivity module can be the same as or similar to any one or more of module 504, module 604, module 1306, and/or module 1504. In some embodiments, flash module 1626 can be a serial peripheral interface (SPI) flash module. In some embodiments, devices 1604 can be any device providing a signal (for example, a wireless communications signal). In some embodiments, for example, devices 1604 can include one or more of a phone/laptop/tablet computing device 1642, a gateway/wireless manager (for example, a gateway/WPAN manager) 1644, and/or an edge node 1646 (for example, an edge node in a mesh network).

In some embodiments, one or more devices 1604 are in wireless communication with system 1602 (for example, with connectivity module 1624) via a wireless protocol (for example, via BLE or IEEE 802.15.4). Devices 1604 can provide the wireless signal to perform a variety of over the air (OTA) flash updates such as firmware updates, including, for example, an OTA compute module flash via line 1652 (for example, an OTA compute MCU flash), an OTA connectivity module flash via line 1654 (for example, an OTA connectivity module flash through flash module 1626), and/or a direct OTA connectivity module flash via line 1656 (for example, a direct OTA connectivity module flash).

In some embodiments, system 1602 includes a compute module USB port 1662 (for example, an MCU USB port), a USB port 1664 (for example, an FTDI USB port), a converter chip 1666 (for example, an FTDI to JTAG converter chip and/or an FTDI chip), a header 1668 (for example, a 10 pin JTAG header), and an input/output bit bang multiplexer 1670 (for example, I/O bit bang mux, general purpose I/O bit bang mux, and/or GPIO bit bang mux). In some embodiments, compute module 1622 includes a test port 1672 (for example, a joint test action group port and/or JTAG port) and an on-chip flash 1674. In some embodiments, connectivity module 1624 includes a serial wire debug (SWD) port 1682 and an on-chip flash 1684. In some embodiments, system 1600 also includes a debugger 1690 (for example, a JTAG debugger).

In some embodiments, computer 1606 is coupled to USB port 1664 to provide a compute module flash through USB port 1604, converter 1606, and JTAG port 1672 to on-chip flash 1674. In some embodiments, computer 1606 is coupled to USB port 1662 to provide a connectivity module flash through USB port 1662, I/O bit bang 1670, and serial wire debug 1682 to on-chip flash 1684. It is noted that in some embodiments, this flash may involve a bootloader pre-flashed on the compute module 1622. In some embodiments, computer 1606 is coupled to debugger 1690 to provide a connectivity module flash through debugger 1690, header 1668, and serial wire debug 1682 to on-chip flash 1684.

Figure 17:
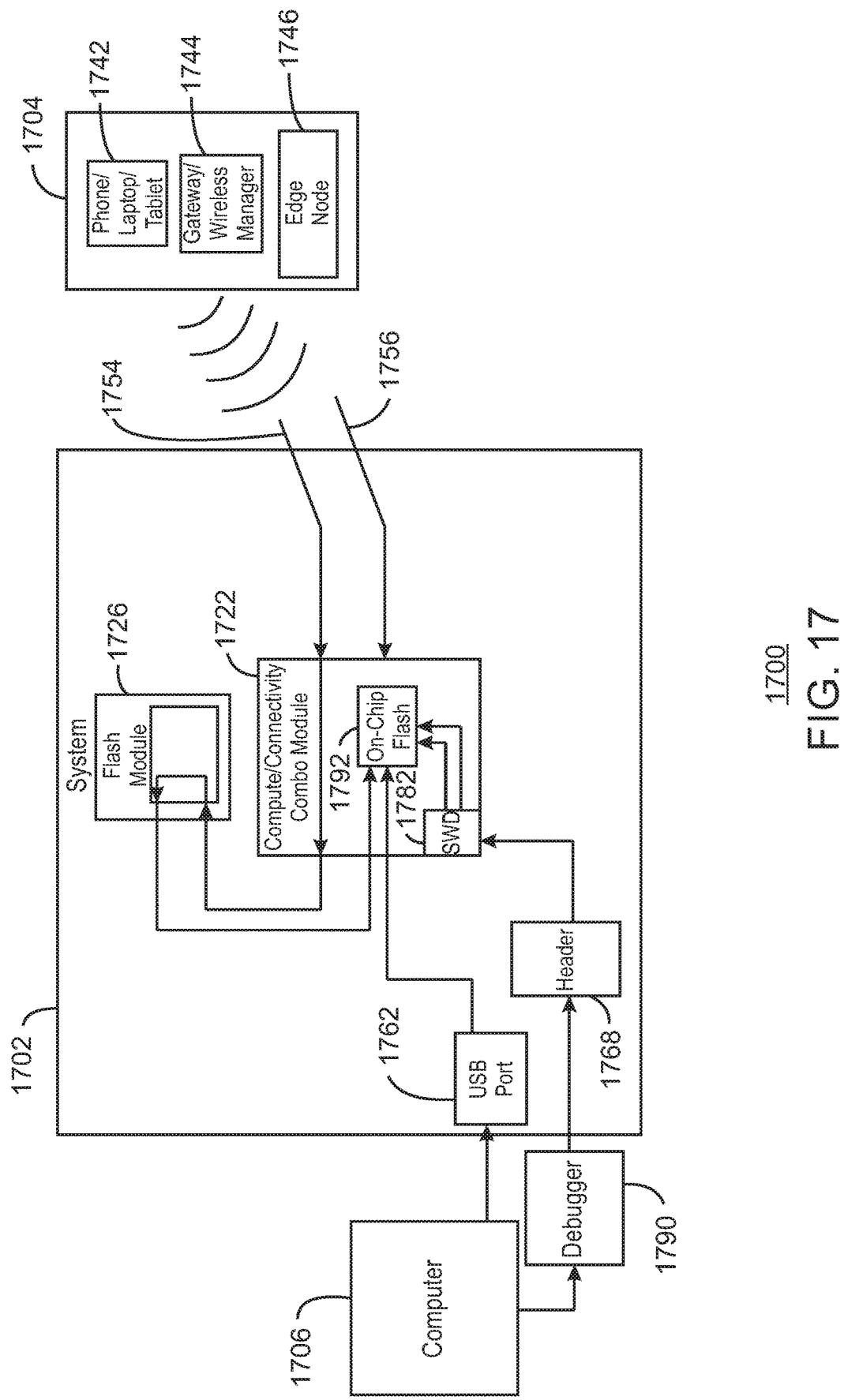
FIG. 17 illustrates a system in accordance with some embodiments.

FIG. 17 illustrates a system 1700 in accordance with some embodiments. In some embodiments, system 1700 can be provided in any other system illustrated and/or described herein. For example, in some embodiments, system 1700 can be included in the same system as system 500, system 600, system 700, system 1300, system 1400, system 1500, and/or system 1600, for example. In some embodiments, system 1700 can be included in any of the IoT environments of FIGS. 1-4. System 1700 may include a modular system such as a modular IoT edge system. In some embodiments, system 1700 can include a modular system (for example, a modular IoT system such as a modular IoT edge system) that can support swap-ability of a compute module (for example, of a main compute module, an MCU compute module, a main MCU compute module, module 502, module 602, module 1304, and/or module 1502), as well as connectivity modules (for example, module 504, module 604, module 1306, and/or module 1504) and sensor modules (for example, module 510, module 610, module 1306, and/or module 1510). In some embodiments, system 1600 includes a flexible, modular hardware edge system for the Internet of Things (IoT). In some embodiments, firmware can be updated in system 1700.

System 1700 can include a system 1702 (for example, an edge system), one or more devices 1704, and a computer 1706. System 1702 can include a combined compute/connectivity module 1722 and a flash module 1726. In some embodiments, compute/connectivity module 1722 can have the same or similar functionality and features as any one or more of a main compute module, an MCU compute module, a main MCU compute module, module 502, module 602, module 1304, module 1502, module 504, module 604, module 1306, and/or module 1504. In some embodiments, flash module 1726 can be a serial peripheral interface (SPI) flash module. In some embodiments, devices 1704 can be any device providing a signal (for example, a wireless communications signal). In some embodiments, for example, devices 1704 can include one or more of a phone/laptop/tablet computing device 1742, a gateway/wireless manager (for example, a gateway/WPAN manager) 1744, and/or an edge node 1746 (for example, an edge node in a mesh network).

In some embodiments, one or more devices 1704 are in wireless communication with system 1602 (for example, with compute/connectivity module 1722) via a wireless protocol (for example, via BLE or IEEE 802.15.4). Devices 1704 can provide the wireless signal to perform a variety of over the air (OTA) flash updates such as firmware updates, including, for example, an OTA flash via line 1754 (for example, an OTA SoC flash and/or an OTA module flash through flash module 1726), and/or a direct OTA module flash via line 1756 (for example, a direct OTA SoC flash).

In some embodiments, system 1702 includes a module USB port 1762 (for example, an MCU USB port) and a header 1768 (for example, a 10 pin JTAG header). In some embodiments, compute/connectivity module 1722 includes a serial wire debug (SWD) port 1682 and an on-chip flash 1792. In some embodiments, system 1600 also includes a debugger 1790 (for example, a JTAG debugger).

In some embodiments, computer 1706 is coupled to USB port 1762 to provide a compute/connectivity module flash through USB port 1762 to on-chip flash 1792. It is noted that in some embodiments, this flash may involve a bootloader pre-flashed on the compute/connectivity module 1722. In some embodiments, computer 1706 is coupled to debugger 1790 to provide a compute/connectivity module flash through debugger 1790, header 1768, and serial wire debug 1782 to on-chip flash 1792.

System 1600 of FIG. 16 and system 1700 of FIG. 17 establish programming paths for upgrading firmware (for example, from a single tool and host connection). Each device (for example, module or SoC) can have the flexibility to be upgraded using its native, manufacturer-provided programming tools and software. For example, an MCU on the compute module (or compute card or compute system on module) may be physically paired with an integrated radio on the communication module. In order to update the communications module (for example, the connectivity module 1624), the compute module may be used as a single interface for programming. An MCU of the communications module (for example, on-chip flash on the connectivity module 1624) may be flashed by the compute module (for example, compute module 1622), for example, through bit banging of the programming pins of the connectivity module/communications module (for example, bit banging of programming pins of connectivity module 1624 using GPIO bit bang 1670). Alternatively, the programming pins of connectivity module 1624 may be connected in parallel to serial wire debug (SWD) connector 1682 for standalone programming with the manufacturer's tools (for example, via debugger 1690 and header 1668). In some embodiments, determination of which programming interface is in use may be user selectable through switches (for example, using dual in-line package switches, or DIP switches) controlling the rest and GPIO bit banging mux 1670.

In some embodiments, due to the flexibility of the system (for example, flexible modular system) and potential limited memory available on the MCU, only code needed for the present set of boards may be flashed during flashing for the system. For example, if a pressure sensor is present in the system but a temperature sensor is not present in the system, the system can auto detect and only flash the firmware for the pressure sensor, and can remove the firmware for the temperature sensor. This can be implemented using address-selectable EEPROMs on the base boards and modules in order to enable an EEPROM records manager to store individual useful board information and interconnect information so that the system can automatically determine which modules are connected and therefore which interconnects are needed. The appropriate firmware can be flashed after determination of the boards and/or modules that are present in the system. In this manner, the system can determine that the firmware matches the hardware present in the system.

In some embodiments, devices, modules, SoCs, etc. can also be programmed over the air (OTA). This functionality may be possible for radio devices, modules, SoCs, etc. (for example, such as connectivity module 1624), but may need to additionally be created for other devices, modules, SoCs, etc. (for example, other MCU-class devices) that do not have on-chip radio capabilities. In some embodiments, it can be ensured that an OTA program is received without corruption by partitioning the on-chip flash memory such that a valid programmable area is always intact while a new program is being received and verified. The space for one OTA capable program can always be held in reserve, but this may limit program size of the device. In some embodiments, an external flash device (for example, an external SPI flash device, flash module 1626, and/or flash module 1726) may be used that can store an incoming update. Such an external flash device can increase available code space for the system. If other devices, modules, SoCs, etc. in the system are programmable by the main compute module (for example, the main MCU compute system on module), then by using a single flash memory module (for example, an external SPI flash device, flash module 1626, and/or flash module 1726), the full program memory size of each device, module, SoC, etc. in the system can be increased in size while still providing OTA capability. The update (for example, firmware update) can be provided over the air (for example, from a device such as phone/tablet/laptop 1642, gateway/wireless manager 1644, edge node 1646, phone/tablet/laptop 1742, gateway/wireless manager 1744, and/or edge node 1746 via a module such as module 1622 and/or module 1722 to a flash module such as flash module 1626 and/or flash module 17256) and stored in the flash memory (for example, stored in SPI flash memory, flash module 1626, flash module 1726, on-chip flash 1674, on-chip flash 1684, and/or on-chip flash 1792). Once fully located in the flash memory and validated, the compute module can reset another device, module, and/or SoC, etc. in order to engage the new firmware upgrade.

In some embodiments, depending on the configuration of the system, the radio device, module, and/or SoC, etc. (for example, connectivity module 1624) may end up being more capable than the compute device, module, SoC, etc. (for example, the MCU compute SoM, and/or compute module 1622, etc.) by design. In such an implementation, the modular system may be designed so that the radio device/module/SoC (for example, connectivity module 1624) is also able to reset the compute module (for example, the MCU compute SoM and/or compute module 1622, etc.) This may be accomplished using analog circuits (for example, using bipolar junction transistor pairs or BJT pairs) to allow each module, device, SoC, etc. to reset the other while being decoupled from the main system reset. This is illustrated in FIG. 16, for example, by the reset lines between compute module 1622 and connectivity module 1624. Such multi-reset functionality can be used in modular systems that have the ability to continue to evolve.

In accordance with some embodiments, systems may be distributed in a variety of different network configurations. For example, systems may be deployed in various configurations in accordance with some embodiments, including star, tree, mesh, cascading, and/or direct access deployments. In some embodiments, a multi-location distributed wireless network (for example, a WPAN) over-the-air (OTA) firmware update may be implemented over various wireless protocols, including, for example, Bluetooth low energy (BLE), wireless personal area network (WPAN), low-power wireless personal area network (LoPAN), IPv6 over low-power wireless personal area network (6LoW-PAN), Thread, Zigbee, IEEE 802.15.4e, etc., among others.

In some embodiments, cascading OTA update (for example, firmware update) may be implemented, for example, in meshed or tree based networks. The firmware update can start with one or more node(s) directly connected to the wireless manager (for example, a WPAN manager) once the node(s) complete a firmware update. The update proceeds to work in conjunction with the wireless manager to update the firmware of the adjacent node or nodes and/or nodes in its subtree. The firmware may be passed from node to node, or if distance allows, the nodes may momentarily connect to the wireless manager.

In some embodiments, a star configuration OTA update (for example, firmware update) may be implemented. Each enabled node has it's firmware image updated directly by the wireless manager (for example, by a WPAN manager). This does not require meshing, and collaboration with other nodes is not required.

In some embodiments, a direct access OTA update (for example, firmware update) may be implemented. A direct access OTA update can be similar to a star configuration OTA update. In a direct access OTA update, other nodes can assist the wireless manager (for example, a WPAN manager) in routing the firmware update packets to the targeted node.

Figure 18:
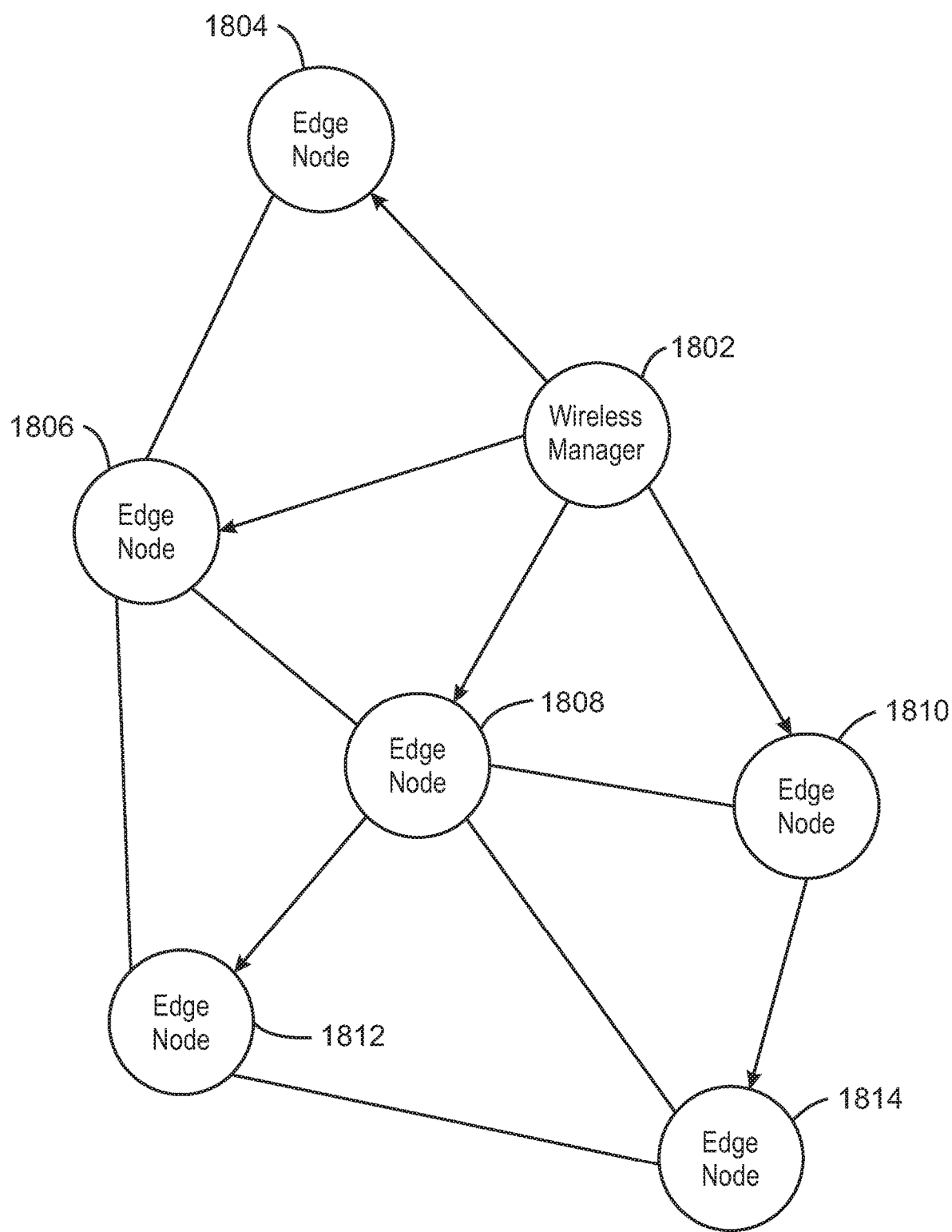
FIG. 18 illustrates a system in accordance with some embodiments.

FIG. 18 illustrates a system 1800 in accordance with some embodiments. In some embodiments, system 1800 can include any other system, platform, modules, etc. illustrated and/or described herein. For example, in some embodiments, system 1800 can include any of the elements of system 500, system 600, system 700, system 1300, system 1400, system 1500, system 1600 and/or system 1700, for example. In some embodiments, system 1800 can be included in any of the IoT environments of FIGS. 1-4. In some embodiments, system 1800 is a network in a mesh network configuration. In some embodiments, an OTA update (for example, an OTA firmware update) may be implemented in system 1800.

System 1800 includes a wireless manager 1802 (for example, a WPAN manager 1802) and nodes 1804, 1806, 1808, 1810, 1812, and 1814 (for example, edge nodes 1804, 1806, 1808, 1810, 1812, and 1814). It is noted that system 1800 can include any number of wireless managers and any number of nodes, and embodiments are not limited to the arrangement or number of elements of FIG. 18. In some embodiments, one or more of nodes 1804, 1806, 1808, 1810, 1812, and 1814 may include a modular system such as a modular IoT edge system. In some embodiments, one or more of nodes 1804, 1806, 1808, 1810, 1812, and 1814 may include a modular system (for example, a modular IoT system such as a modular IoT edge system) that can support swap-ability of a compute module (for example, of a main compute module, an MCU compute module, a main MCU compute module, module 502, module 602, module 1304, module 1502, module 1622 and/or module 1722), as well as connectivity modules (for example, module 504, module 604, module 1306, module 1504, module 1624, and/or module 1722) and sensor modules (for example, module 510, module 610, module 1306, and/or module 1510). In some embodiments, one or more of nodes 1804, 1806, 1808, 1810, 1812, and 1814 may include a flexible, modular hardware edge system for the Internet of Things (IoT). In some embodiments, firmware can be updated (for example, OTA firmware update) in system 1800.

In FIG. 18, wireless manager 1802 can update any of the nodes 1804, 1806, 1808, 1810, 1812, and 1814 using OTA firmware update as described herein (for example, one or more of nodes 1804, 1806, 1808, 1810, 1812, and 1814 may be OTA updated using techniques illustrated in and/or described in reference to FIG. 16 or FIG. 17, and/or one or more of nodes 1804, 1806, 1808, 1810, 1812, and 1814 may be the same as or similar to system 1602 and/or system 1702). In some embodiments, any devices, modules, MCUs, SoCs, etc. of any of nodes 1804, 1806, 1808, 1810, 1812 and 1814 may be OTA updated using techniques illustrated in and/or described in reference to FIG. 16 or FIG. 17, for example. Arrows in FIG. 18 illustrate one of many possible update paths for OTA update provided to the nodes 1804, 1806, 1808, 1810, 1812, and/or 1814.

Figure 19:
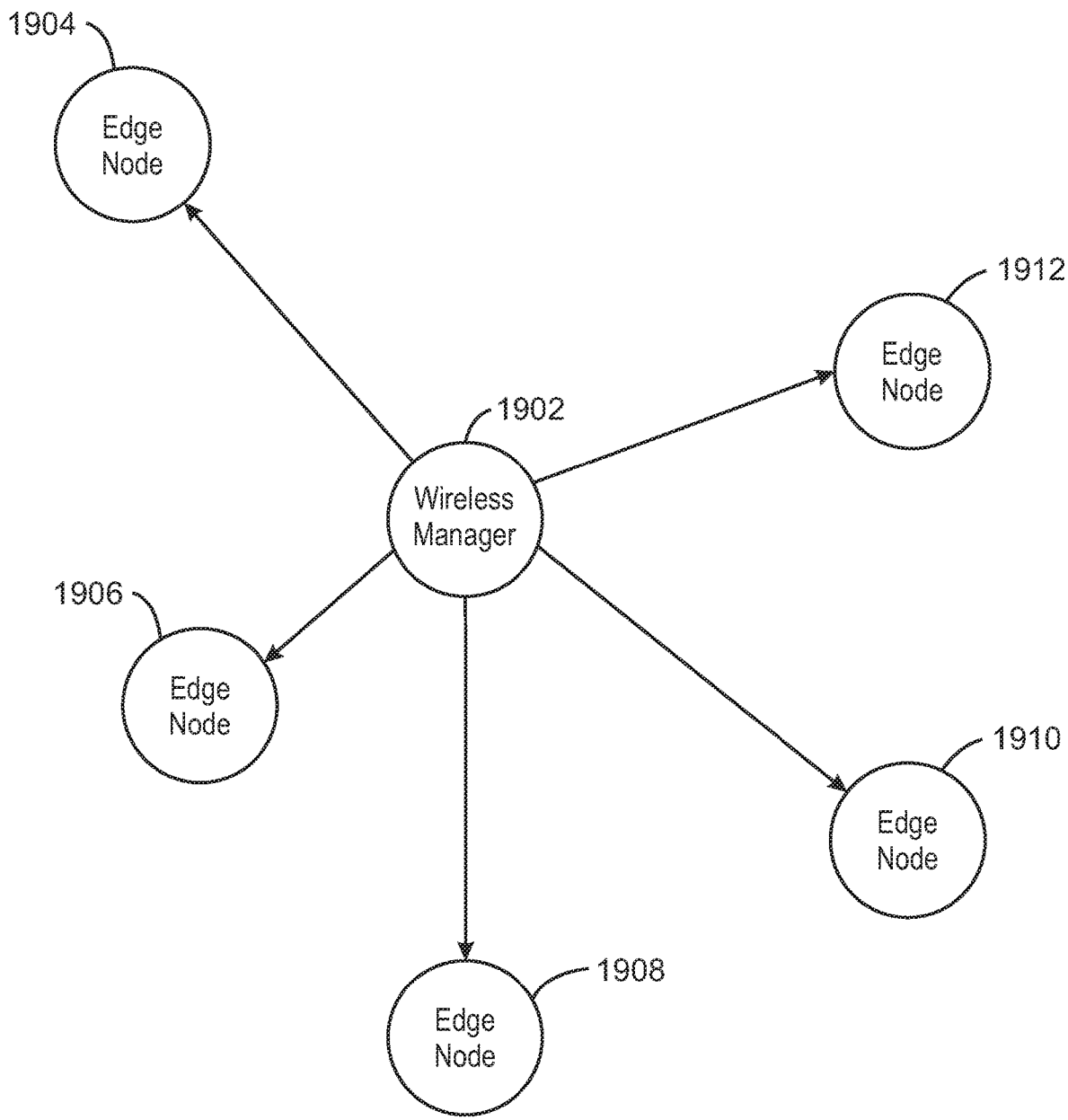
FIG. 19 illustrates a system in accordance with some embodiments.

FIG. 19 illustrates a system 1900 in accordance with some embodiments. In some embodiments, system 1900 can include any other system, platform, modules, etc. illustrated and/or described herein. For example, in some embodiments, system 1900 can include any of the elements of system 500, system 600, system 700, system 1300, system 1400, system 1500, system 1600 and/or system 1700, for example. In some embodiments, system 1900 can be included in any of the IoT environments of FIGS. 1-4. In some embodiments, system 1900 is a network in a star network configuration. In some embodiments, an OTA update (for example, an OTA firmware update) may be implemented in system 1900.

System 1900 includes a wireless manager 1902 (for example, a WPAN manager 1902) and nodes 1904, 1906, 1908, 1910 and 1912 (for example, edge nodes 1904, 1906, 1908, 1910, and 1912). It is noted that system 1900 can include any number of wireless managers and any number of nodes, and embodiments are not limited to the arrangement or number of elements of FIG. 19. In some embodiments, one or more of nodes 1904, 1906, 1908, 1910, and 1912 may include a modular system such as a modular IoT edge system. In some embodiments, one or more of nodes 1904, 1906, 1908, 1910, and 1912 may include a modular system (for example, a modular IoT system such as a modular IoT edge system) that can support swap-ability of a compute module (for example, of a main compute module, an MCU compute module, a main MCU compute module, module 502, module 602, module 1304, module 1502, module 1622 and/or module 1722), as well as connectivity modules (for example, module 504, module 604, module 1306, module 1504, module 1624, and/or module 1722) and sensor modules (for example, module 510, module 610, module 1306, and/or module 1510). In some embodiments, one or more of nodes 1904, 1906, 1908, 1910, and 1912 may include a flexible, modular hardware edge system for the Internet of Things (IoT). In some embodiments, firmware can be updated (for example, OTA firmware update) in system 1900.

In FIG. 19, wireless manager 1902 can update any of the nodes 1904, 1906, 1908, 1910, and 1912 using OTA firmware update as described herein (for example, one or more of nodes 1904, 1906, 1908, 1910, and 1912 may be OTA updated using techniques illustrated in and/or described in reference to FIG. 16 or FIG. 17, and/or one or more of nodes 1904, 1906, 1908, 1910, and 1912 may be the same as or similar to system 1602 and/or system 1702). In some embodiments, any devices, modules, MCUs, SoCs, etc. of any of nodes 1904, 1906, 1908, 1910, and 1912 may be OTA updated using techniques illustrated in and/or described in reference to FIG. 16 or FIG. 17, for example. Arrows in FIG. 19 illustrate possible update paths for OTA update provided to the nodes 1904, 1906, 1908, 1910, and/or 1912.

Figure 20:
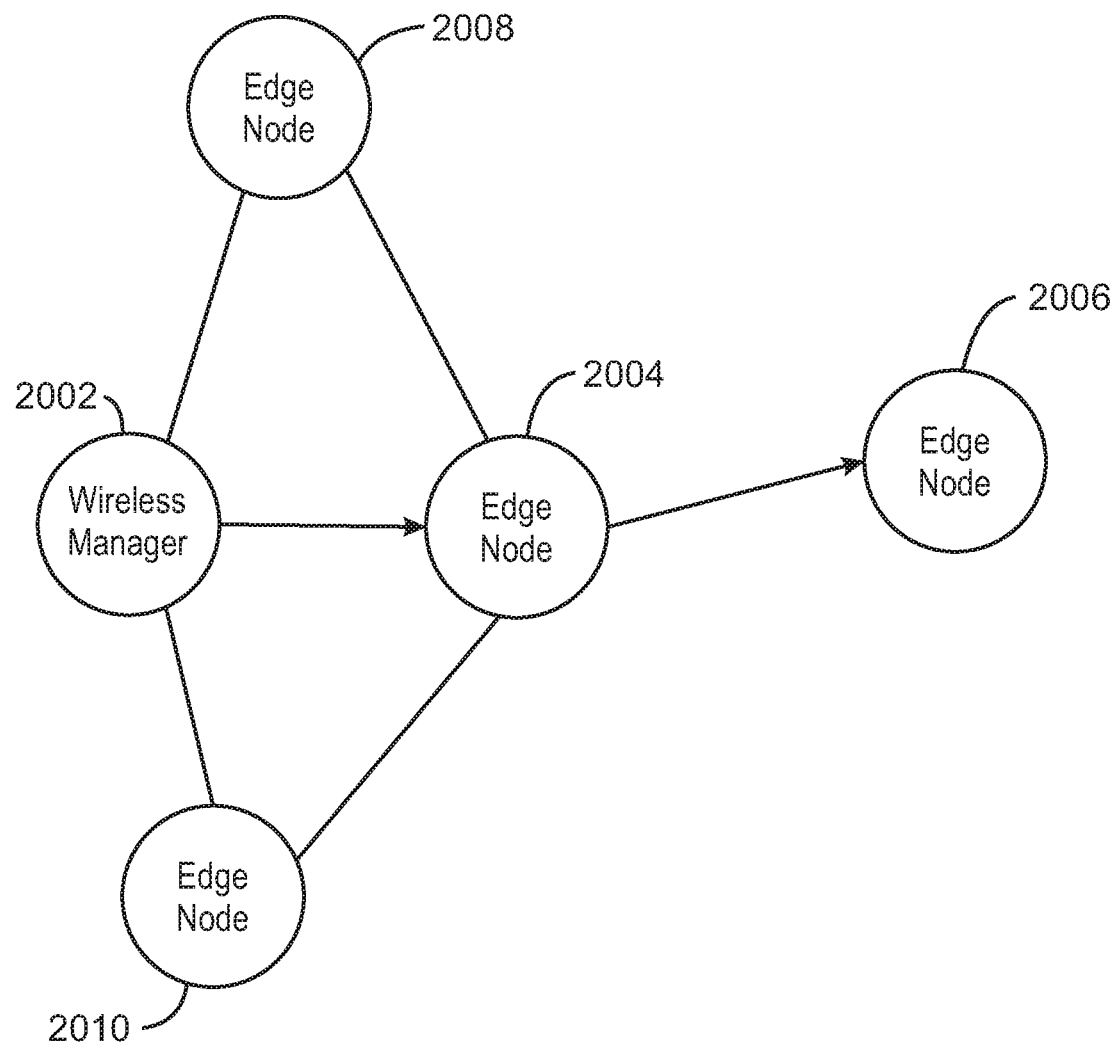
FIG. 20 illustrates a system in accordance with some embodiments.

FIG. 20 illustrates a system 2000 in accordance with some embodiments. In some embodiments, system 2000 can include any other system, platform, modules, etc. illustrated and/or described herein. For example, in some embodiments, system 2000 can include any of the elements of system 500, system 600, system 700, system 1300, system 1400, system 1500, system 1600 and/or system 1700, for example. In some embodiments, system 2000 can be included in any of the IoT environments of FIGS. 1-4. In some embodiments, system 2000 is a network in a direct address OTA example configuration. In some embodiments, an OTA update (for example, an OTA firmware update) may be implemented in system 2000.

System 2000 includes a wireless manager 2002 (for example, a WPAN manager 2002) and nodes 2004, 2006, 2008, and 2010 (for example, edge nodes 2004, 2006, 2008, and 2010). It is noted that system 2000 can include any number of wireless managers and any number of nodes, and embodiments are not limited to the arrangement or number of elements of FIG. 20. In some embodiments, one or more of nodes 2004, 2006, 2008, and 2010 may include a modular system such as a modular IoT edge system. In some embodiments, one or more of nodes 2004, 2006, 2008, and 2010 may include a modular system (for example, a modular IoT system such as a modular IoT edge system) that can support swap-ability of a compute module (for example, of a main compute module, an MCU compute module, a main MCU compute module, module 502, module 602, module 1304, module 1502, module 1622 and/or module 1722), as well as connectivity modules (for example, module 504, module 604, module 1306, module 1504, module 1624, and/or module 1722) and sensor modules (for example, module 510, module 610, module 1306, and/or module 1510). In some embodiments, one or more of nodes 2004, 2006, 2008, and 2010 may include a flexible, modular hardware edge system for the Internet of Things (IoT). In some embodiments, firmware can be updated (for example, OTA firmware update) in system 2000.

In FIG. 20, wireless manager 2002 can update any of the nodes 2004, 2006, 2008, and 2010 using OTA firmware update as described herein (for example, one or more of nodes 2004, 2006, 2008, and 2010 may be OTA updated using techniques illustrated in and/or described in reference to FIG. 16 or FIG. 17, and/or one or more of nodes 2004, 2006, 2008, and 2010 may be the same as or similar to system 1602 and/or system 1702). In some embodiments, any devices, modules, MCUs, SoCs, etc. of any of nodes 2004, 2006, 2008, and 2010 may be OTA updated using techniques illustrated in and/or described in reference to FIG. 16 or FIG. 17, for example. Arrows in FIG. 20 illustrate one of many possible update paths for OTA update. Specifically, the arrows in FIG. 20 illustrate an update path for updating node 2006 using direct address OTA update (for example, where node 2006 is a target update node).

Figure 21:
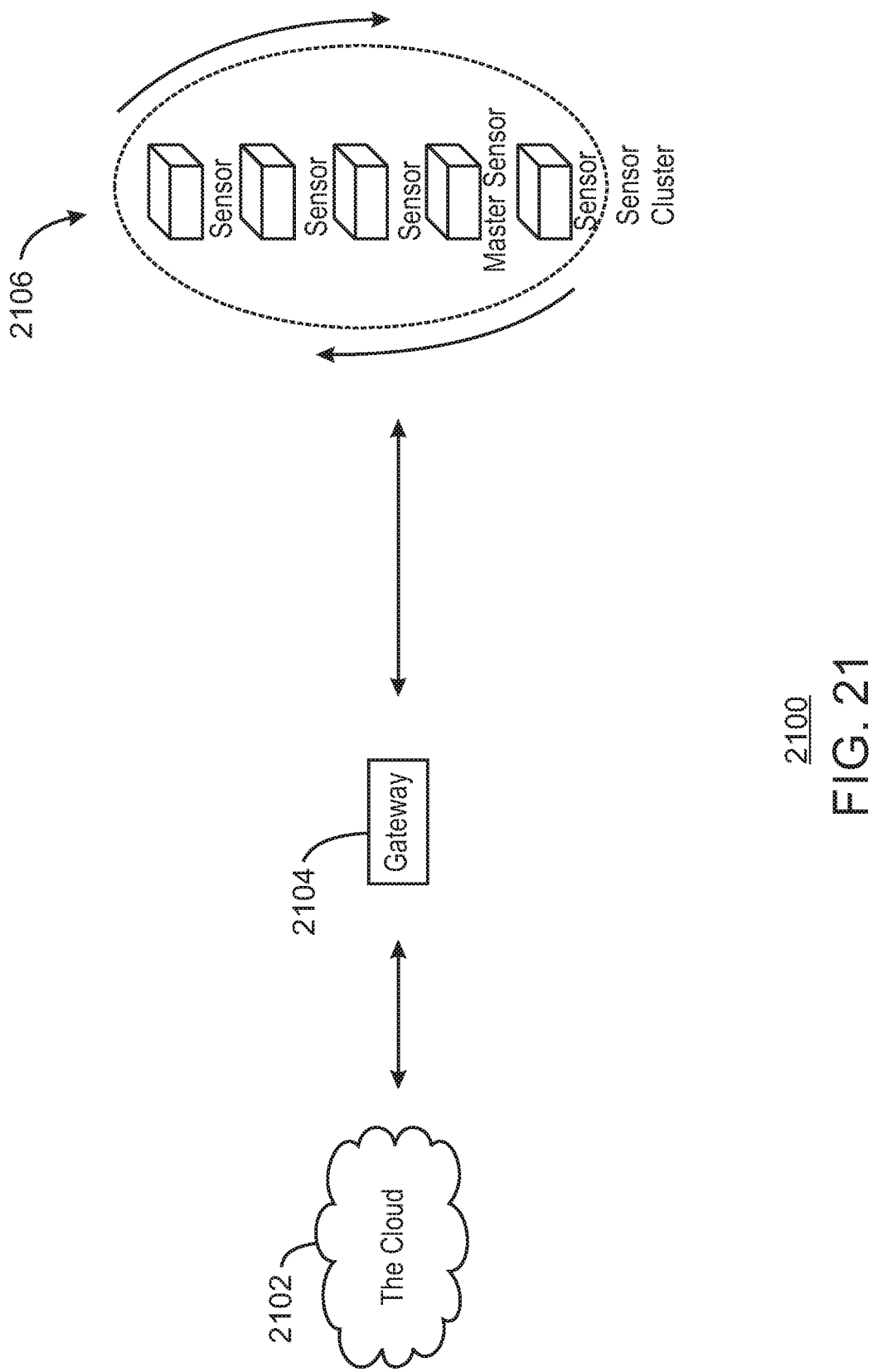
FIG. 21 illustrates a system in accordance with some embodiments.

FIG. 21 illustrates a system 2100 in accordance with some embodiments. In some embodiments, system 2100 can be provided in any other system illustrated and/or described herein. For example, in some embodiments, system 2100 can be included in the same system as system 100, system 200, system 300, system 400, system 500, system 600, system 700, system 1300, system 1400, system 1500, system 1600, system 1700, system 1800, system 1900, and/or system 2000, for example. In some embodiments, system 2100 can be included in any of the IoT environments of FIGS. 1-4. System 2100 can include a cloud 2102 and a gateway 2104, with data flowing between cloud 2102 and gateway 2104 (for example, using wired and/or wireless communication protocols).

System 2100 can also include a sensor cluster 2106. Data can flow between gateway 2104 and sensor cluster 2106 using a wireless protocol (for example, such as BLE, IEEE 802.15.04, or some other wireless protocol). In some embodiments, one or more of the sensors in cluster 2106 can be a master cluster that can provide additional control. In some embodiments, one or more of the sensors in the sensor cluster 2106 may include a modular system such as a modular IoT edge system. In some embodiments, one or more of the sensors in the sensor cluster 2106 can include a modular system (for example, a modular IoT system such as a modular IoT edge system) that can support swap-ability of a compute module (for example, of a main compute module, an MCU compute module, a main MCU compute module, module 502, module 602, module 1304, and/or module 1502), as well as connectivity modules (for example, module 504, module 604, module 1306, and/or module 1504) and sensor modules (for example, module 510, module 610, module 1306, and/or module 1510). In some embodiments, one or more of the sensors in the sensor cluster 2106 can include a flexible, modular hardware edge system for the Internet of Things (IoT). In some embodiments, system 2100 can provide early failure detection for IoT devices (for example, for low power IoT edge devices and/or one or more of the sensors in sensor cluster 2106).

Edge sensors can be unintelligent components that merely read data and transfer the data to the gateway and/or cloud for further analysis. However, the edge sensors could be faulty and send faulty data without being detected as faulty by the gateway and/or cloud, since the detection may occur in the cloud, gateway, and/or aggregator, for example, rather than at the time of reading the data. There are potential problems with relying on gateway and/or cloud analysis for detecting faults in the readings and faults in the edge sensors. When the edge sensors are not intelligent devices, for example, the aggregator or gateway can become a single point of failure when a device is obscured or disabled. In some embodiments, edge sensor devices can have an additional capability of being able to detect failure and/or faulty data, even when disconnected from the cloud, for example.

System 2100 includes sensors that are combined into a sensor cluster 2106. The sensors in cluster 2106 can be flexible modular sensors (for example, in a flexible modular sensor kit or FMSK). The addition of flexible modular sensors to cluster 2106 can provide smart sensors within an IoT environment. In some embodiments, each sensor within cluster 2106 can include a low power microcontroller (or MCU) from a flexible modular sensor platform. A variety of communication modules (or connectivity modules) can be added to these sensors. The dotted oval and arrows surrounding the cluster 2106 of sensors in FIG. 21 illustrate an algorithm (for example, a round robin algorithm) in which cluster 2106 picks a node as a master sensor. The data from each of the sensor nodes in cluster 2106 can be transmitted to the master sensor node (for example, unicasted to the master sensor node. The master sensor can run a machine language (ML) regression model, for example, on the collected data from all of the sensors in cluster 2106. The master sensor can use the collected data to detect outlier data (for example, faulty data), state status of the sensors, etc., and can predict the possibility of failure for each sensor node. Therefore, in some embodiments, intelligent analytics can be brought to IoT sensor nodes. In IoT environments where thousands (or more) of sensor devices are included (for example, at the edge), a large analytics burden can be lifted from the cloud and/or the gateway, for example. In some embodiments, data reliability and hardware fault detection may be implemented at the sensor level.

As described herein, flexible modular platforms (or systems) can provide processing capability, and can be used at the edge of an IoT system and/or in an IoT environment. The cluster 2106 of sensors can use these types of modular systems to perform analytics and/or detect faulty data and hardware, predict failure, etc. In this manner, logic can be included a the edge (for example, at sensors in the cluster 2106), at the gateway (for example, at gateway 2104), and in the cloud (for example, cloud 2102). Logic in the cloud 2102 and/or in the gateway 2104 can collect data and can also build machine learning (ML) modes. The logic in cloud 2102 and/or gateway 2104 can also periodically update machine learning (ML) models on one or more (or all) of the sensors in the cluster 2106.

Each sensor in cluster 2106 can use a communications module (for example, a Bluetooth, BLE, and/or IEEE 802.15.04 module) for node and gateway communication. In some embodiments, sensors with a similar purpose can be clustered together in the same cluster 2106. It is noted that in some embodiments, any number of clusters 2106, each with any number of sensors, can be implemented. In some embodiments, any number of gateways 2104 can be used.

In some embodiments, new sensors search for clusters (such as cluster 2106), other sensors, and gateways (for example, in the vicinity of the new sensor and/or within a predetermined distance of the new sensor). In some embodiments, if the sensor finds a cluster, it may join the cluster. If the sensor does not find a cluster, but finds another sensor, then both sensors may create a cluster and join the newly created cluster. If the sensor is already part of a cluster and finds another cluster, the master sensor of both clusters may be informed and the clusters may be merged together to be included in one cluster. If the sensor finds a gateway, it may save that gateway as a possible gateway to send data through to reach the cloud.

Figure 22:
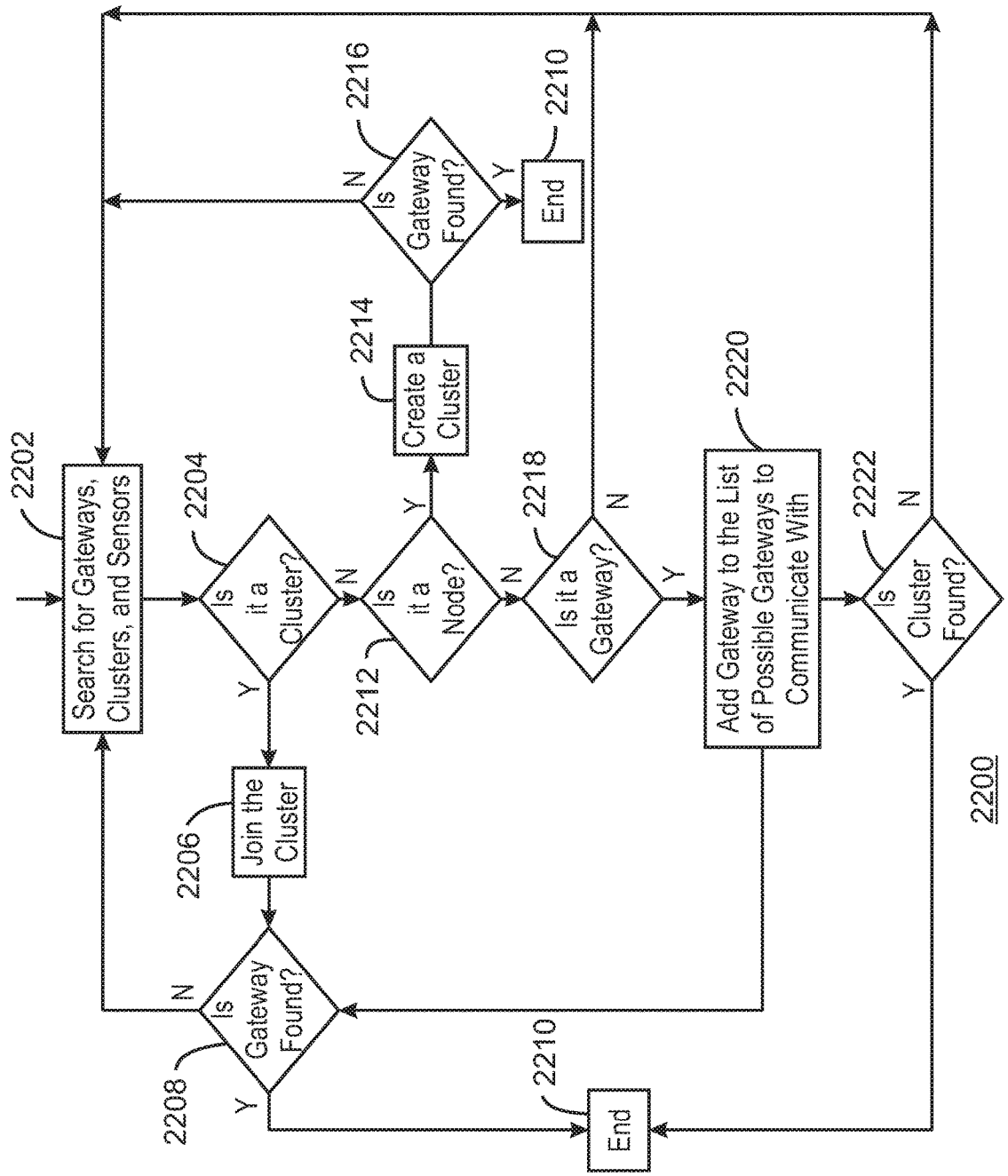
FIG. 22 illustrates a flow in accordance with some embodiments.

FIG. 22 illustrates a flow 2200 in accordance with some embodiments. In some embodiments, flow 2200 may be implemented, for example, using any of the processors, IoT devices, sensors, clusters, modules, etc. illustrated and/or described herein. For example, in some embodiments, flow 2200 may be implemented by one or more of the sensors and/or master sensors included in sensor cluster 2106. In some embodiments, flow 2200 is implemented by a sensor. For example, flow 2200 may be implemented by a sensor that is in a flexible modular sensor kit (FMSK). In some embodiments, flow 2200 is implemented by a sensor that is attempting to join a cluster with other sensors having a similar purpose (or the same purpose). In some embodiments, flow 2200 is implemented by a sensor that is searching for clusters, other sensors, and/or gateways (for example, by a sensor that is searching for clusters, other sensors, and/or gateways that are in a vicinity within a particular distance such as a predefined distance of the sensor).

At 2202, a search is performed to search for devices (for example, to search for IoT devices) such as, for example, gateways, clusters, and/or sensors. At 2204, a determination is made as to whether a cluster has been identified at 2202. If a determination is made at 2204 that a cluster has been found, the cluster may be joined at 2206. After the cluster is joined at 2206, a determination is made at 2208 as to whether a gateway have been found. If it is determined at 2208 that a gateway has been found, flow 2200 progresses to an end 2210. If it is determined at 2208 that a gateway has not been found, flow returns to 2202. If it is determined at 2204 that a cluster has not been found, flow 2200 moves to 2212 to determine if a node has been identified (for example, to identify if another node such as a sensor has been identified). If it is determined at 2212 that a node has been found, a cluster is created at 2214 (for example, in some embodiments, both a node implementing flow 2200, such as a sensor implementing flow 2200, and the other node that has been identified as determined at 2212, such as another sensor, are both added to the cluster created at 2214). Then a determination is made at 2216 as to whether a gateway has been found. If it is determined at 2216 that a gateway has been identified, flow 2200 moves to end 2210. If it is not determined at 2216 that a gateway has been identified, flow returns to 2202. If it is not determined at 2212 that a node has been identified, a determination is made at 2218 as to whether a gateway has been found. If it is determined at 2218 that a gateway has been identified, flow moves to 2220, where the identified gateway is added to a list of possible gateways for the node to communicate with. Then a determination is made at 2222 as to whether the node (for example, sensor node) has found a cluster in which to be included. If it is determined at 2222 that the node has found a cluster, flow ends at 2210. If it is determined at 2222 that the node has not found a cluster, flow returns to 2202.

Some embodiments relate to a machine learning (ML) model. For example, some embodiments may use multi-variant cubic polynomial regression to detect data outliers (for example, faulty data), node state, and/or to predict node state. The machine learning model may be built using, for example, historic values of read data, sensor state, a counter indicating how long a sensor was active, a counter indicating a number corresponding to a number of data read, a current at a time of reading, and/or a voltage at a time of reading, etc.

In some embodiments, a machine learning (ML) regression model may be updated over the air. For example, an edge flexible modular sensor kit (FMSK) cluster may obtain a machine learning model over the air from the cloud. In some embodiments, a machine learning model may be built using historic data, or data freshly received from one or more sensors. In some embodiment, each sensor in a cluster of sensors receives a copy of the machine learning. The sensor can use this model for detection and validation. The cloud may periodically use new data from the edge to refresh the machine learning model. The cloud can deploy the machine learning model to one or more master nodes (for example, one or more master sensors) of the cluster. A master node (for example, a master sensor) can distribute the machine learning model to all of the nodes (for example, to all of the sensors) in a cluster.

In some embodiments, each cluster can include a master node (for example, a master sensor) that is selected (for example, that is periodically selected) using, for example, a round robin selection method. In some embodiments, although all sensors in a cluster may have access to a machine learning model, only a master sensor performs the analysis to evaluate data ready by the sensors, and the behavior of each sensor. In some embodiments, the master sensor is responsible for communication with a gateway and/or with the cloud. In some embodiments, the sensor that is the master sensor can be periodically changed to avoid a single point of failure.

In some embodiments, in a normal situation in which a sensor cluster is reading data, each individual sensor (for example, each FMSK sensor) will read data and unicast data to a master sensor of the cluster. The master node can gather all data from all the other nodes, and can perform analysis to evaluate the correctness of the data and the state of each node, and can predict a possibility of failure for each of the nodes. The master node can send this data to a gateway and/or to the cloud.

In some embodiments, in a situation in which data from a faulty sensor may be read where the sensor cluster is reading data, the master node can receive all of the data. Using a machine learning regression model, data may be flagged as faulty. In this situation, the master may require the node to perform another reading. If the newly read data is correct, then the previous data was received due to a faulty ready and can be discarded. If the newly read data is still faulty, the master can ask a sensor to read the data a third time. If the data is still faulty after the third read, the device (sensor, node, etc.) is flagged as faulty, and all data (including the faulty data that is flagged as faulty) can be sent to a gateway and/or to the cloud.

Figure 23:
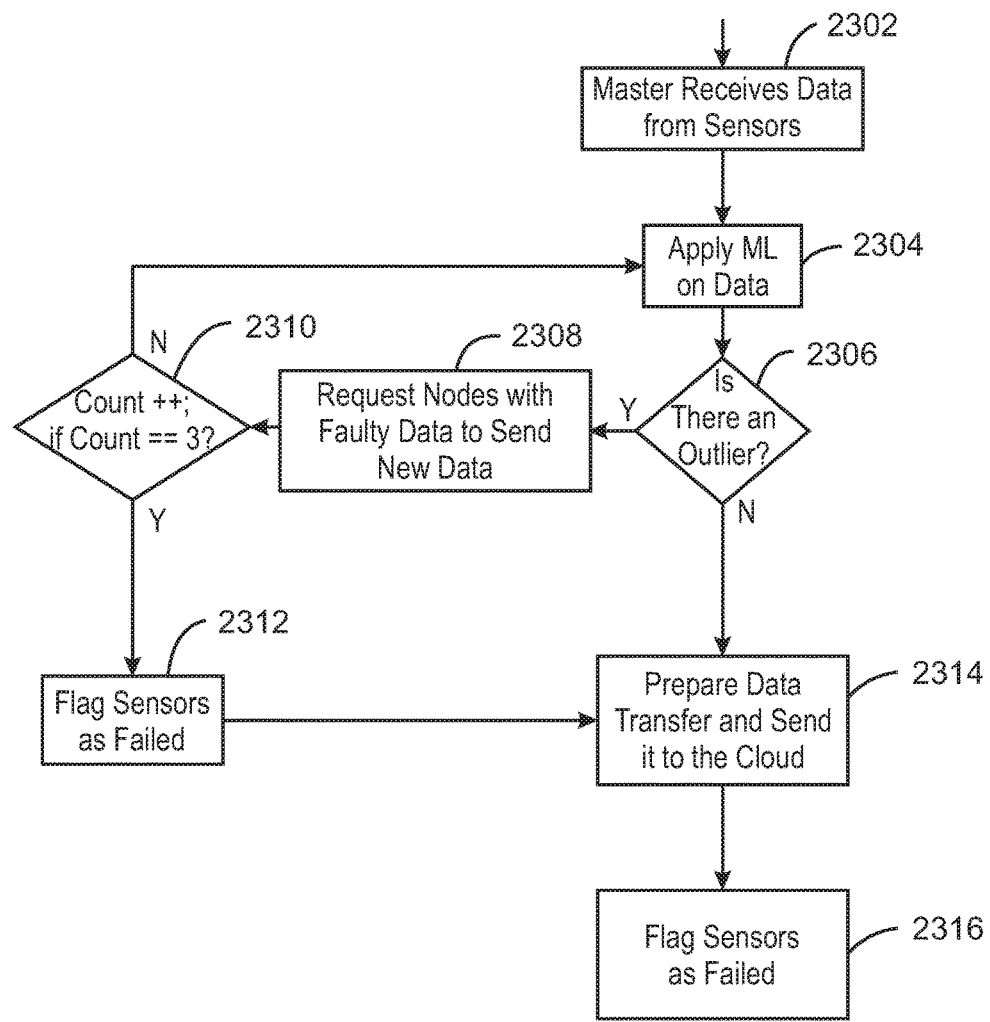
FIG. 23 illustrates a flow in accordance with some embodiments.

FIG. 23 illustrates a flow 2300 in accordance with some embodiments. In some embodiments, flow 2300 may be implemented, for example, using any of the processors, IoT devices, sensors, clusters, modules, etc. illustrated and/or described herein. In some embodiments, flow 2300 is implemented by a sensor. For example, in some embodiments, flow 2300 may be implemented by one or more of the sensors and/or master sensors included in sensor cluster 2106. Flow 2300 may be implemented by a sensor that is in a flexible modular sensor kit (FMSK). In some embodiments, flow 2300 can implement a machine learning model. For example, flow 2300 can use multi-variant cubic polynomial regression to detect faulty data and/or node state, and can predict node state.

At 2302, a master can receive data from one or more sensors (for example, a master sensor in a sensor cluster can receive data from one or more sensors in the cluster). Machine learning (ML) can be applied on the data at 2304 (for example, to determine whether the data is faulty). At 2306, a determination is made as to whether a data outlier has been identified (for example, to determine whether faulty data has been identified). If a determination is made at 2306 that a data outlier has been identified, then a request can be sent at 2308 to nodes with faulty data to send new data (for example, to re-send the data to obtain correct data). A counter can be incremented at 2308 and/or at 2310, and at 2310 a determination can be made as to whether the counter is equal to a predetermined number (for example, as to whether the counter is equal to three if flow 2300 is implementing a re-check of faulty data three times to determine whether correct data can be obtained or whether only faulty data is received each time). If the predetermined count is reached at 2310, one or more sensors sending faulty data may be flagged at 2312. Then at 2314 data is prepared for transfer and sent to a gateway and/or to the cloud. If the predetermined count has not been reached at 2310, flow returns to 2304 to apply machine learning to the data. If a determination is made at 2306 that a data outlier has not been identified, then at 2314 data is prepared for transfer and sent to a gateway and/or to the cloud.

Figure 24:
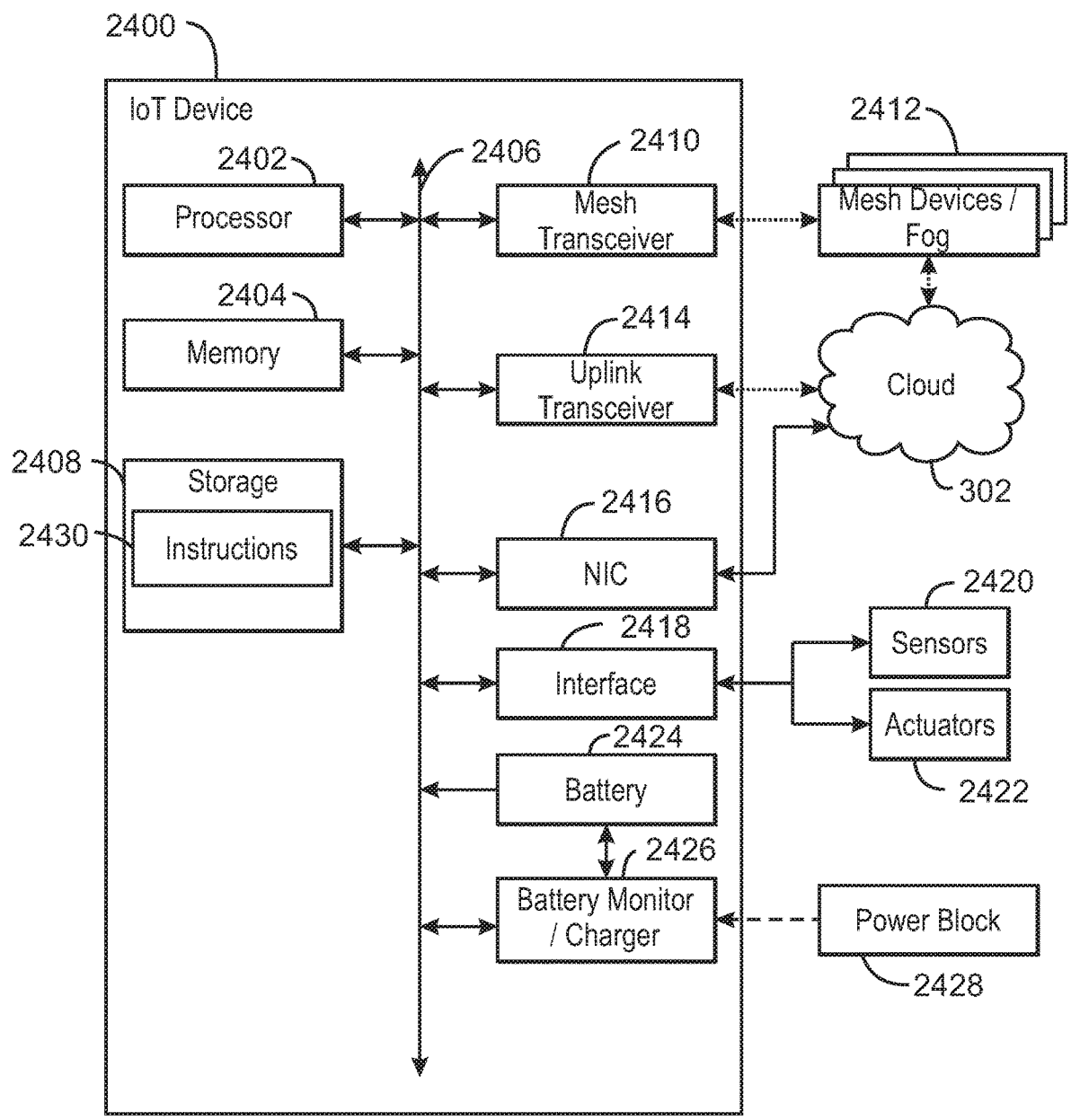
FIG. 24 is a block diagram of an example of components that may be present in an IoT device in accordance with some embodiments.

FIG. 24 is a block diagram of an example of components that may be present in an IoT device 2400 for implementing any of the techniques illustrated or described herein. The IoT device 2400 may include any combinations of the components shown in the example. The components may be implemented as ICs, portions thereof, discrete electronic devices, or other modules, logic, hardware, software, firmware, or a combination thereof adapted in the IoT device 2400, or as components otherwise incorporated within a chassis of a larger system. The block diagram of FIG. 24 is intended to show a high level view of components of the IoT device 2400. However, some of the components shown may be omitted, additional components may be present, and different arrangement of the components shown may occur in other implementations.

The IoT device 2400 may include a processor 2402, which may be a microprocessor, a multi-core processor, a multithreaded processor, an ultra-low voltage processor, an embedded processor, or other known processing element. The processor 2402 may be a part of a system on a chip (SoC) in which the processor 2402 and other components are formed into a single integrated circuit, or a single package, such as the Edison™ or Galileo™ SoC boards from Intel. As an example, the processor 2402 may include an Intel® Architecture Core™ based processor, such as a Quark™, an Atom™, an i3, an i5, an i7, a Xeon®, a Xeon Phi™ co-processor, or an MCU-class processor, or another such processor available from Intel® Corporation, Santa Clara, Calif. However, any number other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as a processor from Apple® Inc. (for example, an A5-A10 processor from Apple® Inc.), a Snapdragon™ processor from Qualcomm® Technologies, Inc., or an OMAP™ processor from Texas Instruments, Inc.

The processor 2402 may communicate with a system memory 2404 over a bus 2406. Any number of memory devices may be used to provide for a given amount of system memory. As examples, the memory can be random access memory (RAM) in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard, such as LPDDR3 or LPDDR4 that will offer extensions to LPDDR2 to increase bandwidth. In various implementations the individual memory devices may be of any number of different package types such as single die package (SDP), dual die package (DDP) or quad die package (Q17P). These devices, in some embodiments, may be directly soldered onto a motherboard to provide a lower profile solution, while in other embodiments the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs. For example, a memory may be sized between 2 GB and 16 GB, and may be configured as a DDR3LM package or an LPDDR2 or LPDDR3 memory, which is soldered onto a motherboard via a ball grid array (BGA).

To provide for persistent storage of information such as data, applications, operating systems and so forth, a mass storage 2408 may also be coupled to the processor 2402 via the bus 2406. To enable a thinner and lighter system design, the mass storage 2408 may be implemented via a solid state drive (SSD). Other devices that may be used for the mass storage 2408 include flash memory cards, such as SD cards, microSD cards, xD picture cards, and the like, and USB flash drives.

In low power implementations, the mass storage 2408 may be on-die memory or registers associated with the processor 2402. However, in some examples, the mass storage 2408 may be implemented using a micro hard disk drive (HDD). Further, any number of new technologies may be used for the mass storage 2408 in addition to, or instead of, the technologies described, such resistance change memories, phase change memories, holographic memories, or chemical memories, among others. For example, the IoT device 2400 may incorporate the 3D XPOINT memories from Intel® and Micron®.

The components may communicate over the bus 2406. The bus 2406 may include any number of technologies, including industry standard architecture (ISA), extended ISA (EISA), peripheral component interconnect (PCI), peripheral component interconnect extended (PCIx), PCI express (PCIe), or any number of other technologies. The bus 2406 may be a proprietary bus, for example, used in a SoC based system. Other bus systems may be included, such as an $I^2C$ interface, $I^3C$ interface, an SPI interface, point to point interfaces, and a power bus, among others.

The bus 2406 may couple the processor 2402 to a mesh transceiver 2410, for communications with other mesh devices 2412. The mesh transceiver 2410 may use any number of frequencies and protocols, such as 2.4 gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the mesh devices 2412. For example, a WLAN unit may be used to implement Wi-Fi™ communications in accordance with the Institute of Electrical and Electronics Engineers (IEEE) 802.11 standard. In addition, wireless wide area communications, e.g., according to a cellular or other wireless wide area protocol, can occur via a WWAN unit.

The mesh transceiver 2410 may communicate using multiple standards or radios for communications at different range. For example, the IoT device 2400 may communicate with geographically proximate devices, e.g., within about 10 meters, using a local transceiver based on BLE, or another low power radio, to save power. More distant mesh devices 2412, e.g., within about 50 meters, may be reached over ZigBee or other intermediate power radios. Both communications techniques may take place over a single radio at different power levels, or may take place over separate transceivers, for example, a local transceiver using BLE and a separate mesh transceiver using ZigBee. The mesh transceiver 2410 may be incorporated into an MCU as an address directly accessible by the chip, such as in the Curie® units available from Intel.

An uplink transceiver 2414 may be included to communicate with devices in the cloud 302. The uplink transceiver 2414 may be LPWA transceiver that follows the IEEE 802.15.4, IEEE 802.15.4g, IEEE 802.15.4e, IEEE 802.15.4k, or NB-IoT standards, among others. The IoT device 2400 may communicate over a wide area using LoRaWAN™ (Long Range Wide Area Network) developed by Semtech and the LoRa Alliance. The techniques described herein are not limited to these technologies, but may be used with any number of other cloud transceivers that implement long range, low bandwidth communications, such as Sigfox, Weightless-P from the Weightless Special Interest Group, Random Phase Multiple Access (RPMA®) from Ingenu, and other technologies. Further, other communications techniques, such as time-slotted channel hopping, described in the IEEE 802.15.4e specification may be used.

Any number of other radio communications and protocols may be used in addition to the systems mentioned for the mesh transceiver 2410 and uplink transceiver 2414, as described herein. For example, the radio transceivers 2410 and 2412 may include an LTE or other cellular transceiver that uses spread spectrum (SPA/SAS) communications for implementing high-speed communications, such as for video transfers. Further, any number of other protocols may be used, such as Wi-Fi® networks for medium speed communications, such as still pictures, sensor readings, and provision of network communications.

The radio transceivers 2410 and 2412 may include radios that are compatible with any number of 3GPP (Third Generation Partnership Project) specifications, notably Long Term Evolution (LTE), Long Term Evolution-Advanced (LTE-A), Long Term Evolution-Advanced Pro (LTE-A Pro), or Narrow Band IoT (NB-IoT), among others. It can be noted that radios compatible with any number of other fixed, mobile, or satellite communication technologies and standards may be selected. These may include, for example, any Cellular Wide Area radio communication technology, which may include e.g. a 5th Generation (5G) communication systems, a Global System for Mobile Communications (GSM) radio communication technology, a General Packet Radio Service (GPRS) radio communication technology, or an Enhanced Data Rates for GSM Evolution (EDGE) radio communication technology. Other Third Generation Partnership Project (3GPP) radio communication technology that may be used includes UMTS (Universal Mobile Telecommunications System), FOMA (Freedom of Multimedia Access), 3GPP LTE (Long Term Evolution), 3GPP LTE Advanced (Long Term Evolution Advanced), 3GPP LTE Advanced Pro (Long Term Evolution Advanced Pro)), CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High-speed Packet Access), HSDPA (High-Speed Downlink Packet Access), HSUPA (High-Speed Uplink Packet Access), HSPA+(High-speed Packet Access Plus), UMTS-TDD (Universal Mobile Telecommunications System-Time-Division Duplex), TD-CDMA (Time Division-Code Division Multiple Access), TD-SCDMA (Time Division-Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP LTE Extra, LTE Licensed-Assisted Access (LAA), UTRA (UMTS Terrestrial Radio Access), E-UTRA (Evolved UMTS Terrestrial Radio Access), LTE Advanced (4G) (Long Term Evolution Advanced (4th Generation)), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), D-AMPS (2G) (Digital AMPS (2nd Generation)), PTT (Push-to-talk), MTS (Mobile Telephone System), IMTS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem D, or Mobile telephony system D), Autotel/PALM (Public Automated Land Mobile), ARP (Finnish for Autoradiopuhelin, "car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handyphone System), WiDEN (Wideband Integrated Digital Enhanced Network), iBurst, Unlicensed Mobile Access (UMA, also referred to as also referred to as 3GPP Generic Access Network, or GAN standard)), Wireless Gigabit Alliance (WiGig) standard, mmWave standards in general (wireless systems operating at 10-90 GHz and above such as WiGig, IEEE 802.1 lad, IEEE 802.1 lay, and the like. In addition to the standards listed above, any number of satellite uplink technologies may be used for the uplink transceiver 2414, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated.

A network interface controller (NIC) 2416 may be included to provide a wired communication to the cloud 302 or to other devices, such as the mesh devices 2412. The wired communication may provide an Ethernet connection, or may be based on other types of networks, such as Controller Area Network (CAN), Local Interconnect Network (LIN), DeviceNet, ControlNet, Data Highway+, EtherCAT, SERCOS, PROFIBUS, PROFINET RT, or PROFINET IRT, among many others. An additional NIC 2416 may be included to allow connection to a second network, for example, a NIC 2416 providing communications to the cloud over Ethernet, and a second NIC 2416 providing communications to other devices over another type of network.

The bus 2406 may couple the processor 2402 to an interface 2418 that is used to connect external devices. The external devices may include sensors 2420, such as accelerometers, level sensors, flow sensors, temperature sensors, pressure sensors, barometric pressure sensors, and the like. The interface 2418 may be used to connect the IoT device 2400 to actuators 2422, such as power switches, valve actuators, an audible sound generator, a visual warning device, and the like.

While not shown, various input/output (1/O) devices may be present within, or connected to, the IoT device 2400. For example, a display may be included to show information, such as sensor readings or actuator position. An input device, such as a touch screen or keypad may be included to accept input.

A battery 2424 may power the IoT device 2400, although in examples in which the IoT device 2400 is mounted in a fixed location, it may have a power supply coupled to an electrical grid. The battery 2424 may be a lithium ion battery, a metal-air battery, such as a zinc-air battery, an aluminum-air battery, a lithium-air battery, a hybrid supercapacitor, and the like.

A battery monitor/charger 2426 may be included in the IoT device 2400 to track the state of charge (SoCh) of the battery 2420. The battery monitor/charger 2426 may be used to monitor other parameters of the battery 2424 to provide failure predictions, such as the state of health (SoH) and the state of function (SoF) of the battery 2424. The battery monitor/charger 2426 may include a battery monitoring integrated circuit, such as an LTC4020 or an LTC2990 from Linear Technologies, an ADT7488A from ON Semiconductor of Phoenix Ariz., or an IC from the UCD90xxx family from Texas Instruments of Dallas, Tex. The battery monitor/charger 2426 may communicate the information on the battery 2424 to the processor 2402 over the bus 2406. The battery monitor/charger 2426 may also include an analog-to-digital (ADC) convertor that allows the processor 2402 to directly monitor the voltage of the battery 2426 or the current flow from the battery 2424. The battery parameters may be used to determine actions that the IoT device 2400 may perform, such as transmission frequency, mesh network operation, sensing frequency, and the like.

A power block 2428, or other power supply coupled to a grid, may be coupled with the battery monitor/charger 2426 to charge the battery 2424. In some examples, the power block 2428 may be replaced with a wireless power receiver to obtain the power wirelessly, for example, through a loop antenna in the IoT device 2400. A wireless battery charging circuit, such as an LTC4020 chip from Linear Technologies of Milpitas, Calif., among others, may be included in the battery monitor/charger 2426. The specific charging circuits chosen depend on the size of the battery 2424, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others. In some examples, the power block 2428 may be augmented or replaced with solar panels, a wind generator, a water generator, or other natural power systems.

The storage 2408 may include a number of modules to implement any of the techniques described herein. Although shown as code blocks in the mass storage 2408, it may be understood that any of the modules may be fully or partially replaced with hardwired circuits, for example, built into an application specific integrated circuit (ASIC). The mass storage 2408 may include instructions 2430 according to some embodiments. Instructions 2430 can include code to implement any of the techniques described herein. In some embodiments, all or some of instructions 2430 may be included in processor 2402 and/or in memory 2404. That is, in some embodiments, instructions 2430 may be included in processor 2402, in processor 2404, in storage 2408, and/or may be included in any combination of one or more of processor 2402, memory 2404, and/or storage 2408.

In some embodiments, IoT device 2400 can include a system or a subsystem to implement any of the techniques described herein. For example, in some embodiments, IoT device 2400 can be or can include a system or subsystem such as, for example, an edge device, a fog device, a gateway, or any other IoT device implementing any of the techniques illustrated and described herein.

Examples and embodiments of various techniques have been illustrated and described herein as being implemented, for example, using a processor executing stored instructions. However, it is noted that other examples and embodiments of any of these techniques can includes other implementations. For example, any of the techniques illustrated or described herein can be implemented in any of hardware, software, firmware, or in any combination thereof. Some embodiments can be implemented, for example, using an Application Specific Integrated Circuit (ASIC) or a Field Programmable Gate Array (FPGA), among others.

Figure 25:
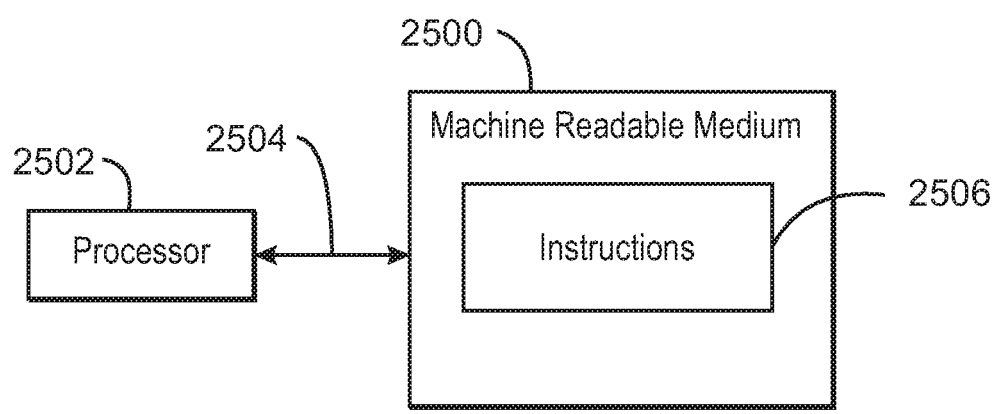
FIG. 25 is a block diagram of one or more non-transitory, machine readable media including code to direct one or more processor to implement instructions in accordance with some embodiments.

FIG. 25 is a block diagram of one or more exemplary non-transitory, machine readable medium 2500 (or media 2500) including instructions (or code) to direct a processor 2502 to implement any of the techniques described herein in accordance with some embodiments. The processor 2502 may access the one or more non-transitory, machine readable medium 2500 over a bus 2504. The processor 2502 and bus 2504 may be selected as described with respect to the processor 2402 and bus 2406 of FIG. 24. The one or more non-transitory, machine readable medium 2500 may include devices described for the mass storage 2408 of FIG. 24 or may include optical disks, thumb drives, or any number of other hardware devices.

The one or more non-transitory, machine readable medium 2500 may include instructions 2506 (can also be referred to as code 2506) to direct the processor 2502 to implement any of the techniques described herein, among others.

In some embodiments, the techniques described herein can be implemented by a processor such as processor 2402 or processor 2502 running software or firmware, or some combination thereof. However, in some embodiments, the techniques described herein may be implemented using other types of processors or controllers. For example, in some embodiments, the techniques described herein may be implemented by an FPGA (field programmable gate array), for example.

The techniques described herein may be used to implement any number of IoT networks for various purposes. Additional applications may be implemented.

Example 1 In some examples, a modular Internet of Things (IoT) apparatus, includes a plurality of boards and connectors to couple IoT modules to one or more of the plurality of boards and to couple the plurality of boards to each other, the connectors comprising stacking connectors on both sides of at least some of the boards and at least some of the IoT modules to be coupled to the boards, the stacking connectors allowing the IoT modules and the boards to be coupled together in a manner that boards and modules cannot be inserted incorrectly.

Example 2 includes the subject matter of Example 1. The stacking connectors provide a common pinout for the boards and the IoT modules.

Example 3 includes the subject matter of any of Examples 1-2. The stacking connectors provide a polarized stacking interconnect.

Example 4 includes the subject matter of any of Examples 1-3. The stacking connectors include a full pass-through design.

Example 5 includes the subject matter of any of Examples 1-4. The stacking connectors include variable connector height to accommodate local circuitry on a board or IoT module.

Example 6 includes the subject matter of any of Examples 1-5. Each board may be stacked in any order without physical collision of components.

Example 7 includes the subject matter of any of Examples 1-6. Pin outs of the stacking connectors are agnostic to a function of each board.

Example 8 includes the subject matter of any of Examples 1-7. The IoT modules include one or more IoT compute module, one or more IoT connectivity module, one or more IoT sensor module, and/or one or more IoT power module.

Example 9 includes the subject matter of any of Examples 1-8. The pin outs of the stacking connectors are agnostic to a function of each board to allow stacking of varying IoT modules, base systems, and/or shields without regard to function or order.

Example 10 includes the subject matter of any of Examples 1-9. The stacking connectors allow vertical stacking.

Example 11 includes the subject matter of any of Examples 1-10. The stacking connectors allow horizontal stacking.

Example 12 includes the subject matter of any of Examples 1-11. The stacking connectors allow module locations along edges of at least some of the boards.

Example 13 includes the subject matter of any of Examples 1-12. The stacking connectors allow connectivity module locations along edges of at least some of the boards.

Example 14 includes the subject matter of any of Examples 1-13. Keepouts are along edges of at least some of the boards.

Example 15 includes the subject matter of any of Examples 1-14. Keepouts on the IoT modules in a common location provide a common keepout zone on each of the IoT modules for IoT radio module antennas.

Example 16 In some examples, an Internet of Things (IoT) apparatus includes a data manager to route data to independently developed components in an IoT system, the data manager to allow the components to implement data-type agnostic information exchange with each other, and the data manager to assign a unique identifier to each component to enable the component to send and/or receive information via the data manager.

Example 17 includes the subject matter of Example 16. The data manager can run in a target controller application space.

Example 18 includes the subject matter of any of Examples 16-17. The data manager is agnostic to contents of the components data inputs.

Example 19 includes the subject matter of any of Examples 16-18. The data manager is to loosely couple the components and dynamically bind components to the IoT system without comprehending their internal structure.

Example 20 includes the subject matter of any of Examples 16-19. The data manager is to utilize characteristics of data payload traffic to determine its relationship with components in an embedded system.

Example 21 includes the subject matter of any of Examples 16-20. The data manager includes a publisher-subscriber to route data between the components. One or more of the components can publish and/or subscribe to data in the IoT system.

Example 22 includes the subject matter of any of Examples 16-21. The data manager is compatible with preemptive and non-preemptive task schedulers.

Example 23 includes the subject matter of any of Examples 16-22. The components are independently developed deep-embedded components. The data manager is to interconnect the components without having an intricate knowledge of an inner working of the components.

Example 24 includes the subject matter of any of Examples 16-23. The data manager is to allow the components to exchange information with each other without constructs of the data originating component being embedded into a data destination component.

Example 25 includes the subject matter of any of Examples 16-24. The data manager includes a client registration manager to validate each component using a component plug-in module.

Example 26 includes the subject matter of any of Examples 16-25. The data manager includes a configuration manager to allow one or more data manager clients to configure a behavior of the data manager or another data manager client.

Example 27 includes the subject matter of any of Examples 16-26. The data manager includes a data/event subscriber to allow one or more data manager clients to configure a behavior of the data manager or a data/event publisher.

Example 28 includes the subject matter of any of Examples 16-27. The data manager includes a publisher-subscriber to route data between components who publish data and components who subscribe to data.

Example 29 In some examples, an Internet of Things (IoT) apparatus includes a plurality of integrated power supplies including passive components for on-chip voltage regulators, a plurality of voltage rails corresponding to different voltage values, a power sequencing circuit to provide self-contained power delivery, and one or more modular stacking connectors to couple the plurality of voltage rails to another device.

Example 30 includes the subject matter of Example 29. The IoT apparatus is an IoT module.

Example 31 includes the subject matter of any of Examples 29-30. The IoT apparatus includes one or more of an IoT compute module, an IoT sensor module, and/or an IoT connectivity module.

Example 32 includes the subject matter of any of Examples 29-31. The one or more modular stacking connectors is to couple the plurality of voltage rails to a board and/or to an IoT module.

Example 33 includes the subject matter of any of Examples 29-32. The passive components include switching inductors and capacitors.

Example 34 includes the subject matter of any of Examples 29-33. A multiple-source power delivery path and control system includes power sequencing.

Example 35 includes the subject matter of any of Examples 29-34. The IoT apparatus is an IoT edge device.

Example 36 includes the subject matter of any of Examples 29-35. A plurality of voltages are available to a plurality of IoT modules via the stacking connectors.

Example 37 includes the subject matter of any of Examples 29-36. The IoT apparatus is to tap to common rail pins of the stacking connectors and to provide voltage depending on on-chip voltage integrators.

Example 38 includes the subject matter of any of Examples 29-37. Common rail pins of the stacking connectors can be used to receive voltages.

Example 39 includes the subject matter of any of Examples 29-38. The power sequencing circuit is to use state machine programmable devices to control startup times of multiple power supplies.

Example 40 In some examples, an Internet of Things (IoT) apparatus, includes a unique private key to identify that the IoT apparatus is genuine and to secure identification and trust. The IoT apparatus also includes a mode to start in a non-authenticated state and to wirelessly beacon presence of the IoT apparatus, an authentication mode to join an IoT network, and a transmitter to transmit data to the IoT network after authentication.

Example 41 includes the subject matter of Example 40. A time-division multiplexer is to manage wireless channels, maximize throughput, and provide scalability.

Example 42 includes the subject matter of any of Examples 40-41. A receiver is to receive data from the IoT network.

Example 43 includes the subject matter of any of Examples 40-42. An encrypter is to encrypt data transmitted to the IoT network.

Example 44 includes the subject matter of any of Examples 40-43. A detector is to detect fault states.

Example 45 In some examples, an Internet of Things (IoT) apparatus includes one or more stacking connector to couple the IoT apparatus to one or more board and/or one or more IoT module, a receiver to receive a current configuration, and an on-chip flash to be updated, the on-chip flash to receive a flash update via the receiver.

Example 46 includes the subject matter of Example 45. The on-chip flash is to be updated based on hardware and firmware matches.

Example 47 includes the subject matter of any of Examples 45-46. The on-chip flash is to be updated based on boards and/or IoT modules coupled to the IoT apparatus.

Example 48 includes the subject matter of any of Examples 45-47. The receiver is to couple the IoT apparatus to an IoT system using a wireless personal area network.

Example 49 includes the subject matter of any of Examples 45-48. The on-chip flash is to receive the flash update via bit banging on programming pins of the IoT apparatus.

Example 50 includes the subject matter of any of Examples 45-49. If the IoT apparatus is directly connected to a wireless manager, the on-chip flash is to receive the flash update before nodes that are not directly connected to the wireless manager receive a flash update.

Example 51 includes the subject matter of any of Examples 45-50. The IoT apparatus is to update flash of IoT devices that are adjacent to the IoT apparatus.

Example 52 includes the subject matter of any of Examples 46-51. The on-chip flash is to receive the flash update from a wireless manager.

Example 53 includes the subject matter of any of Examples 46-52. The on-chip flash is to receive the flash update from an IoT device that is adjacent to the IoT apparatus.

Example 54 In some examples, an Internet of Things (IoT) apparatus includes a receiver to receive an indication as to whether the IoT apparatus is a master IoT node. If the IoT apparatus is a master IoT node, the receiver is to receive data from other IoT nodes that are not master IoT nodes. A transmitter is to transmit data to a master IoT node if the IoT apparatus is not a master IoT node.

Example 55 includes the subject matter of Example 54. A processor is to determine if the IoT apparatus found a cluster of IoT nodes, and if the IoT apparatus found a cluster of IoT nodes, join the cluster.

Example 56 includes the subject matter of any of Examples 54-55. A processor is to determine if the IoT apparatus found a cluster of IoT nodes. If the IoT apparatus found a cluster of IoT nodes, the processor is to have the IoT apparatus join the cluster. If the IoT apparatus did not find a cluster of IoT nodes, the processor is to determine if the IoT apparatus found an IoT node that is not in a cluster of IoT nodes. If the IoT apparatus did find an IoT node that is not in a cluster of IoT nodes, the processor is to create a new cluster of IoT nodes with the found IoT node.

Example 57 includes the subject matter of any of Examples 54-56. A processor is to determine if the IoT apparatus is part of an IoT cluster, determine if the IoT apparatus found an IoT node that is in a cluster of IoT nodes, and merge the IoT cluster of the IoT apparatus and the cluster of IoT nodes of the found IoT node.

Example 58 includes the subject matter of any of Examples 54-57. A processor is to determine if the IoT apparatus found an IoT gateway, and save the found IoT gateway as a possible IoT gateway to which to send data.

Example 59 includes the subject matter of any of Examples 54-58. A processor is to apply machine learning on received data and determine if an outlier exists. If an outlier exists, the processor is to request new data. If an outlier does not exist, the processor is to prepare data transfer.

Example 60 includes the subject matter of any of Examples 54-59. A processor is to apply machine learning on received data, and determine if an outlier exists. If an outlier exists, the processor is to request new data. The processor is to determine if an outlier has existed more than a threshold amount. If an outlier has existed more than a threshold amount, the processor is to flag the outlier as failed. If an outlier does not exist, the processor is to prepare data transfer.

Example 61 includes the subject matter of any of Examples 1-60. A modular Internet of Things (IoT) apparatus includes a plurality of boards and connectors to couple IoT modules to one or more of the plurality of boards and to couple the plurality of boards to each other, the connectors comprising stacking connectors on both sides of at least some of the boards and at least some of the IoT modules to be coupled to the boards, the stacking connectors allowing the IoT modules and the boards to be coupled together in a manner that boards and modules cannot be inserted incorrectly.

Example 62 includes the subject matter of any of Examples 1-61. The stacking connectors provide a common pinout for the boards and the IoT modules.

Example 63 includes the subject matter of any of Examples 1-62. The stacking connectors provide a polarized stacking interconnect.

Example 64 includes the subject matter of any of Examples 1-63. The stacking connectors include a full pass-through design.

Example 65 includes the subject matter of any of Examples 1-64. The stacking connectors include variable connector height to accommodate local circuitry on a board or IoT module.

Example 66 includes the subject matter of any of Examples 1-65. Each board may be stacked in any order without physical collision of components.

Example 67 includes the subject matter of any of Examples 1-66. Pin outs of the stacking connectors are agnostic to a function of each board.

Example 68 includes the subject matter of any of Examples 1-67. The IoT modules include one or more IoT compute module, one or more IoT connectivity module, one or more IoT sensor module, and/or one or more IoT power module.

Example 69 includes the subject matter of any of Examples 1-68. The pin outs of the stacking connectors are agnostic to a function of each board to allow stacking of varying IoT modules, base systems, and/or shields without regard to function or order.

Example 70 includes the subject matter of any of Examples 1-69. The stacking connectors allow vertical stacking.

Example 71 includes the subject matter of any of Examples 1-70. The stacking connectors allow horizontal stacking.

Example 72 includes the subject matter of any of Examples 1-71. The stacking connectors allow module locations along edges of at least some of the boards.

Example 73 includes the subject matter of any of Examples 1-72. The stacking connectors allow connectivity module locations along edges of at least some of the boards.

Example 74 includes the subject matter of any of Examples 1-73. Keepouts are along edges of at least some of the boards.

Example 75 includes the subject matter of any of Examples 1-74. Keepouts on the IoT modules in a common location provide a common keepout zone on each of the IoT modules for IoT radio module antennas.

Example 76 includes the subject matter of any of Examples 1-75. An Internet of Things (IoT) apparatus includes a data manager to route data to independently developed components in an IoT system, the data manager to allow the components to implement datatype agnostic information exchange with each other, the data manager to assign a unique identifier to each component to enable the component to send and/or receive information via the data manager.

Example 77 includes the subject matter of any of Examples 1-76. The data manager can run in a target controller application space.

Example 78 includes the subject matter of any of Examples 1-77. The data manager is agnostic to contents of the components data inputs.

Example 79 includes the subject matter of any of Examples 1-78. The data manager is to loosely couple the components and dynamically bind components to the IoT system without comprehending their internal structure.

Example 80 includes the subject matter of any of Examples 1-79. The data manager is to utilize characteristics of data payload traffic to determine its relationship with components in an embedded system.

Example 81 includes the subject matter of any of Examples 1-80. The data manager includes a publisher-subscriber to route data between the components. One or more of the components can publish and/or subscribe to data in the IoT system.

Example 82 includes the subject matter of any of Examples 1-81. The data manager is compatible with pre-emptive and non-preemptive task schedulers.

Example 83 includes the subject matter of any of Examples 1-82. The components are independently developed deep-embedded components. The data manager is to interconnect the components without having an intricate knowledge of an inner working of the components.

Example 84 includes the subject matter of any of Examples 1-83. The data manager is to allow the components to exchange information with each other without constructs of the data originating component being embedded into a data destination component.

Example 85 includes the subject matter of any of Examples 1-84. The data manager includes a client registration manager to validate each component using a component plug-in module.

Example 86 includes the subject matter of any of Examples 1-85. The data manager includes a configuration manager to allow one or more data manager clients to configure a behavior of the data manager or another data manager client.

Example 87 includes the subject matter of any of Examples 1-86. The data manager includes a data/event subscriber to allow one or more data manager clients to configure a behavior of the data manager or a data/event publisher.

Example 88 includes the subject matter of any of Examples 1-87. The data manager includes a publisher-subscriber to route data between components who publish data and components who subscribe to data.

Example 89 includes the subject matter of any of Examples 1-88. An Internet of Things (IoT) apparatus includes a plurality of integrated power supplies including passive components for on-chip voltage regulators, a plurality of voltage rails corresponding to different voltage values, a power sequencing circuit to provide self-contained power delivery, and one or more modular stacking connectors to couple the plurality of voltage rails to another device.

Example 90 includes the subject matter of any of Examples 1-89. The IoT apparatus is an IoT module.

Example 91 includes the subject matter of any of Examples 1-90. The IoT apparatus includes one or more of an IoT compute module, an IoT sensor module, and/or an IoT connectivity module.

Example 92 includes the subject matter of any of Examples 1-91. The one or more modular stacking connectors is to couple the plurality of voltage rails to a board and/or to an IoT module.

Example 93 includes the subject matter of any of Examples 1-92. The passive components include switching inductors and capacitors.

Example 94 includes the subject matter of any of Examples 1-93. A multiple-source power delivery path and control system includes power sequencing.

Example 95 includes the subject matter of any of Examples 1-94. The IoT apparatus is an IoT edge device.

Example 96 includes the subject matter of any of Examples 1-95. A plurality of voltages are available to a plurality of IoT modules via the stacking connectors.

Example 97 includes the subject matter of any of Examples 1-96. The IoT apparatus is to tap to common rail pins of the stacking connectors and to provide voltage depending on on-chip voltage integrators.

Example 98 includes the subject matter of any of Examples 1-97. Common rail pins of the stacking connectors can be used to receive voltages.

Example 99 includes the subject matter of any of Examples 1-98. The power sequencing circuit is to use state machine programmable devices to control startup times of multiple power supplies.

Example 100 includes the subject matter of any of Examples 1-99. An Internet of Things (IoT) apparatus includes a unique private key to identify that the IoT apparatus is genuine and to secure identification and trust. The IoT apparatus also includes a mode to start in a non-authenticated state and to wirelessly beacon presence of the IoT apparatus, an authentication mode to join an IoT network, and a transmitter to transmit data to the IoT network after authentication.

Example 101 includes the subject matter of any of Examples 1-100. A time-division multiplexer is to manage wireless channels, maximize throughput, and provide scalability.

Example 102 includes the subject matter of any of Examples 1-101. A receiver is to receive data from the IoT network.

Example 103 includes the subject matter of any of Examples 1-102. An encrypter is to encrypt data transmitted to the IoT network.

Example 104 includes the subject matter of any of Examples 1-103. A detector is to detect fault states.

Example 105 includes the subject matter of any of Examples 1-104. An Internet of Things (IoT) apparatus includes one or more stacking connector to couple the IoT apparatus to one or more board and/or one or more IoT module, a receiver to receive a current configuration, and an on-chip flash to be updated, the on-chip flash to receive a flash update via the receiver.

Example 106 includes the subject matter of any of Examples 1-105. The on-chip flash is to be updated based on hardware and firmware matches.

Example 107 includes the subject matter of any of Examples 1-106. The on-chip flash is to be updated based on boards and/or IoT modules coupled to the IoT apparatus.

Example 108 includes the subject matter of any of Examples 1-107. The receiver is to couple the IoT apparatus to an IoT system using a wireless personal area network.

Example 109 includes the subject matter of any of Examples 1-108. The on-chip flash is to receive the flash update via bit banging on programming pins of the IoT apparatus.

Example 110 includes the subject matter of any of Examples 1-109. If the IoT apparatus is directly connected to a wireless manager, the on-chip flash is to receive the flash update before nodes that are not directly connected to the wireless manager receive a flash update.

Example 111 includes the subject matter of any of Examples 1-110. The IoT apparatus is to update flash of IoT devices that are adjacent to the IoT apparatus.

Example 112 includes the subject matter of any of Examples 1-111. The on-chip flash is to receive the flash update from a wireless manager.

Example 113 includes the subject matter of any of Examples 1-112. The on-chip flash is to receive the flash update from an IoT device that is adjacent to the IoT apparatus.

Example 114 includes the subject matter of any of Examples 1-113. An Internet of Things (IoT) apparatus includes a receiver to receive an indication as to whether the IoT apparatus is a master IoT node. If the IoT apparatus is a master IoT node, the receiver is to receive data from other IoT nodes that are not master IoT nodes. A transmitter is to transmit data to a master IoT node if the IoT apparatus is not a master IoT node.

Example 115 includes the subject matter of any of Examples 1-114. A processor is to determine if the IoT apparatus found a cluster of IoT nodes, and if the IoT apparatus found a cluster of IoT nodes, join the cluster.

Example 116 includes the subject matter of any of Examples 1-115. A processor is to determine if the IoT apparatus found a cluster of IoT nodes. If the IoT apparatus found a cluster of IoT nodes, the processor is to have the IoT apparatus join the cluster. If the IoT apparatus did not find a cluster of IoT nodes, the processor is to determine if the IoT apparatus found an IoT node that is not in a cluster of IoT nodes. If the IoT apparatus did find an IoT node that is not in a cluster of IoT nodes, the processor is to create a new cluster of IoT nodes with the found IoT node.

Example 117 includes the subject matter of any of Examples 1-116. A processor is to determine if the IoT apparatus is part of an IoT cluster, determine if the IoT apparatus found an IoT node that is in a cluster of IoT nodes, and merge the IoT cluster of the IoT apparatus and the cluster of IoT nodes of the found IoT node.

Example 118 includes the subject matter of any of Examples 1-117. A processor is to determine if the IoT apparatus found an IoT gateway, and save the found IoT gateway as a possible IoT gateway to which to send data.

Example 119 includes the subject matter of any of Examples 1-118. A processor is to apply machine learning on received data and determine if an outlier exists. If an outlier exists, the processor is to request new data. If an outlier does not exist, the processor is to prepare data transfer.

Example 120 includes the subject matter of any of Examples 1-119. A processor is to apply machine learning on received data, and determine if an outlier exists. If an outlier exists, the processor is to request new data. The processor is to determine if an outlier has existed more than a threshold amount. If an outlier has existed more than a threshold amount, the processor is to flag the outlier as failed. If an outlier does not exist, the processor is to prepare data transfer.

Example 121 In some examples, a method of assembling a modular Internet of Things (IoT) apparatus includes providing connectors to couple a plurality of boards other boards and to IoT modules. The connectors include stacking connectors on both sides of at least some of the boards and at least some of the IoT modules to be coupled to the boards. The stacking connectors allow the IoT modules and the boards to be coupled together in a manner that boards and modules cannot be inserted incorrectly.

Example 122 includes the subject matter of Example 121. The stacking connectors provide a common pinout for the boards and the IoT modules.

Example 123 includes the subject matter of any of Examples 121-122. The stacking connectors provide a polarized stacking interconnect.

Example 124 includes the subject matter of any of Examples 121-123. The stacking connectors include a full pass-through design.

Example 125 includes the subject matter of any of Examples 121-124. The stacking connectors include variable connector height to accommodate local circuitry on a board or IoT module.

Example 126 includes the subject matter of any of Examples 121-125. Each board may be stacked in any order without physical collision of components.

Example 127 includes the subject matter of any of Examples 121-126. Pin outs of the stacking connectors are agnostic to a function of each board.

Example 128 includes the subject matter of any of Examples 121-127. The IoT modules include one or more IoT compute module, one or more IoT connectivity module, one or more IoT sensor module, and/or one or more IoT power module.

Example 129 includes the subject matter of any of Examples 121-128. The pin outs of the stacking connectors are agnostic to a function of each board to allow stacking of varying IoT modules, base systems, and/or shields without regard to function or order.

Example 130 includes the subject matter of any of Examples 121-129. The stacking connectors allow vertical stacking.

Example 131 includes the subject matter of any of Examples 121-130. The stacking connectors allow horizontal stacking.

Example 132 includes the subject matter of any of Examples 121-131. The stacking connectors allow module locations along edges of at least some of the boards.

Example 133 includes the subject matter of any of Examples 121-132. The stacking connectors allow connectivity module locations along edges of at least some of the boards.

Example 134 includes the subject matter of any of Examples 121-133. Keepouts are along edges of at least some of the boards.

Example 135 includes the subject matter of any of Examples 121-134. Keepouts on the IoT modules in a common location provide a common keepout zone on each of the IoT modules for IoT radio module antennas.

Example 136 In some examples, a method includes routing data to independently developed components in an IoT system, allowing the components to implement datatype agnostic information exchange with each other, and assigning a unique identifier to each component to enable the component to send and/or receive information.

Example 137 includes the subject matter of Example 136. The method is implemented in a target controller application space.

Example 138 includes the subject matter of any of Examples 136-137. The method is agnostic to contents of the components data inputs.

Example 139 includes the subject matter of any of Examples 136-138. The method is to loosely couple the components and dynamically bind components to the IoT system without comprehending their internal structure.

Example 140 includes the subject matter of any of Examples 136-139. The method is to utilize characteristics of data payload traffic to determine its relationship with components in an embedded system.

Example 141 includes the subject matter of any of Examples 136-140. The method routes data between the components using publisher-subscriber techniques. One or more of the components can publish and/or subscribe to data in the IoT system.

Example 142 includes the subject matter of any of Examples 136-141. The method is compatible with preemptive and non-preemptive task schedulers.

Example 143 includes the subject matter of any of Examples 136-142. The components are independently developed deep-embedded components. The method includes interconnecting the components without having an intricate knowledge of an inner working of the components.

Example 144 includes the subject matter of any of Examples 136-143. The method includes allowing the components to exchange information with each other without constructs of the data originating component being embedded into a data destination component.

Example 145 includes the subject matter of any of Examples 136-144. The method includes validating each component using a component plug-in module.

Example 146 includes the subject matter of any of Examples 136-145. The method includes allowing one or more data manager clients to configure a behavior of the data manager or another data manager client.

Example 147 includes the subject matter of any of Examples 136-146. The method includes allowing one or more data manager clients to configure a behavior of the data manager or a data/event publisher.

Example 148 includes the subject matter of any of Examples 136-147. The method includes routing data between components who publish data and components who subscribe to data.

Example 149 In some examples, an Internet of Things (IoT) method includes providing a plurality of integrated power supplies including passive components for on-chip voltage regulators, a plurality of voltage rails corresponding to different voltage values. The method includes power sequencing to provide self-contained power delivery, and using one or more modular stacking connectors to couple the plurality of voltage rails to another device.

Example 150 includes the subject matter of Example 149. The method includes providing an IoT module.

Example 151 includes the subject matter of any of Examples 149-150. The IoT method includes providing one or more of an IoT compute module, an IoT sensor module, and/or an IoT connectivity module.

Example 152 includes the subject matter of any of Examples 149-151. The method includes using the one or more modular stacking connectors to couple the plurality of voltage rails to a board and/or to an IoT module.

Example 153 includes the subject matter of any of Examples 149-152. The passive components include switching inductors and capacitors.

Example 154 includes the subject matter of any of Examples 149-153. The method includes power sequencing using a multiple-source power delivery path and control system.

Example 155 includes the subject matter of any of Examples 149-154. The IoT apparatus is an IoT edge device.

Example 156 includes the subject matter of any of Examples 149-155. The method includes providing and/or receiving a plurality of voltages to/from a plurality of IoT modules via the stacking connectors.

Example 157 includes the subject matter of any of Examples 149-156. The method includes tapping to common rail pins of the stacking connectors and providing voltage depending on on-chip voltage integrators.

Example 158 includes the subject matter of any of Examples 149-157. The method includes using common rail pins of the stacking connectors to receive voltages.

Example 159 includes the subject matter of any of Examples 149-158. The method includes power sequencing using state machine programmable devices to control startup times of multiple power supplies.

Example 160 In some examples, an Internet of Things (IoT) method includes using a unique private key to identify that the IoT apparatus is genuine and to securing identification and trust. The method includes starting in a non-authenticated state and wirelessly beaconing presence of the IoT apparatus, authenticating, joining an IoT network, and transmitting data to the IoT network after authenticating.

Example 161 includes the subject matter of Example 160. The method includes time-division multiplexing to manage wireless channels, maximize throughput, and provide scalability.

Example 162 includes the subject matter of any of Examples 160-161. The method includes receiving data from the IoT network.

Example 163 includes the subject matter of any of Examples 160-162. The method includes encrypting data transmitted to the IoT network.

Example 164 includes the subject matter of any of Examples 160-163. The method includes detecting fault states.

Example 165 In some examples, an Internet of Things (IoT) method includes using one or more stacking connector to couple an IoT apparatus to one or more board and/or one or more IoT module, receiving a current configuration, and updating an on-chip flash by receiving a flash update via the receiver.

Example 166 includes the subject matter of Example 165. The method includes updating the flash based on hardware and firmware matches.

Example 167 includes the subject matter of any of Examples 165-166. The method includes updating the on-chip flash based on boards and/or IoT modules coupled to the IoT apparatus.

Example 168 includes the subject matter of any of Examples 165-167. The method includes coupling the IoT apparatus to an IoT system using a wireless personal area network.

Example 169 includes the subject matter of any of Examples 165-168. The method includes receiving the flash update via bit banging on programming pins of the IoT apparatus.

Example 170 includes the subject matter of any of Examples 165-169. The method includes, if the IoT apparatus is directly connected to a wireless manager, receiving the flash update before nodes that are not directly connected to the wireless manager receive a flash update.

Example 171 includes the subject matter of any of Examples 165-170. The method includes updating the flash of IoT devices that are adjacent to the IoT apparatus.

Example 172 includes the subject matter of any of Examples 166-171. The method includes receiving the flash update from a wireless manager.

Example 173 includes the subject matter of any of Examples 166-172. The method includes receiving the flash update from an IoT device that is adjacent to the IoT apparatus.

Example 174 In some examples, an Internet of Things (IoT) method includes receiving an indication as to whether an IoT apparatus is a master IoT node. If the IoT apparatus is a master IoT node, the method includes receiving data from other IoT nodes that are not master IoT nodes. The method includes transmitting data to a master IoT node if the IoT apparatus is not a master IoT node.

Example 175 includes the subject matter of Example 174. A method includes determining if the IoT apparatus found a cluster of IoT nodes, and if the IoT apparatus found a cluster of IoT nodes, joining the cluster.

Example 176 includes the subject matter of any of Examples 174-175. The method includes determining if the IoT apparatus found a cluster of IoT nodes. The method includes finding a cluster of IoT nodes, and joining the cluster. If the IoT apparatus did not find a cluster of IoT nodes, the method includes determining if the IoT apparatus found an IoT node that is not in a cluster of IoT nodes. The method includes if the IoT apparatus did find an IoT node that is not in a cluster of IoT nodes, creating a new cluster of IoT nodes with the found IoT node.

Example 177 includes the subject matter of any of Examples 174-176. The method includes determining if the IoT apparatus is part of an IoT cluster, determining if the IoT apparatus found an IoT node that is in a cluster of IoT nodes, and merging the IoT cluster of the IoT apparatus and the cluster of IoT nodes of the found IoT node.

Example 178 includes the subject matter of any of Examples 174-177 The method includes determining if the IoT apparatus found an IoT gateway, and saving the found IoT gateway as a possible IoT gateway to which to send data.

Example 179 includes the subject matter of any of Examples 174-178 The method includes applying machine learning on received data and determining if an outlier exists. The method includes if an outlier exists, requesting new data. The method includes if an outlier does not exist, preparing data transfer.

Example 180 includes the subject matter of any of Examples 174-179. The method includes applying machine learning on received data, and determining if an outlier exists. The method includes if an outlier exists, requesting new data. The method includes determining if an outlier has existed more than a threshold amount. The method includes if an outlier has existed more than a threshold amount, flagging the outlier as failed. The method includes if an outlier does not exist, preparing data transfer.

Example 181 includes the subject matter of any of Examples 121-180. A method of assembling a modular Internet of Things (IoT) apparatus includes providing connectors to couple a plurality of boards other boards and to IoT modules. The connectors include stacking connectors on both sides of at least some of the boards and at least some of the IoT modules to be coupled to the boards. The stacking connectors allow the IoT modules and the boards to be coupled together in a manner that boards and modules cannot be inserted incorrectly.

Example 182 includes the subject matter of any of Examples 121-181. The stacking connectors provide a common pinout for the boards and the IoT modules.

Example 183 includes the subject matter of any of Examples 121-122. The stacking connectors provide a polarized stacking interconnect.

Example 184 includes the subject matter of any of Examples 121-123. The stacking connectors include a full pass-through design.

Example 185 includes the subject matter of any of Examples 121-124. The stacking connectors include variable connector height to accommodate local circuitry on a board or IoT module.

Example 186 includes the subject matter of any of Examples 121-125. Each board may be stacked in any order without physical collision of components.

Example 187 includes the subject matter of any of Examples 121-126. Pin outs of the stacking connectors are agnostic to a function of each board.

Example 188 includes the subject matter of any of Examples 121-127. The IoT modules include one or more IoT compute module, one or more IoT connectivity module, one or more IoT sensor module, and/or one or more IoT power module.

Example 189 includes the subject matter of any of Examples 121-128. The pin outs of the stacking connectors are agnostic to a function of each board to allow stacking of varying IoT modules, base systems, and/or shields without regard to function or order.

Example 190 includes the subject matter of any of Examples 121-129. The stacking connectors allow vertical stacking.

Example 191 includes the subject matter of any of Examples 121-130. The stacking connectors allow horizontal stacking.

Example 192 includes the subject matter of any of Examples 121-131. The stacking connectors allow module locations along edges of at least some of the boards.

Example 193 includes the subject matter of any of Examples 121-132. The stacking connectors allow connectivity module locations along edges of at least some of the boards.

Example 194 includes the subject matter of any of Examples 121-133. Keepouts are along edges of at least some of the boards.

Example 195 includes the subject matter of any of Examples 121-134. Keepouts on the IoT modules in a common location provide a common keepout zone on each of the IoT modules for IoT radio module antennas.

Example 196 In some examples, a method includes routing data to independently developed components in an IoT system, allowing the components to implement datatype agnostic information exchange with each other, and assigning a unique identifier to each component to enable the component to send and/or receive information.

Example 197 includes the subject matter of Example 136. The method is implemented in a target controller application space.

Example 198 includes the subject matter of any of Examples 136-137. The method is agnostic to contents of the components data inputs.

Example 199 includes the subject matter of any of Examples 136-138. The method is to loosely couple the components and dynamically bind components to the IoT system without comprehending their internal structure.

Example 200 includes the subject matter of any of Examples 136-139. The method is to utilize characteristics of data payload traffic to determine its relationship with components in an embedded system.

Example 201 includes the subject matter of any of Examples 136-140. The method routes data between the components using publisher-subscriber techniques. One or more of the components can publish and/or subscribe to data in the IoT system.

Example 202 includes the subject matter of any of Examples 136-141. The method is compatible with preemptive and non-preemptive task schedulers.

Example 203 includes the subject matter of any of Examples 136-142. The components are independently developed deep-embedded components. The method includes interconnecting the components without having an intricate knowledge of an inner working of the components.

Example 204 includes the subject matter of any of Examples 136-143. The method includes allowing the components to exchange information with each other without constructs of the data originating component being embedded into a data destination component.

Example 205 includes the subject matter of any of Examples 136-144. The method includes validating each component using a component plug-in module.

Example 206 includes the subject matter of any of Examples 136-145. The method includes allowing one or more data manager clients to configure a behavior of the data manager or another data manager client.

Example 207 includes the subject matter of any of Examples 136-146. The method includes allowing one or more data manager clients to configure a behavior of the data manager or a data/event publisher.

Example 208 includes the subject matter of any of Examples 136-147. The method includes routing data between components who publish data and components who subscribe to data.

Example 209 In some examples, an Internet of Things (IoT) method includes providing a plurality of integrated power supplies including passive components for on-chip voltage regulators, a plurality of voltage rails corresponding to different voltage values. The method includes power sequencing to provide self-contained power delivery, and using one or more modular stacking connectors to couple the plurality of voltage rails to another device.

Example 210 includes the subject matter of Example 149. The method includes providing an IoT module.

Example 211 includes the subject matter of any of Examples 149-150. The IoT method includes providing one or more of an IoT compute module, an IoT sensor module, and/or an IoT connectivity module.

Example 212 includes the subject matter of any of Examples 149-151. The method includes using the one or more modular stacking connectors to couple the plurality of voltage rails to a board and/or to an IoT module.

Example 213 includes the subject matter of any of Examples 149-152. The passive components include switching inductors and capacitors.

Example 214 includes the subject matter of any of Examples 149-153. The method includes power sequencing using a multiple-source power delivery path and control system.

Example 215 includes the subject matter of any of Examples 149-154. The IoT apparatus is an IoT edge device.

Example 216 includes the subject matter of any of Examples 149-155. The method includes providing and/or receiving a plurality of voltages to/from a plurality of IoT modules via the stacking connectors.

Example 217 includes the subject matter of any of Examples 149-156. The method includes tapping to common rail pins of the stacking connectors and providing voltage depending on on-chip voltage integrators.

Example 218 includes the subject matter of any of Examples 149-157. The method includes using common rail pins of the stacking connectors to receive voltages.

Example 219 includes the subject matter of any of Examples 149-158. The method includes power sequencing using state machine programmable devices to control startup times of multiple power supplies.

Example 220 In some examples, an Internet of Things (IoT) method includes using a unique private key to identify that the IoT apparatus is genuine and to securing identification and trust. The method includes starting in a non-authenticated state and wirelessly beaconing presence of the IoT apparatus, authenticating, joining an IoT network, and transmitting data to the IoT network after authenticating.

Example 221 includes the subject matter of Example 160. The method includes time-division multiplexing to manage wireless channels, maximize throughput, and provide scalability.

Example 222 includes the subject matter of any of Examples 160-161. The method includes receiving data from the IoT network.

Example 223 includes the subject matter of any of Examples 160-162. The method includes encrypting data transmitted to the IoT network.

Example 224 includes the subject matter of any of Examples 160-163. The method includes detecting fault states.

Example 225 In some examples, an Internet of Things (IoT) method includes using one or more stacking connector to couple an IoT apparatus to one or more board and/or one or more IoT module, receiving a current configuration, and updating an on-chip flash by receiving a flash update via the receiver.

Example 226 includes the subject matter of Example 165. The method includes updating the flash based on hardware and firmware matches.

Example 227 includes the subject matter of any of Examples 165-166. The method includes updating the on-chip flash based on boards and/or IoT modules coupled to the IoT apparatus.

Example 228 includes the subject matter of any of Examples 165-167. The method includes coupling the IoT apparatus to an IoT system using a wireless personal area network.

Example 229 includes the subject matter of any of Examples 165-168. The method includes receiving the flash update via bit banging on programming pins of the IoT apparatus.

Example 230 includes the subject matter of any of Examples 165-169. The method includes, if the IoT apparatus is directly connected to a wireless manager, receiving the flash update before nodes that are not directly connected to the wireless manager receive a flash update.

Example 231 includes the subject matter of any of Examples 165-170. The method includes updating the flash of IoT devices that are adjacent to the IoT apparatus.

Example 232 includes the subject matter of any of Examples 166-171. The method includes receiving the flash update from a wireless manager.

Example 233 includes the subject matter of any of Examples 166-172. The method includes receiving the flash update from an IoT device that is adjacent to the IoT apparatus.

Example 234 In some examples, an Internet of Things (IoT) method includes receiving an indication as to whether an IoT apparatus is a master IoT node. If the IoT apparatus is a master IoT node, the method includes receiving data from other IoT nodes that are not master IoT nodes. The method includes transmitting data to a master IoT node if the IoT apparatus is not a master IoT node.

Example 235 includes the subject matter of Example 174. A method includes determining if the IoT apparatus found a cluster of IoT nodes, and if the IoT apparatus found a cluster of IoT nodes, joining the cluster.

Example 236 includes the subject matter of any of Examples 174-175. The method includes determining if the IoT apparatus found a cluster of IoT nodes. The method includes finding a cluster of IoT nodes, and joining the cluster. If the IoT apparatus did not find a cluster of IoT nodes, the method includes determining if the IoT apparatus found an IoT node that is not in a cluster of IoT nodes. The method includes if the IoT apparatus did find an IoT node that is not in a cluster of IoT nodes, creating a new cluster of IoT nodes with the found IoT node.

Example 237 includes the subject matter of any of Examples 174-176. The method includes determining if the IoT apparatus is part of an IoT cluster, determining if the IoT apparatus found an IoT node that is in a cluster of IoT nodes, and merging the IoT cluster of the IoT apparatus and the cluster of IoT nodes of the found IoT node.

Example 238 includes the subject matter of any of Examples 174-177 The method includes determining if the IoT apparatus found an IoT gateway, and saving the found IoT gateway as a possible IoT gateway to which to send data.

Example 239 includes the subject matter of any of Examples 174-178 The method includes applying machine learning on received data and determining if an outlier exists. The method includes if an outlier exists, requesting new data. The method includes if an outlier does not exist, preparing data transfer.

Example 240 includes the subject matter of any of Examples 174-179. The method includes applying machine learning on received data, and determining if an outlier exists. The method includes if an outlier exists, requesting new data. The method includes determining if an outlier has existed more than a threshold amount. The method includes if an outlier has existed more than a threshold amount, flagging the outlier as failed. The method includes if an outlier does not exist, preparing data transfer.

Example 241 includes an apparatus including means to perform a method as in any other example.

Example 242 includes machine-readable storage including machine-readable instructions, when executed, to implement a method or realize an apparatus as in any other example.

Example 243 includes one or more computer-readable medium including instructions, when executed, to implement a method or realize an apparatus as in any other example.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the techniques. The various appearances of "an embodiment", "one embodiment", or "some embodiments" are not necessarily all referring to the same embodiments. Elements or aspects from an embodiment can be combined with elements or aspects of another embodiment.

Not all components, features, structures, characteristics, etc. described and illustrated herein need to be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

The techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the techniques.

What is claimed is:

1. A modular Internet of Things (IoT) apparatus, comprising:
    a plurality of boards;
    connectors to couple IoT modules to one or more of the plurality of boards and to couple the plurality of boards to each other, the connectors comprising stacking connectors on both sides of at least some of the boards and at least some of the IoT modules to be coupled to the boards, wherein the stacking connectors allow the IoT modules and the boards to be coupled together in a manner to enable the boards and modules to be be inserted in a single configuration;
    a plurality of integrated power supplies including passive components for on-chip voltage regulators;
    a plurality of voltage rails corresponding to different voltage values;
    a power sequencing circuit to provide self-contained power delivery; and
    one or more modular stacking connectors to couple the plurality of voltage rails to another device.

2. The modular IoT apparatus of claim 1, wherein the stacking connectors provide a common pinout for the boards and the IoT modules.

3. The modular IoT apparatus of claim 1, wherein the stacking connectors provide a polarized stacking interconnect.

4. The modular IoT apparatus of claim 1, wherein the stacking connectors include a full pass-through design.

5. The modular IoT apparatus of claim 1, wherein the stacking connectors provide a connector height to accommodate local circuitry on a board or IoT module.

6. The modular IoT apparatus of claim 1, wherein each board ii configured to be stacked in any order without physical collision of components.

7. The modular IoT apparatus of claim 1, wherein pin outs of the stacking connectors are agnostic to a function of each board.

8. The modular IoT apparatus of claim 1, wherein the IoT modules include one or more IoT compute module, one or more IoT connectivity module, one or more IoT sensor module, and/or one or more IoT power module.

9. The modular IoT apparatus of claim 1, wherein pin outs of the stacking connectors are agnostic to a function of each board to allow stacking of varying IoT modules, base systems, and/or shields without regard to function or order.

10. The modular IoT apparatus of claim 1, wherein the stacking connectors allow vertical stacking or horizontal stacking.

11. The modular IoT apparatus of claim 1, wherein the stacking connectors allow module locations along edges of at least some of the boards.

12. The modular IoT apparatus of claim 1, wherein the stacking connectors allow connectivity module locations along edges of at least some of the boards.

13. The modular IoT apparatus of claim 1, further comprising keepouts along edges of at least some of the boards.

14. The modular IoT apparatus of claim 1, further comprising keepouts on the IoT modules in a common location to provide a common keepout zone on each of the IoT modules for IoT radio module antennas.

15. The modular IoT apparatus of claim 1, further comprising:
    a unique private key to identify that the IoT apparatus is genuine, and to secure identification and trust;
    a mode to start in a non-authenticated state and to wirelessly beacon presence of the IoT apparatus;
    an authentication mode to join an IoT network; and
    a transmitter to transmit data to the IoT network after authentication.

16. The modular IoT apparatus of claim 1, further comprising:
    one or more stacking connector to couple the IoT apparatus to one or more board and/or one or more IoT module;
    a receiver to receive a current configuration; and
    an on-chip flash to be updated, the on-chip flash to receive a flash update via the receiver.

17. The modular IoT apparatus of claim 1, further comprising:
    a receiver to receive an indication as to whether the IoT apparatus is a master IoT node;

if the IoT apparatus is a master IoT node, the receiver to receive data from other IoT nodes that are not master IoT nodes; and a transmitter to transmit data to a master IoT node if the IoT apparatus is not a master IoT node.

18. The modular IoT apparatus of claim 1, further comprising:

a data manager to route data to independently developed components in an IoT system, the data manager to allow the components to implement datatype agnostic information exchange with each other, the data manager to assign a unique identifier to each component to enable the component to send and/or receive information via the data manager.

19. A method of assembling a modular Internet of Things (IoT) apparatus comprising:

providing connectors to couple a plurality of boards to other boards and to IoT modules, wherein the connectors include stacking connectors on both sides of at least some of the boards and at least some of the IoT modules to be coupled to the boards, and wherein the stacking connectors allow the IoT modules and the boards to be coupled together in a manner to enable the boards and the modules to be inserted in a single configuration;

providing a plurality of integrated power supplies including passive components for on-chip voltage regulators;

providing a plurality of voltage rails corresponding to different voltage values;

providing a power sequencing circuit to provide self-contained power delivery; and providing one or more modular stacking connectors to couple the plurality of voltage rails to another device.

20. The method of claim 19, wherein the stacking connectors provide a common pinout for the boards and the IoT modules.

21. The method of claim 19, wherein the stacking connectors provide a polarized stacking interconnect.

22. The method of claim 19, wherein the stacking connectors include a full pass-through design.

23. The method of claim 19, wherein the stacking connectors provide a connector height to accommodate local circuitry on a board or IoT module.

24. An apparatus, comprising:

means for coupling a plurality of boards to other boards and to IoT modules, wherein the means includes stacking connectors on both sides of at least some of the boards and at least some of the IoT modules to be coupled to the boards, and wherein the stacking connectors allow the IoT modules and the boards to be coupled together in a manner to enable the boards and the modules to be inserted in a single configuration;

a plurality of integrated power supplies including passive components for on-chip voltage regulators;

means for coupling a plurality of voltage rails corresponding to different voltage values to the apparatus;

means for connecting a power sequencing circuit to provide self-contained power delivery to the apparatus;

means for coupling the plurality of voltage rails to another device, wherein the means includes one or more modular stacking connectors; and means for assembling the plurality of boards to the other boards and to the IoT modules.

* * * * *

UNITED STATES PATENT AND TRADEMARK OFFICE
CERTIFICATE OF CORRECTION

PATENT NO. : 11,653,467 B2
APPLICATION NO. : 17/251697
DATED : May 16, 2023
INVENTOR(S) : Lucero et al.

Page 1 of 1

It is certified that error appears in the above-identified patent and that said Letters Patent is hereby corrected as shown below:

In the Claims

In Column 69, Line 62, in Claim 1, delete "be be" and insert --be-- therefor

In Column 70, Line 18, in Claim 6, delete "ii" and insert --is-- therefor

Signed and Sealed this
First Day of October, 2024

Katherine Kelly Vidal
*Director of the United States Patent and Trademark Office*